(12) United States Patent
Mayer et al.

(10) Patent No.: US 8,147,660 B1
(45) Date of Patent: Apr. 3, 2012

(54) SEMICONDUCTIVE COUNTER ELECTRODE FOR ELECTROLYTIC CURRENT DISTRIBUTION CONTROL

(75) Inventors: Steven T. Mayer, Lake Oswego, OR (US); Jonathan D. Reid, Sherwood, OR (US)

(73) Assignee: Novellus Systems, Inc., San Jose, CA (US)

( * ) Notice: Subject to any disclaimer, the term of this patent is extended or adjusted under 35 U.S.C. 154(b) by 1386 days.

(21) Appl. No.: 11/731,706

(22) Filed: Mar. 30, 2007

Related U.S. Application Data

(63) Continuation-in-part of application No. 10/365,577, filed on Feb. 11, 2003, now Pat. No. 7,211,175, and a continuation-in-part of application No. 11/040,359, filed on Jan. 20, 2005, now Pat. No. 7,622,024, and a continuation-in-part of application No. 10/318,497, filed on Dec. 11, 2002, now Pat. No. 6,890,416, and a continuation-in-part of application No. 10/916,374, filed on Aug. 10, 2004, now Pat. No. 6,919,010, application No. 11/731,706, and a continuation-in-part of application No. 10/609,518, filed on Jun. 30, 2003, now abandoned, and a continuation-in-part of application No. 11/200,338, filed on Aug. 9, 2005, now Pat. No. 7,690,324, which is a continuation-in-part of application No. 10/609,518, application No. 11/731,706, and a continuation-in-part of application No. 11/213,190, filed on Aug. 26, 2005, now Pat. No. 7,686,935, which is a continuation-in-part of application No. 10/274,755, filed on Oct. 21, 2002, now Pat. No. 7,070,686, which is a continuation-in-part of application No. 10/116,077, filed on Apr. 4, 2002, now Pat. No. 6,755,954, application No. 11/731,706, and a continuation-in-part of application No. 10/739,822, filed on Dec. 17, 2003, now Pat. No. 7,449,098, and a continuation-in-part of application No. 11/506,054, filed on Aug. 16, 2006, now Pat. No. 7,854,828, and a continuation-in-part of application No. 11/228,712, filed on Sep. 16, 2005.

(60) Provisional application No. 60/580,433, filed on Jun. 16, 2004, provisional application No. 60/392,203, filed on Jun. 28, 2002.

(51) Int. Cl.
*C25D 17/10* (2006.01)
*C25B 9/00* (2006.01)
*C25D 5/00* (2006.01)

(52) U.S. Cl. ............. 204/242; 204/DIG. 7; 204/230.2; 205/96; 205/97; 205/101

(58) Field of Classification Search .............. 205/96, 205/97, 101; 204/242
See application file for complete search history.

(56) References Cited

U.S. PATENT DOCUMENTS 4,216,071 A * 8/1980 Gobrecht ................. 204/242
(Continued)

OTHER PUBLICATIONS

Yamashita et al., "Passivating Behavior of Copper Anodes and its Illumination Effects in Alkaline Solutions" Surface Science 96(1-3), pp. 443-460 (Jun. 1980).*

*Primary Examiner* — Harry D Wilkins, III
*Assistant Examiner* — Bryan D. Ripa
(74) *Attorney, Agent, or Firm* — Weaver Austin Villeneuve & Sampson LLP

(57) ABSTRACT

A semiconductive counter electrode covers a highly electronically conductive electric current buss. The semiconductive counter electrode is impervious to ion flow. A substrate holder is operable to hold a substrate and to form a thin fluid gap between the semiconductive counter electrode and a substrate surface. A thin liquid electrolyte layer is located in the thin fluid gap. A power supply connected to the electric current buss and a peripheral edge of a conductive substrate surface is able to generate a potential difference between the electric current buss and the semiconductive counter electrode, on one side of the electrolyte layer, and the substrate on the other side. The semiconductive counter electrode provides a substantial resistance in the various current flow paths between the electric current buss and the semiconductive counter electrode, on one side, and the conductive substrate surface, on the other, thereby enhancing control of current distribution.

24 Claims, 18 Drawing Sheets

U.S. PATENT DOCUMENTS

| | | | |
|---|---|---|---|
| 6,027,631 A | 2/2000 | Broadbent et al. | |
| 6,074,544 A | 6/2000 | Reid et al. | |
| 6,126,798 A | 10/2000 | Reid et al. | |
| 6,132,587 A | 10/2000 | Jorne | |
| 6,139,712 A | 10/2000 | Patton et al. | |
| 6,156,167 A | 12/2000 | Patton et al. | |
| 6,159,354 A | 12/2000 | Contolini et al. | |
| 6,162,344 A | 12/2000 | Reid et al. | |
| 6,179,983 B1 * | 1/2001 | Reid et al. | 205/96 |
| 6,193,859 B1 | 2/2001 | Contolini et al. | |
| 6,251,255 B1 * | 6/2001 | Copping et al. | 205/300 |
| 6,402,923 B1 | 6/2002 | Mayer et al. | |
| 6,551,483 B1 * | 4/2003 | Mayer et al. | 205/81 |
| 6,569,299 B1 | 5/2003 | Reid et al. | |
| 6,755,946 B1 | 6/2004 | Patton et al. | |
| 6,755,954 B2 | 6/2004 | Mayer et al. | |
| 6,773,571 B1 | 8/2004 | Mayer et al. | |
| 6,821,407 B1 | 11/2004 | Mayer et al. | |
| 6,890,416 B1 | 5/2005 | Mayer | |
| 6,919,010 B1 * | 7/2005 | Mayer | 205/96 |
| 6,964,792 B1 | 11/2005 | Mayer | |
| 7,070,686 B2 | 7/2006 | Contolini et al. | |
| 7,169,705 B2 | 1/2007 | Ide | |
| 7,211,175 B1 | 5/2007 | Mayer et al. | |
| 7,449,098 B1 | 11/2008 | Mayer et al. | |
| 7,622,024 B1 | 11/2009 | Mayer et al. | |
| 7,686,935 B2 | 3/2010 | Mayer et al. | |
| 7,690,324 B1 | 4/2010 | Feng et al. | |
| 7,854,828 B2 | 12/2010 | Reid et al. | |
| 8,048,280 B2 | 11/2011 | Mayer et al. | |
| 2002/0020627 A1 * | 2/2002 | Kunisawa et al. | 205/96 |
| 2002/0195352 A1 | 12/2002 | Mayer et al. | |
| 2003/0079995 A1 | 5/2003 | Contolini et al. | |
| 2004/0065540 A1 | 4/2004 | Mayer et al. | |
| 2006/0011483 A1 | 1/2006 | Mayer et al. | |
| 2007/0080066 A1 * | 4/2007 | Tachibana | 205/157 |
| 2007/0238265 A1 * | 10/2007 | Kurashina et al. | 438/470 |
| 2009/0277802 A1 | 11/2009 | Mayer et al. | |
| 2010/0032303 A1 | 2/2010 | Reid et al. | |

* cited by examiner

US 8,147,660 B1

SEMICONDUCTIVE COUNTER ELECTRODE FOR ELECTROLYTIC CURRENT DISTRIBUTION CONTROL

RELATED APPLICATIONS

This application is a continuation in part application, claiming priority under 35 USC 120, of U.S. patent application Ser. No. 10/365,577, filed Feb. 11, 2003, by Steven T. Mayer et al., titled "Method And Apparatus For Potential Controlled Electroplating Of Fine Patterns On Semiconductor Wafers".

This application is also a continuation in part of U.S. patent application Ser. No. 11/040,359, filed Jan. 20, 2005, by Steven T. Mayer and Jonathan D. Reid, titled "High Resistance Ionic Current Source," which claims the benefit under 35 USC 119(e) of U.S. Provisional Application No. 60/580,433, filed Jun. 16, 2004; and which is also a continuation in part of U.S. patent application Ser. No. 10/318,497, filed Dec. 11, 2002, by Steven T. Mayer et al., titled "Copper Electroplating Method And Apparatus", now U.S. Pat. No. 6,890,416, and which is also a continuation in part of U.S. application Ser. No. 10/916,374, by Steven T. Mayer, filed Aug. 10, 2004, titled "Uniform Electroplating Of Fine Metal Seeded Wafers Using Rotationally Asymmetric Variable Anode Correction", now U.S. Pat. No. 6,919,010.

This application is also a continuation in part of U.S. application Ser. No. 10/609,518, by Mayer et al., filed Jun. 30, 2003, titled "Liquid Treatment Using Thin Liquid Layer", which claims the benefit of U.S. Provisional Application Ser. No. 60/392,203, filed Jun. 28, 2002.

This application is also a continuation in part of U.S. application Ser. No. 11/200,338, filed Aug. 9, 2005, by Jingbin Feng et al., titled "Small-Volume Electroless Plating Cell", which is a continuation in part of U.S. application Ser. No. 10/609,518, by Mayer et al., filed Jun. 30, 2003, titled "Liquid Treatment Using Thin Liquid Layer", which claims the benefit of U.S. Provisional Application Ser. No. 60/392,203, filed Jun. 28, 2002.

This application is also a continuation in part of U.S. application Ser. No. 11/213,190, filed Aug. 26, 2005, by Mayer et al., titled "Pad-Assisted Electropolishing", which is a continuation in part of U.S. application Ser. No. 10/274,755, filed Oct. 21, 2002, now U.S. Pat. No. 7,070,686, which in turn was a continuation-in-part application of U.S. patent application Ser. No. 10/116,077 filed Apr. 4, 2002, by Mayer et al., titled "Electrochemical Treatment Of Integrated Circuit Substrates Using Concentric Anodes And Variable Field Shaping Elements", now U.S. Pat. No. 6,755,954.

This application is also is a continuation-in-part application of U.S. patent application Ser. No. 10/739,822, filed Dec. 17, 2003, by Mayer et al., having the title "Method for Planar Electroplating".

This application is also a continuation in part of U.S. patent application Ser. No. 11/506,054, titled "Method and Apparatus of Electroplating Including Remotely Positioned Dual Cathode", filed Aug. 16, 2006, by Jon Reid et. al.

This application is also a continuation in part of U.S. patent application Ser. No. 11/228,712, filed Sep. 16, 2005, by Mayer et al.

Each of these patent documents is hereby incorporated by reference for all purposes as if fully contained herein.

FIELD OF THE INVENTION

The invention is related to the field of electrolytic techniques used in the manufacture of integrated circuits and other electrical and electronic devices, particularly to methods and apparatuses for controlling current distribution during electroplating, electroetching or electropolishing thin metallic layers.

BACKGROUND

The transition from aluminum to copper required a change in process "architecture" (to damascene and dual-damascene) as well as a whole new set of process technologies. One process step used in producing copper damascene circuits is the formation of a "seed-" or "strike-" layer, which is then used as a base layer onto which copper is electroplated ("electrofill"). The seed layer carries the electrical plating current from the edge region of the wafer (where electrical contact is made) to the rest of the wafer surface, including trench and via structures located across the wafer surface. The seed film is typically a thin conductive copper layer. The seed film is typically separated from the insulating silicon dioxide or other dielectric by a diffusion barrier layer and/or an adhesion layer (e.g., a barrier/adhesion film of TaN/Ta/Ru below a copper seed). In some cases, the barrier/adhesion layer is composed of two or more films with varying properties to improve plateablity, to improve uniformity of the upper layers, or for other reason. The combination of processes of depositing barrier and seeding layers should yield a seed-layer structure that has good overall adhesion, excellent step coverage (more particularly, conformal and continuous amounts of metal deposited onto the side-walls of an embedded structure), and minimal closure or "necking" of the top of embedded features. Market trends of increasingly smaller features and alternative seeding processes drive the need for a capability to plate with a high degree of uniformity on increasingly thin seed layers. In the future, it is anticipated that the seed film might simply be composed of a relatively easily plateable barrier film, such as platinum, ruthenium, nickel, cobalt, or electroplating might be performed directly onto more classical barrier layer material such as tantalum, tantalum nitride, titanium, titanium nitride, titanium tungsten, or laminates of these. Laminate composites of the metals, such as those just listed, are also under investigation. These materials typically have high specific resistivity (higher than metals typically used to carry electricity, such as copper, silver, aluminum, gold). Also, because they are thin, the mean-free-path of electrons therein is commensurate with the film thickness and the resistivity is greater than that predicted by typical scaling calculations (where resistance increases with length over cross sectional area). As a result, the resistance of a structure can be much greater than predicted by scaling calculations. Thus, thin resistive films pose extreme terminal effect difficulties. For example, when driving even a small 3 amp total current onto a 300 mm wafer uniformly through a 30 ohm per square ruthenium seed layer (a likely value for a 30-50 Å Ru film), the resultant within-seed center to edge voltage drop could be well over 2 volts (V).

To avoid introducing defects in the central device region and to plate effectively a large surface area, a plating tool typically makes numerous electrical contacts to the conductive seed layer only around the wafer periphery (all around the edge region of the wafer substrate). There is no direct contact made to the central region of the substrate. Hence, for highly resistive seed layers, the potential at the edge of the layer is significantly different than at the central region of the layer. In extreme cases, the scale of the potential differences within the metal film can be so great as to cause reaction at the wafer edge to occur at or near the electrochemical diffusion limit where a number of undesirable characteristics in the deposition can result (e.g., dendritic morphology), while simultaneously little or no reaction occurs at all at the inner regions of the wafer. Conventional means of decreasing plating non-uniformities (resulting from the significant center-to-edge variation of potential in the metal) utilize: (1) charge transfer inhibitors (e.g., plating suppressors and levelers, with the goal of creating a significant normal-to-the-surface voltage drop, thereby making the terminal voltage drop less or insignificant in comparison to the drop in the metal layer and electrolyte layers); or (2) very high ionic electrolyte resistances (yielding a similar effect). Unfortunately, typical organic additives cannot create surface polarization in excess of about 0.5 V. Thus, conventional uniformity-enhancing techniques cannot create polarization and related voltage drops required for very-thin-film seed plating, and hence cannot enable uniform electroplating of metal when the sheet resistances are large.

Furthermore, electrolyte composition is often determined by other plating factors, which can limit the range of usable or obtainable electrolyte resistivity. Electrolyte formulations having conductivities less than about 0.05 ohm$^{-1}$ cm$^{-1}$ require a near neutral pH value, no other supporting electrolytic components, and a relatively low metal concentration. The high-resistance electrolyte approach has limits and potentially several very significant problems: (1) the limited solubility of metal (e.g., copper) in higher pH baths without resorting to strong metal complexing (chelating) agents; (2) the (often associated) fact that a bath tends not to retain its film-morphology and feature-filling characteristics; (3) the added kinetic resistance associated with lower copper concentration is not favorable; and (4) a low mass-transfer-diffusion-limited plating rate.

The ability to electrofill features successfully, that is, the ability to electroplate very small, high aspect ratio features without voids or seams, is dependent on a number of parameters. Among these are: (1) plating chemistry; (2) feature shape, width, depth, and density; (3) local seed layer thickness; (4) local seed layer coverage; and (5) local plating current. These are substantially interrelated. For example, thinner seed layers can lead to greater potential differences between the center and edge of a wafer, and hence to large variations in current density during plating. Additionally, it is known that poor seed-layer side-wall coverage leads to higher average resistivities for current traveling normal to the feature direction (for trenches), also leading to large current-density differences between the center and edge of a wafer. It has generally been observed (substantially independent of plating chemistry) that effective electrofilling occurs only over a finite range of current densities or time-scales. While the appropriate electrofilling current density might depend on such things as feature shape, width or plating chemistry, for any given set of these parameters, there is a finite process window (i.e., localized current density) in which electrofilling can be successfully performed. Therefore, an apparatus and method of plating at a uniform current density over a whole wafer is needed.

Any change in conditions which increases seed layer resistivity or a seed layer's electrical path exacerbates the difficulty of achieving a uniform current distribution (required to maintain effectively uniformity of feature electrofilling across an entire wafer). A number of industry trends tend to increase seed layer resistivity. These include: (1) use of thinner seed layer films; (2) larger diameter wafers; (3) increasing pattern density; 4) smaller features and (5) increasing feature aspect ratios. Unfortunately, these trends produce more challenging conditions for electrofilling and are not generally amenable to maintaining uniform current density across a wafer. For example, for a given PVD (physical vapor deposition) seed deposition condition, smaller features are substantially more "necked" as compared to larger ones. As feature size shrinks, necking restricts the opening at the top opening of an etched feature. This effect causes the effective aspect ratio (i.e., the aspect ratio, AR, at which the plating process must begin plating into the feature) of the smaller width features to be substantially higher than that of the original, unseeded etched feature. To minimize this necking effect, a thinner seed layer with more conformal side wall coverage must be generally employed. However, a thinner seed layer can cause the voltage drop within the seed layer to be greater and the current distribution across the wafer to become more non-uniform, which (if left uncompensated) leads to poor electrofilling uniformity across the wafer.

It has been shown that the terminal resistance (wafer edge to center, ohms) (resistivity, differential resistance or resistance per unit length) from the edge to the center of the wafer is independent of radius. See E. K. Broadbent, E. J. McInerney, L. C. Gochberg, and R. L. Jackson, "Experimental and Analytical Study of Seed Layer Resistance for Copper Damascene Electroplating", *J. Vac. Sci. & Technol.*, B17, 2584 (1999). However, because the process of electrofilling requires that the current density scale as the wafer area, a 300 mm wafer requires 2¼ times more total current than a 200 mm wafer. With higher applied current at the edge (to maintain the same current density) and the same resistance, the potential drop from the edge to the center of the wafer is greater in a 300 mm wafer than in a 200 mm wafer.

FIG. 1 depicts schematically a cross-sectional view 100 of a conventional electroplating system 102 of the prior art. FIG. 1 contains an equivalent electrical circuit simplified to one dimension to explain the problem of "terminal effects" associated with plating (or removing) a thin metal film on a substrate surface. Conventional electroplating system 102 comprises conductive anode 104, which is electrically connected to a power supply 106. During electroplating, metal contained in electrolytic solution 108 is deposited on a thin conductive seed layer 110 located on a wafer substrate 112. The outer, peripheral edge 114 of seed layer 110 is connected to a negative terminal of power supply 106. The continuous resistance in seed layer 110 is simplified and represented by a discrete set of finite (in this case four) parallel circuit elements. The in-film resistor elements, $R_f$, represent the differential resistance from an outer radial point to a more central radial point on the wafer. The total current, $I_t$, supplied at edge 114 is distributed to the various surface elements, $I_1$, $I_2$, $I_3$, $I_4$, scaled by the total path resistances with respect to all the other resistances. The circuits more centrally located have a larger total resistance because of the cumulative/additive resistance of the $R_f$ for those paths. Mathematically, the fractional current $F_i$ through any one of the surface element paths is $$F_i = \frac{I_i}{I_t} = \frac{Z_T}{Z_i} = \frac{\frac{1}{(iR_f + R_{ct,i} + Zw_i + R_{el,i})}}{\sum_1^n \frac{1}{iR_f + R_{ct,i} + Zw_i + R_{el,i}}} \quad (1)$$

where n is the total number of parallel paths inot which the circuit is divided, i (sometimes used as a subscript) refers to the i-th parallel current path (from the edge terminal), t refers to the total circuit, I is current, $R_f$ is the resistance in the metal film between each element (constructed, for simplicity, to be the same between each adjacent element), $R_{ct}$ is the local charge transfer resistance, $Z_w$ is the local diffusion (or Warberg) impedance and $R_{el}$ is the electrolyte resistance. With this, $I_i$ is the current through the i-th surface element pathway, and $I_t$ is the total current to the wafer. The charge transfer resistance at each interfacial location is represented by a set of resistors $R_{ct}$ in parallel with the double layer capacitance $C_{dl}$, but for the steady state case does not effect the current distribution. The diffusion resistances, represented by the Warberg impedance (symbol $Z_w$) and the electrolyte resistance ($R_{el}$) are shown in a set of parallel circuit paths, all in series with the particular surface element circuit. The several parallel current paths (e.g., the four paths $I_1$-$I_4$) depicted in FIG. 1 are available for carrying plating current to anode 104, the amount of current being influenced by the resistance and potential difference associated with each path. In practice, $R_{ct}$ and $Z_w$ are quite non-linear (depending on current, time, concentrations, and other factors), but this fact does not diminish the utility of this model. To achieve a substantially uniform current distribution, the fractional current should be the same, irrespective of the element position, i. When all terms other than the workpiece's seed layer's resistance terms, $R_f$ ($R_{f1}$-$R_{f4}$ in FIG. 1) are relatively small, the fraction of current to the i-th element is $$F = \frac{\frac{1}{i}}{\sum_{1}^{n} \frac{1}{i}} \quad (2)$$

Equation 2 has a strong i (location) dependence and is valid when no significant current-distribution compensating effects are active. In the other extreme, when $R_{ct}$, $Z_w$, $R_{el}$ or the sum of these terms are greater than $R_f$, the fractional current approaches a uniform distribution. The limit of Equation 1 as these parameters become large relative to $R_f$ is $F=1/n$, independent of location i.

FIG. 1 helps explain the physics behind several of the earlier approaches to solving the problem of plating non-uniformity. The goal was to achieve a uniform current distribution on a surface having a high sheet resistance. This meant trying to make the current that passes through each combination of series and parallel circuit paths (starting at the wafer periphery, exiting the wafer surface at various locations, and traversing the electrolyte to the counter electrode), be as equal as possible. To do this, the total path resistances needed to be as close to the same as possible. Some techniques of decreasing plating non-uniformity (i.e., enhancing plating uniformity) included utilizing: high $R_{ct}$ through the use of copper complexing agents or charge transfer inhibitors (e.g., plating suppressors and levelers) with the goal of creating a large normal-to-the-surface voltage drop, small $R_f$ with respect to $R_{ct}$; high ionic electrolyte resistances (yielding relatively large $R_{el}$); significant diffusion resistance ($Z_w$); variations of plating current recipe to minimize voltage drop; and control of mass transfer rate to limit current density in areas of high interfacial voltage drop. See, for example, U.S. Pat. No. 6,074,544, issued Jun. 13, 2000, to Reid et al., and U.S. Pat. No. 6,162,344, issued Dec. 19, 2000, to Reid et al. These approaches have some limitations associated with the processes and with physical properties of the materials. Typical surface polarization derived by organic additives does not create polarization in excess of about 0.5 V (which is relatively small in comparison to the seed layer voltage drop that must be compensated). Also, because the conductivity of a plating bath is tied to its ionic concentration and pH, a decrease in bath conductivity directly and negatively impacts the rate of plating and the morphology of the plated material.

Other approaches have also been pursued to address the terminal effect problem. One class alters the effective ionic path resistance $R_{el}$ for different current path elements (i.e., it provides a non-uniform $R_{el}$ in the radial direction) to balance the film resistance with the resistance external to the film, as discussed in U.S. Pat. Nos. 6,126,798, 6,569,299 and 6,179,983, issued to Reid et al. This class includes patents teaching current shielding and concentric multiple anodes. See U.S. Pat. No. 6,773,571 issued Aug. 10, 2004, to Mayer et al., and U.S. Pat. No. 6,402,923, issued Jun. 11, 2002, to Mayer et al., both of which are incorporated herein by reference for all purposes. Another approach utilizes time-averaged exposure of substrate to plating current (e.g., with a rotating wafer and a current shield element) to plate the same thickness at all locations over time. See U.S. Pat. No. 6,027,631, issued Feb. 22, 2000, to Broadbent et al., and U.S. Pat. No. 6,919,010, issued Jul. 19, 2005, to Steven T. Mayer, titled "Uniform Electroplating Of Thin Metal Seeded Wafers Using Rotationally Asymmetric Variable Anode Correction", which are incorporated herein by reference for all purposes. The use of asymmetrical shields has been used to change (tailor) plating uniformity. See U.S. Pat. No. 6,027,631, issued Feb. 22, 2000, to Broadbent, which is incorporated by reference. While the approaches discussed above are useful, they have potential limitations, such as: the difficulty of continuously (throughout the process) appropriately changing the resistance compensation when the thickness of the plated layer grows and thereby reduces the electronic resistance. See also U.S. patent application Ser. No. 10/739,822, filed Dec. 17, 2003, by Steven T. Mayer et al., titled, "Method For Planar Electroplating", which is also incorporated herein by reference for all purposes.

Problems corresponding to those discussed above with respect to electroplating are also encountered in other electrolytic techniques, such as electropolishing, electroetching, electrochemical mechanical deposition (ECMD) and electrochemical mechanical polishing (ECMP). With anodic dissolution processes such as ECMP, as a metal film is removed and becomes thinner, the terminal resistance increases, potentially resulting in non-uniform current distribution and non-uniform removal of metal from the anodic substrate surface.

Thus, better methods and apparatuses for providing uniform electrochemical potential at a substrate surface are needed.

SUMMARY OF THE INVENTION

The invention helps to solve some of the problems mentioned above by providing systems, apparatuses and methods for electrochemical treatment of integrated circuit substrates and other workpieces. In particular, embodiments in accordance with the invention are utilized to enhance electrolytic current distribution control during electroplating of metal onto a substrate, and also during removal of metal from a substrate by anodic dissolution. Embodiments in accordance with the invention are particularly useful to enhance electrolytic current distribution during electrochemical treatment of a substrate surface having a thin conductive, but relatively resistive layer, such as a thin metal seed layer.

Embodiments in accordance with the invention are suitable to modify the distribution of resistances in the electrical circuit of an electrolytic cell. This is useful, for example, to mitigate preferential current paths to the wafer periphery during processing. To effect control of the distribution of resistances, and thereby electrical current, the counter electrode used in an electrochemical treatment in accordance with the system has a relatively large resistance, or is semiconductive; that is, the counter electrode is neither highly conductive nor highly resistive. An exemplary range of semiconductive conductivity values is about from $10^{-2}$ Siemens per meter (S/m) to $10^2$ S/m. A semiconductive counter electrode (SCE) comprises a semiconductive film, which is attached to a highly conductive electric current "buss". The resistance of the semiconductive counter electrode is designed and implemented such that during its use, the voltage drop across the semiconductive electrode (in the general direction from the electric current buss to the workpiece treatment surface) is always significantly greater than the voltage drop from the electrical power contact (normally at the wafer/workpiece periphery) to the point on the wafer furthest from the electrical power contact (normally at the wafer's center). A semiconductive counter electrode allows the total resistance of the various current paths through the workpiece to become sufficiently equivalent to yield a substantially uniform current distribution.

A basic embodiment of an apparatus in accordance with the invention for performing electrochemical treatment of a substrate surface comprises a semiconductive counter electrode assembly. A semiconductive counter electrode assembly comprises an electrically conductive electric current buss and a semiconductive counter electrode. The electric current buss has a working surface and is operable to connect electrically to a terminal lead of a power supply. The semiconductive counter electrode is disposed on and covers the working surface of the electric current buss. A semiconductive electrode assembly is operable to form a thin fluid gap between the semiconductive electrode and a substrate treatment surface. An electrical substrate connector is operable to connect electrically at least one point of a substrate treatment surface to a terminal lead of a power supply. Some embodiments further comprise a substrate holder that is operable to hold a substrate. The substrate holder and the semiconductive counterelectrode assembly are operable to form a thin fluid gap between the semiconductive electrode and a substrate treatment surface. In some embodiments, a substrate holder includes an electrical substrate connector. Typically, the working surface of the electric current buss, a working surface of the semiconductive electrode, and the substrate holder are substantially coextensive. In some embodiments, the semiconductive counter electrode assembly and the substrate holder are operable to form a thin fluid gap having a gap width less than 20 percent of the largest dimension of the substrate treatment surface. In some embodiments, the semiconductive counter electrode assembly and the substrate holder are operable to form a thin fluid gap having a gap width less than 10 percent of the largest dimension of the substrate treatment surface. In some embodiments, the semiconductive counter electrode assembly and the substrate holder are operable to form a thin fluid gap having a gap width not exceeding about three percent of the largest dimension of the substrate treatment surface, and even down to a gap width not exceeding about one percent of the largest dimension of the substrate treatment surface. For example, in the case of treating a semiconductor wafer having a 300 mm diameter, the semiconductive counter electrode assembly and the substrate holder generally are operable to form a thin fluid gap having a gap width in a range of about from 1 mm to 30 mm.

Generally, the semiconductive counter electrode is impermeable to electrolytes. Preferably, the semiconductive counter electrode comprises a material that is non-porous to liquids and electrolytes. Generally, the semiconductive counter electrode is substantially nonconductive of ionic current. Generally, the conductive electric current buss is shielded against contact with electrolytic liquid used in the apparatus. Generally, the semiconductive counter electrode substantially covers the working surface of the electric current buss to the extent necessary to prevent physical contact between the electric current buss and electrolytic liquid used in the apparatus. In some exemplary embodiments, the semiconductive counter electrode comprises a semiconductive material located on the electric current buss, and the semiconductive material has a thickness in range of about from 0.1 mm to 10 mm. In some exemplary embodiments, the semiconductive counter electrode consists essentially of a layer of semiconductive material located on the electric current buss, and the layer has a thickness in range of about from 1 nanometer (nm) to 100 nm. In some exemplary embodiments, the semiconductive counter electrode comprises a material located on the electric current buss, and the material has an electrical conductivity in a range of about from 0.01 S/m to 100 S/m. In some exemplary embodiments, the semiconductive counter electrode comprises a material located on the electric current buss, and the material has an electrical sheet resistance in a range of about from 10 ohm per square to $10^4$ ohm per square.

A basic embodiment of a method in accordance with the invention of performing an electrochemical treatment of a substrate surface comprises: providing an electrolytic solution in a thin fluid gap between a substrate treatment surface and a semiconductive counter electrode of a semiconductive counter electrode assembly; and applying a voltage between the semiconductive counter electrode and the substrate surface. Some embodiments comprise forming a thin fluid gap before providing electrolytic solution to form a thin liquid layer in the fluid gap. Some embodiments comprise providing electrolytic solution (e.g., an electrolyte bath in a container) before forming the thin fluid gap. In some embodiments, the fluid gap formed has a gap width less than 20 percent of the largest dimension of the substrate treatment surface. In some embodiments, the fluid gap formed has a gap width less than 10 percent of the largest dimension of the substrate treatment surface. In some embodiments, the fluid gap formed has a gap width not exceeding about three percent of the largest dimension of the substrate treatment surface, and in some embodiments, not exceeding about one percent.

In a typical embodiment, applying a voltage comprises: electrically connecting the substrate surface to a terminal of a power supply; and connecting an electric current buss of the semiconductive counter electrode assembly to an opposite terminal of the power supply. Generally, the electric current buss is in contact with the semiconductive electrode and not in contact with the electrolytic solution. Generally, the semiconductive electrode is resistive to ionic flow of current. Typically, a method in accordance with the invention is used for electrochemical treatment of a substrate surface that has an electrically conductive, but relatively resistive layer, such as a thin metal seed layer or a thin metal layer being removed by anodic dissolution. In an exemplary embodiment, the substrate treatment surface comprises a thin metal seed layer, the electrolytic solution comprises metal ions, and applying a voltage comprises connecting an electric current buss to a positive terminal of the power supply so that the semiconductive counter electrode functions as an anode, such as in electroplating and electrochemical mechanical deposition (ECMD). In anodic dissolution techniques, such as electropolishing, electroetching and electrochemical mechanical polishing (ECMP), the substrate treatment surface comprises a metal and applying a voltage comprises connecting an electric current buss to a positive terminal of the power supply so that the semiconductive counter electrode functions as a cathode.

The utility and benefits of embodiments in accordance are also applicable in combination with still other technological developments, such as: chemically-activated electrofill (i.e., surface pretreatment and feature fill using a plating bath without bath additives such as an accelerator); selective surface acceleration planar plating (SSAPP) processes; microcell thin-layer plating (particularly utilizing inert anodes); and conformal wet-etch processing. Other features, characteristics and advantages of embodiments in accordance with the invention will become apparent in the detailed description below.

DETAILED DESCRIPTION OF THE INVENTION

Figure 1:
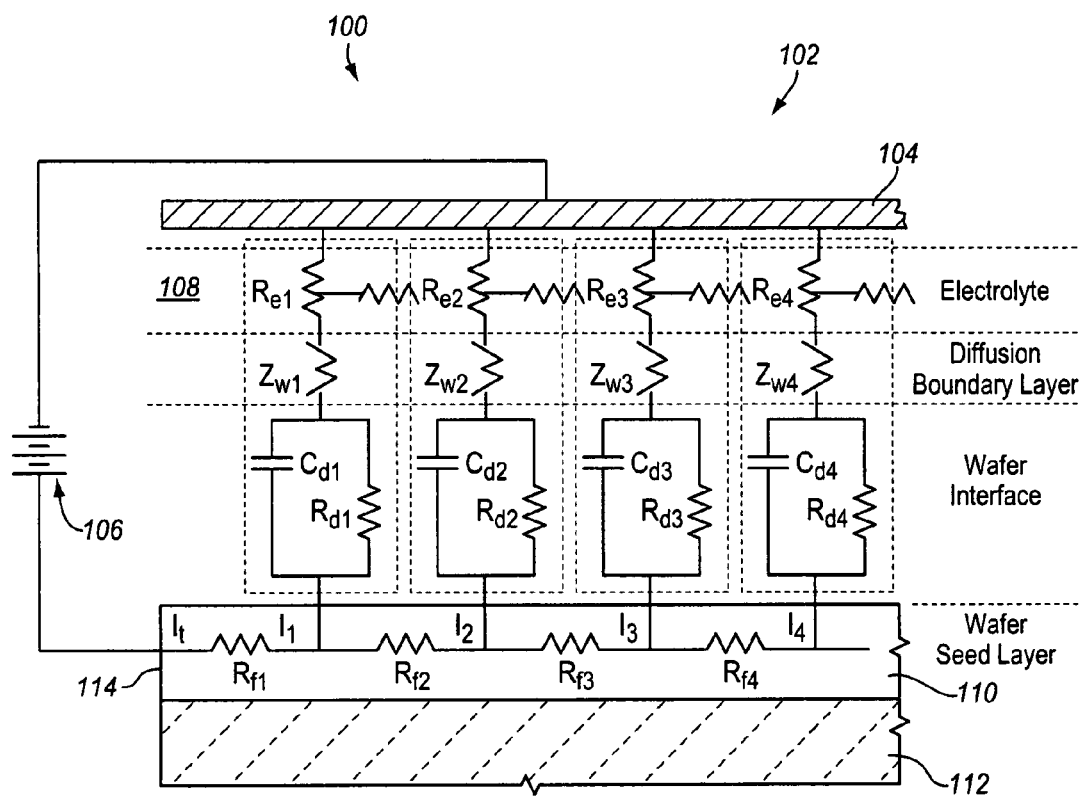
FIG. 1 depicts schematically a conventional electroplating system of the prior art and contains an equivalent electrical circuit simplified to one dimension.

The invention is described herein with reference to FIGS. 2-32. It should be understood that the structures and systems depicted schematically in the figures serve explanatory purposes and are not precise depictions of actual structures, apparatuses, and systems in accordance with the invention. Furthermore, the embodiments described herein are exemplary and are not intended to limit the scope of the invention, which is defined in the claims below.

Embodiments in accordance with the invention relate to methods and apparatuses for electrochemical treatment of substrates in integrated circuit (IC) fabrication and other applications. More specifically, the invention involves semiconductive counter electrodes in electrochemical processing. Generally, embodiments utilize a semiconductive counter electrode assembly that comprises a semiconductive counter electrode (SCE) and a conductive electric current buss covered by the SCE. The semiconductive electrode material covering the electric current buss is substantially impermeable to electrolytes and the ions contained therein and, therefore, to ionic current flow, but allows passage of electrons from an electrolytic bath to the electric current buss. The working surface of the semiconductive counter electrode is positioned opposite the treatment surface of a workpiece to form a narrow gap. During operation, electrolyte fluid fills the narrow gap, forming a thin electrolyte layer. The thin layer of ionic conductor (the electrolyte) located in the narrow gap and carrying ionic current converts the ionic current by a Faradaic reaction to an electronic current. The semiconductive counter electrode is separated from the workpiece (substrate treatment surface) by the relatively thin electrolyte layer. Due to its thinness, this electrolyte layer possesses a relatively small ionic-current-flow resistance between the workpiece and the semiconductive electrode/electrolyte interface, but it also provides a large ionic resistance in the direction parallel along the surfaces of the workpiece and semiconductive counter electrode (e.g., in radial directions of a circular wafer substrate workpiece). A conductive, but relatively electrically resistive, thin film on the surface of the workpiece causes a large circuit resistance in the various ionic current paths (small at the edge, largest at the center away from the points of electrical contact to the workpiece). The large overall circuit resistance to current flow caused by the presence of the semiconductive counter electrode (SCE) compensates for the otherwise preferential edge plating associated with electrical resistance and voltage drop across the treatment surface of the workpiece. To some extent, one can view the semiconductive element as enabling and creating a source of uniform ionic current, and because the electrolyte is relatively thin, current tends to flow directly to the treatment surface of the workpiece rather than to the edges of the workpiece. Embodiments in accordance with the invention are designed to provide adequate uniformity at the beginning of an electroplating process or at the end of an anodic dissolution process (when the workpiece film resistance is highest), and also provide uniform plating at all other times during a process, when the metal film is thicker.

The term "semiconductive" and related terms are used in this specification to characterize materials and device components that are neither highly conductive nor highly resistive. The term semiconductive and related terms have a meaning well known in the electrical and electronics arts although there is no precise definition. The requirements and selection of semiconductive material in various applications of the invention are relative. They depend, among various factors, on the sheet resistance of the film to be treated (deposited or removed) and the conductivity of the ionic-current-carrying electrolyte in the particular electrochemical operation. A semiconductve counter electrode that is "too conductive" does not offer significant added resistance to the system and, for a given total current, insufficiently increases the voltage between the terminal contact leads or contact "fingers" and the electric current buss. On the other hand, if the resistance of the semiconductive counter electrode is too high (the material is a dielectric), then little or no current can pass without excessive voltage, power, and heat generation. An exemplary broad range of conductivity values of semiconductive materials is a range of about from $10^{-2}$ Siemens per meter (S/m) to $10^2$ S/m.

Embodiments in accordance with the invention enable a simple, low cost, reliable deposition of a uniformly electroplated metal layer on a workpiece having a thin metal seed layer. Similarly, embodiments enhance anodic dissolution of a thin layer of metal from a workpiece. In particular, embodiments in accordance with the invention enable superior uniformity control on workpieces having (1) very thin "seed" layers with sheet resistances of about 1 ohm/sq or greater, (2) large diameters (e.g., 300 mm or 450 mm semiconductor wafers), (3) high feature densities (e.g., at least about 5000 features per cm), and (4) small feature sizes (e.g., average size of about 95 nanometer (nm) or less).

The term "electric current buss" and related terms refer generally to a component of embodiments in accordance with the invention that is electrically conductive and that serves to "collect electrons" in metal plating operations, and to "provide" electrons in anodic dissolution processes. It is important that an electric current buss in accordance with the invention have a much greater conductance than the conductance of the semiconductive counter electrode that covers it. In other words, it is important that an electric current buss in accordance with the invention have a much smaller resistance than the resistance of the semiconductive counter electrode that covers it so that the resistance to electric current in the electric current buss is negligible compared to the relatively high resistance to current through the semiconductive counter electrode. Accordingly, an electric current buss in accordance with the invention is made substantially from one or more materials having a conductivity much greater than the conductivity of materials in the semiconductive counter electrode. Generally, an electric current buss in accordance with the invention is made substantially from one or more materials having a conductivity of not less than about $10^4$ S/m. Typically, an electric current buss in accordance with the invention is made substantially from one or more materials having a conductivity of about $10^6$ S/m or greater. It is also important that the electric current buss have no direct electrical contact and, therefore, no direct physical contact with the working electrolytes. If there were direct electrical contact between the buss and the electrolyte, the semiconductive counter electrode would be at least partially shunted out of the circuit and its function and utility would be thwarted. In embodiments in accordance with the invention, the semiconductive counter electrode is in direct electrical contact and also in direct physical contact with the electrolyte or other ionic conducting medium (e.g., cationic membrane). Also, the semiconductive counter electrode is generally in direct electrical and physical contact with the electric current buss. In other words, during electrochemical treatment in accordance with the invention, the semiconductive counter electrode is located between the electrolyte and the electric current buss and completely separates them.

In some embodiments, the semiconductive counter electrode is a thin layer or film of semiconductive material located on the working surface of an electrically conductive electric current buss. The working surface of an electric current buss is simply the part of the surface of the conductive electric current buss that is in electrical and usually physical contact with the semiconductive counter electrode. In some embodiments, the semiconductive counter electrode comprises a single layer of semiconductive material. In some embodiments, the semiconductive counter electrode comprises two or more layers of material. In some embodiments, the semiconductive counter electrode is attached to the conductive electric current buss by a thin layer of conductive adhesive. Thus, semiconductive counterelectrode is practically in direct physical contact with the electric current buss or even though there is a thin adhesion layer separating the semiconductive counterelectrode and the bulk electric current buss. Alternatively, the thin layer of conductive adhesive is viewed as a part of the electric current buss. In embodiments in accordance with the invention, the conductive electric current buss is shielded against direct electrical and physical contact with electrolytes used in the electrochemical treatment of the substrate. In a broad sense, the semiconductive counter electrode provides electrical contact between the electric current buss and electrolytic liquid in a thin fluid gap. Since the semiconductive counter electrode, however, provides substantial electrical resistance, the electric current buss is only in "indirect", not direct, electrical contact with electrolyte. In other words, in embodiments in accordance with the invention, there is no substantially conductive electrical path between electrolytic liquid and the conductive electric current buss.

Language in this specification frequently refers to a semiconductive counter electrode "covering" an electric current buss. In this respect, the terms "cover", "completely cover" and related terms indicate that the semiconductive counter electrode covers the electric current buss at least to the extent necessary to prevent direct electrical and physical contact between the electrolyte in an electrolytic cell and the electric current buss. The term "cover" and related terms in this sense do not necessarily mean that the semiconductive counter electrode covers those parts of an electric current buss, such as external parts or enclosed, shielded parts) that otherwise do not come in contact with electrolyte. For example, in some embodiments, the bottom and sides of a cylindrical electric current buss are in contact with electrically nonconductive walls of container and are thereby shielded by the container walls, while the top working surface of the cylindrical electric current buss is covered by the semiconductive counterelectrode.

The word "substrate" herein generally means an entire workpiece as well as a workpiece surface on which some material is deposited or removed. In this specification, therefore, the terms "substrate", "substrate surface", "substrate treatment surface" and related terms also refer to the surface of a workpiece as it exists at a particular phase of fabrication and on which a particular fabrication process is being conducted. In this specification, the terms "substrate", "wafer", "workpiece", "substrate surface" and related terms are often used interchangeably.

The term "substrate holder" and related terms are used broadly in this specification to refer to any object or combination of objects that actively or passively hold or support a substrate during electrochemical treatment in accordance with the invention. As generally used in the art, the terms "substrate holder" and similar terms usually refer to specially designed hardware, such as a clamshell-type wafer holder that is operable to clamp and secure a substrate, move the substrate in various directions, and even provide electrical contact to the substrate. In this specification, the term "substrate holder" includes not only such conventional meanings, but also includes such objects as simple brackets and even the bottom of a container or tray on which a substrate rests or is otherwise supported.

The term "semiconductive counter electrode assembly" refers broadly to a combination comprising a semiconductive counter electrode and an electric current buss in which the semiconductive counter electrode is mounted on and covers the working surface of the conductive electric current buss.

Some language in the specification refers to a semiconductive counter electrode assembly or a combination of a semiconductive counter electrode assembly and a substrate holder being operable to form a thin fluid gap between a semiconductive counter electrode and a substrate treatment surface. This language is used broadly and in a relative sense; that is, the language indicates that a semiconductive counter electrode assembly or a substrate holder or both the semiconductive counterelectrode assembly and the substrate holder are operable (e.g., by disposing in a particular position or by moving) to form the thin fluid gap. Thus, in some embodiments, the semiconductive counterelectrode assembly is movable and the substrate (and the substrate holder when applicable) is stationary. In some embodiments, the semiconductive counterelectrode assembly is stationary and the substrate (and the substrate holder when applicable) is movable. In some embodiments, both the semiconductive counterelectrode assembly and the substrate holder are movable. In some embodiments, both the semiconductive counterelectrode assembly and the substrate holder are stationary.

In this specification, terms of orientation, such as "face-up", "above", "below", "up", "down", "top", "bottom", "lateral" and "vertical" and others, used to describe embodiments relate to the relative directions in the figures (e.g., FIG. 2), in which a substrate wafer defines a substantially horizontal plane. It is understood, however, that the spatial orientation of substrates and apparatuses in embodiments in accordance with the invention are not confined to those depicted in the drawings.

While workpieces and semiconductive counter electrodes are described and depicted in this specification as generally flat planar surfaces, this is not a requirement. In some embodiments, when electrochemically treating (e.g., metal plating or metal dissolution) a curved surface with a thin metal layer, the semiconductive counter electrode surface follows the contours of the workpiece, and the thickness of the thin fluid gap is as nearly uniform as possible. For example, in some embodiments, a current collecting buss is constructed as a mirror image of the workpiece surface (so that if the workpiece and buss would brought in contact, there would be no gap between the two surfaces), and a semiconductive anode film is disposed on the current buss. Then, the two surfaces (workpiece and semiconductive counter electrode) are brought into close proximity (typically to within 2-3 mm) and substantially uniform plating is obtained on the workpiece.

Typically (although not necessarily), the semiconductive counter electrode and the electric current buss are substantially coextensive. For example, a semiconductive counter electrode for treating a 300 mm substrate wafer typically has a circular electrode surface with a diameter of about 300 mm.

In such a case, the conductive electric current buss typically comprises a cylinder of conductive material covered by the semiconductive counter electrode and having a diameter of about 300 mm.

While some embodiments in accordance with the invention employ electrochemical processing cells in which electrical contact is made in the edge region of the wafer substrate, it is not limited to any general class of electroplating or electrochemical processing apparatus. An example of a suitable commercially available apparatus adaptable for use in accordance with the invention is the SABRE® clamshell electroplating apparatus available from Novellus Systems, Inc. of San Jose, Calif. and described in U.S. Pat. Nos. 6,156,167, 6,159,354, 6,193,859, 6,139,712, and 6,755,946, which are incorporated herein by reference in their entirety.

Embodiments in accordance with the invention are described herein in terms of electrochemically treating integrated circuit wafers, particularly semiconductor wafers undergoing damascene processing. Embodiments in accordance with the invention are not limited, however, to electrochemical treatment only of integrated circuit wafers. Embodiments in accordance with the invention are useful for electrochemically treating workpieces of various shapes, sizes, and materials, such as printed circuit boards and flat panel displays, thinly seeded webs, and flexible circuits or other curved surfaces.

The term "seed layer" generally refers to a thin electrically conducting layer on a workpiece through which current is passed to effect, for example, electroplating. Frequently, seed layers are copper layers on wafers. Layers of other materials, such as ruthenium and some conductive barrier materials, are useful as seed layer. Seed layer thickness is generally a function of the technology node being implemented. Exemplary seed layers have a thickness in a range of about from 30 Å to 1000 Å.

The terms "electrolytic solution", "electrolytic liquid", "electrolyte bath", electrolyte and related terms are used in this specification interchangeably to designate any medium suitable for conducting an electrochemical treatment in accordance with the invention. Generally, such a medium comprises an aqueous solution containing dissolved electrolytes. However, organic based solutions and solid ionic conductive polymers with one or more cations or anions tethered to the polymer itself but able to conduct other ions therein are also considered as part of this broad class. Therefore, the terms are used broadly in this specification to include non-aqueous solutions, dispersions, gels, solvated polymers containing electrolytic species, cationic and anionic conductive membranes and polymers, and other suitable media. Some of the embodiments described below utilize two separate electrolyte compartments, a compartment containing a semiconductive counter electrode and an electrolyte bath of one composition, and a compartment containing the working electrode (substrate) and an electrolyte bath of a second composition. The terms "electrolytic solution", "electrolytic liquid", "electrolyte bath" and related terms also refer generally to such compositions of electrolyte.

Figure 2:
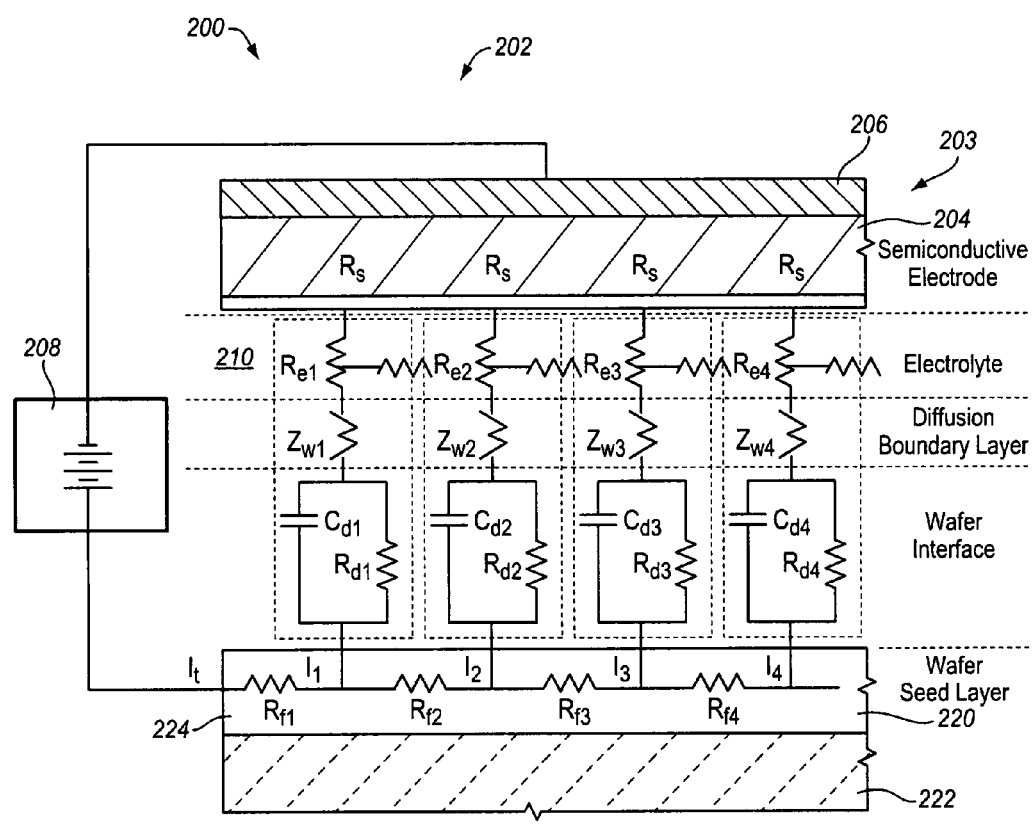
FIG. 2 depicts schematically an electroplating system comprising a semiconductive counter electrode (SCE) in accordance with the invention, and contains an equivalent electrical circuit simplified to one dimension to explain how an embodiment in accordance with the invention helps to solve the problem of "terminal effects"

FIG. 2 depicts schematically a cross-sectional view 200 of an electroplating system 202 comprising a semiconductive counter electrode assembly 203 in accordance with the invention. FIG. 2 contains an equivalent electrical circuit simplified to one dimension to explain how an embodiment in accordance with the invention helps to solve the problem of "terminal effects" associated with plating (or removing) a thin metal film on a substrate surface. Electroplating system 202 comprises semiconductive counter electrode assembly 203, which includes semiconductive anode 204 and electric current buss 206. Semiconductive anode 204 is mounted on conductive electric current buss 206. Electric current buss 206 is electrically connected to a power supply 208. During electroplating, metal contained in electrolytic solution 210 is deposited on a thin conductive seed layer 220 located on a wafer substrate 222. During electroplating, electroplating solution 210 located between semiconductive anode 204 and substrate 222 is in contact with semiconductive anode 204 and thin conductive seed layer 220, but electrically conductive electric current buss 206 is not in contact with electroplating solution 210. The outer, peripheral edge 224 of seed layer 220 is connected to a negative terminal of power supply 208.

As in system 102 depicted in FIG. 1 above, the continuous resistance in seed layer 220 is represented by a set of finite (in this case four) parallel circuit elements. The in-film resistor elements, $R_f$, represent the differential resistance in seed layer 220 from an outer radial point to a more central radial point on wafer 222. Similar to system 102, the total current, $I_t$, supplied at the edge is distributed to the various surface elements, $I_1, I_2, I_3, I_4$, scaled by the total path resistances with respect to all the other resistances. The circuits more centrally located have a larger total resistance because of the cumulative/additive resistance of the $R_f$ for those paths. The various electrical current paths in system 202, however, include additional resistance provided by semiconductive anode 204 and represented by the symbol $R_s$ in FIG. 2. Systems in accordance with the invention are designed such that the resistance of the semiconductive electrode is significantly larger than the other resistances represented in FIG. 2. By adding the resistance $R_s$ of semiconductive anode 204 to the other resistance terms in Equation (1) above, it can be seen that the fractional current $F_i$ through the various surface element paths approaches a uniform distribution as the value of $R_s$ becomes large compared to $R_f$ of the various i current paths. During electrochemical processing in accordance with the invention, it is important that the conductive electric current buss not be in direct electrical contact with the electrolytic solution between the semiconductive electrode and the substrate. A semiconductive electrode in accordance with the invention typically (but not necessarily) is substantially coextensive with the workpiece substrate. For example, a cylindrical semiconductive electrode being used to treat a 300 mm semiconductor wafer typically also has a diameter of about 300 mm and is centered together with the wafer.

A semiconductive electrode in accordance with the invention typically comprises a semiconductive layer or film mounted on a highly conductive electric current buss, such as a piece of conductive metal (e.g., aluminum, copper). The buss acts as a current collector or source as well as a substantially uniform potential surface. During electrochemical processing, current flows though the resistive semiconductive counter electrode more or less uniformly because it is the largest resistance in the system. Thus, to achieve uniform current flow, the resistance of a semiconductive counter electrode should be highly uniform spatially. A non-uniformity in the semiconductive electrode's thickness or variations in its local intrinsic conductive properties could lead to a variation in the resistance across the layer and, since that resistance is large and dominant, could influence the current distribution on the conductive surface of the workpiece.

There are a number of useful materials that function as a semiconductive counter electrode in accordance with the invention. A suitable material is a moderately poor conductor of electrical current (in contrast to a high resistance virtual anode, which is a moderately poor conductor of ionic current). During electrochemical processing, the surface of the semiconductive electrode generally is exposed to the process electrolyte, or at least to an ionically conducting solution. (e.g., in embodiments having separated counter electrode and working electrode chambers). Therefore, a semiconductive counter electrode in accordance with the invention preferably is composed of a material that is chemically resistive to the electrolyte being used in the electrochemical (plating or anodic dissolution) process. In addition, the semiconductive counter electrode (anode for electroplating, cathode for electroetching-type operations) preferably is also electrochemically stable (does not corrode) at the oxidation or reduction potential applied. This stability is achieved in various ways; for example, through the selection of materials with appropriate thermodynamic stability, or through kinetics-limited oxidation/reduction protection (e.g., as a result of a stable formation of a passivating surface film). Examples of suitable semiconductive electrode materials include: doped silicon (e.g., doped with P or B to create a p or n type semiconductor); carbon (including relatively poorly conducting carbon forms such as "amorphous" or diamond-like carbons, e.g., formed by carbon sputtering deposition or pyrolysis of non-graphitizing organic precursors). Examples of suitable semiconductor electrode materials also include metals that form electronically resistive surface oxides, particularly metals from Group III to VI ("refractory" metals) that generally form native or anodically-formed surface oxide films, such as Ti, Cr, Mo, Nb, Zr, V, Ha, Ta, Y, and W. In some embodiments, aluminum is used in electrolytes in which the aluminum oxide film is stable (generally not strongly acidic or alkaline environments). Gallium and germanium are suitable in some embodiments, although (due to their higher underlying cost) they are selected usually only when no other suitable alternative is available for a particular application. Materials formulated as mixtures and alloys that form highly electronically resistive surface films are also suitable semiconductive materials (e.g., various grades of stainless steels).

Also, a semiconductive electrode in accordance with the invention possesses substantially no ionic conductivity, even though it has a relatively large or complete resistance to electronic conduction. Accordingly, a semiconductive electrode in accordance with the invention is essentially nonporous to electrolyte liquid, or at least is covered with a nonporous material.

Materials that allow the flow of ionic current within their volume are generally unsuitable as semiconductive electrodes. Examples of unsuitable materials include so-called "solid" electrolytes, including: materials that allow volumetric (vs. surface only) oxidation/reduction reactions via intercalation; ionic conductors, such as polymer electrolytes, gel electrolytes, cationic and anionic membranes; and porous materials filled with electrolytic solutions.

In embodiments in accordance with the present invention, the electronic resistance in the workpiece's thin conductive layer (which often has a relatively high sheet resistance because it is thin) from the peripheral edge of the workpiece to the center of the workpiece should be significantly smaller than the resistive path in the electrolyte from just below the peripheral edge of the workpiece to the bottom of the semiconductive electrode surface. Under these conditions, electric current is impeded from traveling through a thin layer of electrolyte in a thin fluid gap between the central region of the semiconductive electrode and the peripheral edge of the workpiece (substrate) because the "ionic wire" of electrolytes from the center of the semiconductive electrode to the edge of the workpiece is narrow and hence highly resistive.

Thus, the working surface of a semiconductive counter electrode is disposed relatively close to the workpiece surface. Specifically, the distance separating the semiconductive electrode from the workpiece surface should be small with respect to the lateral dimension of the workpiece surface. The reason for this is that as the distance between semiconductive electrode and workpiece increases, the conduction path area through electrolyte increases and the net resistance between the center of the semiconductive electrode and the peripheral edge of the wafer substrate decreases. Therefore, the semiconductive electrode assembly generally is disposed so that the width of the gap separating the semiconductive electrode surface and the conductive surface of the workpiece substrate is less than 20 percent of the largest dimension of the workpiece substrate. Preferably, the spacing is less than 10 percent of the workpiece's largest dimension most preferably less than 1 percent of the largest dimension. Thus, in the case of a round wafer substrate having a diameter of 300 mm, the spacing between the semiconductive electrode surface and the wafer surface generally is less than 60 mm, preferably less than 30 mm, and more preferably less than 3 mm.

Note that typical relative dimensions of the various components are not represented to scale in FIG. 2; nevertheless, relative dimensions are important in embodiments in accordance with the invention. For example, generally the thickness of a semiconductor electrode 204 is significantly smaller than the distance from center of the electrode to its periphery to avoid current leakage within the SCE between its center and its edge. For example, for electroplating high-sheet-resistant 300 mm wafers, the lateral dimensions of the semiconductor counter electrode (i.e., of its working surface) are nominally the same as the wafer (i.e., about 300 mm in diameter), but the thickness of the SCE is less; for example, less than 30 mm, more preferably less than 3 mm. While not being bound to any particular theory, it is believed that if the lateral and thickness dimensions were comparable, then resistance scaling ratios would become unfavorable. If the SCE were relatively thick and similar to the lateral dimensions of a wafer workpiece, the electrical path resistance from the SCE center at its buss base, proceeding up and radially outwards towards the point of workpiece electrical contact would be comparable with the resistance of the more direct path through the SCE at its periphery to the electrical contact. In case of electroplating, a high concentration of current lines would terminate at the edge of a semiconductive anode at the electrolyte interface, thus negating the design goal. In contrast, in the case of a relatively thin semiconductive counter electrode, current flow that is primarily upwards toward the workpiece surface is maximized.

It has been observed by the inventors that while current density over the vast majority of a workpiece surface is uniform, current tends to sharply increase at the edge of a workpiece near the electrical connection. While not being bound by any particular theory, it is believed the reason for this local sharp current increase is that the controlling influence of resistance in the electrolyte, normally tending to confine and restrict current flow directly between the SCE and the workpiece, is no longer is operable at the edge over a scale approaching the width of the thin fluid gap between the workpiece (working electrode) and the SCE. If the SCE and the workpiece substrate are the same size and shape, then the current tends to increase near the peripheral edge beginning at a distance from the edge approximately equal to the gap width between SCE and substrate workpiece. For example, if the width of the fluid gap between the workpiece and SCE is 5 mm, the current density at the workpiece tends to increase over distance of 5 mm from the workpiece edge. In some embodiments, this problem is at least partially mitigated by controlling exactly the dimensions of the SCE and by fine tuning the overlap distribution of current right at the workpiece edge (or the time-averaged overlap fraction in the case of a substrate that moves relative to the SCE, e.g., by rotation or oscillation). Sizing the lateral dimension of the SCE to be slightly less than the workpiece (decreasing overlap at the workpiece edge) aids in diminishing edge current increase. Alternatively, or in combination, increasing the local width of the thin fluid gap between SCE and a wafer substrate (e.g., by tapering the SCE away from the workpiece), or increasing the thickness of the SCE "film" increase at SCE edge, also mitigates current non-uniformities at the edge of the workpiece. In some embodiments, edge current is controlled by varying the time average exposure of the wafer edge to current flow (the principles of which are described in U.S. Pat. No. 6,919,010, which is incorporated by reference). In some embodiments, edge non-uniformities are controlled and modified by using an auxiliary electrode, sometimes referred to as a current thief or current source, that is located at the workpiece periphery in the general region of the electrical contact. U.S. patent application Ser. No. 11/506,054, titled "Method and Apparatus of Electroplating Including Remotely Positioned Dual Cathode", filed Aug. 16, 2006, by Reid et. al, which is incorporated by reference, teaches methods and apparatuses for using an auxiliary electrode at the substrate periphery.

In some embodiments, the working surface (facing the substrate treatment surface) of the semiconductive counter electrode is coated with a catalytic coating to facilitate electrochemical oxidation or reduction reactions. While a sluggish reaction at the interface of the SCE and an electrolyte favorably increases the total system resistance, there might be cases in which the resistance at the interface is excessive. Also, in some cases, it is desirable to select one particular reaction over another. For example, in some cases, the electrochemical charge transfer (the faradaic redox reaction) process at the surface of the SCE might be undesirably slow. A catalytic coating on the surface of a SCE in accordance with the invention should not impart significant lateral (center to edge) electrical conductivity. If the film were to provide a significant lateral electric conduction path, then the useful semiconductive character (i.e., relatively high resistance/low conductivity) of the underlying semiconductive electrode would be compromised because elements at difference positions on the surface would be "shunted" together. Independent of the means of forming a catalyst coating, a catalyst coating in accordance with the invention causes an insignificant change in the electronic resistance of the semiconductive electrode over the length scale (typically greater than 10 mm) in which current distribution is being controlled. Thus, in some embodiments in which the electrocatalyst has a significantly larger specific conductivity than the material from which the semiconductor anode is constructed, a very thin coating of electrocatalyst is utilized, the thickness being such that the net resistance of the electrocatalyst film coating is much less than the resistance of the underlying semiconductive electrode. In some embodiments, the catalyst is divided into separated regions or islands of material. Techniques for forming islands of catalyst include, among others, screen patterning, lithography and etching. In some embodiments, due to the particular deposition physics, a catalytic film is deposited as a large number of isolated island nuclei or particles. One way of accomplishing this goal is to make the electrocatalyst film discontinuous; for example by depositing the film in a manner in which small isolated particles of electrocatalyst are formed, which sometimes occurs naturally under appropriate deposition operating condition. When the semiconductive surface is particularly non-wetting for the electrocatalyst and/or otherwise has an unfavorable set of surface energies for creating a continuous layer, film deposition occurs in a macroscopically non-uniform and laterally discontinuous manner; for example, through a screen printing technique. Alternatively, a continuous electrocatalytic film is formed and then post-processing of the film makes it discontinuous and creates isolated islands (e.g., by photolithography and etching). In some embodiments, the size and shape of the islands are designed and tailored to fit the particular needs of a particular deposition or etching process.

In some embodiments, the addition of redox agents to the processing electrolyte is a benefit in both plating and anodic dissolution (e.g., electroetching or polishing) processes. An example is the use of a $Fe^{+2}/Fe^{+3}$ charge transfer reaction in the electrolyte, which avoids solvent (e.g. water) decomposition reactions and enables the bath to be controllable via bath chemical dosing on or off line. A redox reaction is particularly useful in minimizing the degradation of bath additives due to the lower operating (less oxidizing or reducing) potential found at a semiconductive counter electrode.

Figure 3:
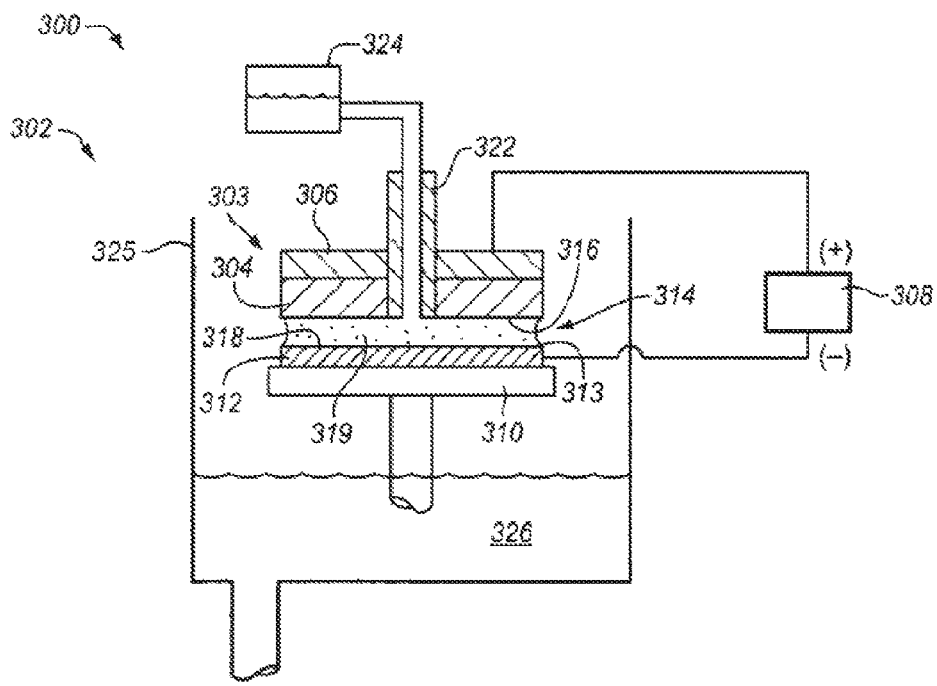
FIG. 3 depicts schematically a cross-sectional view of a system in accordance with the invention for electrochemically treating a substrate surface.

FIG. 3 depicts schematically a cross-sectional view 300 of a system 302 in accordance with the invention for electrochemically treating a substrate surface. System 302 comprises a semiconductive counter electrode assembly 303, which includes semiconductive counter electrode 304 and conductive electric current buss 306. Semiconductive electrode 304 is mounted on and in electric contact with electric current buss 306. In system 302, semiconductive counter electrode 304 functions as a semiconductive anode, and electric current bus 306 functions as an electric current collection buss. Electric current bus 306 is operable to connect to a positive terminal of a power supply 308. System 302 further comprises a substrate holder 310 for holding a substrate wafer 312. System 302 includes an electrical substrate connector (not shown) located in substrate holder 310. The electrical substrate connector is operable to provide electrical connection between at least one point of peripheral edge 313 of substrate wafer 312 and a negative terminal of power supply 308. Cylindrical semiconductive counter electrode assembly 303 and substrate holder 310 are operable to form a thin fluid gap 314 between circular working surface 316 of semiconductive counter electrode 304 and substrate surface 318. Generally, semiconductive electrode assembly 303 and substrate holder 310 are operable so that the width of thin fluid gap 314 separating semiconductive electrode surface 316 and substrate treatment surface 318 of workpiece substrate 312 is less than 20 percent of the largest dimension of the substrate treatment surface. Preferably, the spacing is less than 10 percent of the substrate's largest dimension, most preferably less than 1 percent of the largest dimension. Thus, in the case of a round wafer substrate having a diameter of 300 mm, the spacing between semiconductive electrode surface 316 and wafer surface 318 generally is less than 60 mm, preferably less than 30 mm, and more preferably less than 3 mm. During electrochemical treatment, a thin liquid layer 319 of electrolyte (typically an electrolytic solution) substantially fills thin fluid gap 314. During electrochemical treatment in accordance with the invention, it is important that there be no electrical contact between electric current buss 306 and thin liquid layer 319 of electrolytic solution. System 302 further comprises a fluid injection tube 322 that is operable to inject a fluid into thin fluid gap 314. As depicted in FIG. 3, fluid injection tube 322 is useful to fill thin fluid gap 314 with electroplating solution from liquid electrolyte source 324. Fluid injection tube 322 is also useful to inject air, nitrogen or other gas into thin fluid gap 314 to expel liquid out of fluid gap 314, and to inject other liquids into fluid gap 314 (e.g., deionized water for rinsing and cleaning semiconductive electrode 304, substrate 312 and substrate holder 310). Because fluid injection tube 322, as depicted in FIG. 3, passes through electric current bus 306 and semiconductive electrode 304, it is important that fluid injection tube 322 be constructed from or be coated with electrically insulating material so that fluid injection tube 322 does not provide direct electrical connection between electrolytes in fluid gap 314 and electric current buss 306. System 302 further includes processing container 325 that substantially encloses semiconductive electrode 304 and substrate holder 310 during electrochemical (e.g., electroplating) operations, and which serves to collect liquids 326 (e.g., electroplating solution, rinsing liquids) for recycling or disposal. Generally, substrate holder 310 is operable to rotate a substrate 312 during electrochemical processing. United States Patent Publication No. 2004/0065540 by Mayer et al., published Apr. 8, 2004, titled "Liquid Treatment Using Thin Liquid Layer", which is incorporated by reference, teaches apparatuses that are adaptable to conduct electrochemical processing in accordance with the present invention using a thin liquid layer.

Figure 4:
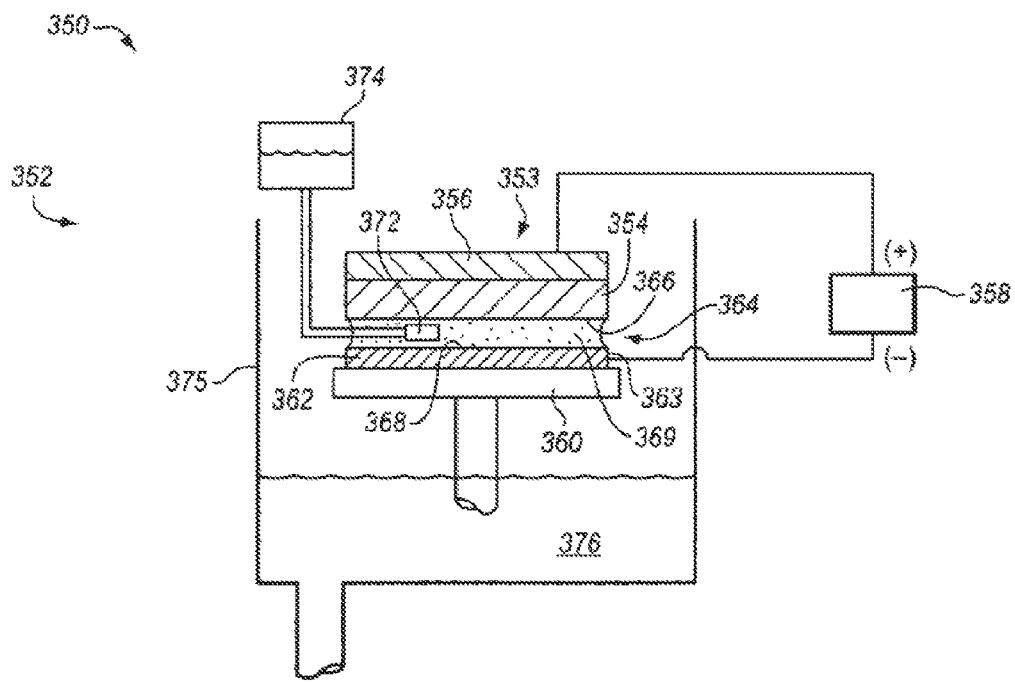
FIG. 4 depicts schematically a cross-sectional view of a system in accordance with the invention for electrochemically treating a substrate surface.

FIG. 4 depicts schematically a cross-sectional view 350 of a system 352 in accordance with the invention for electrochemically treating a substrate surface. System 352 comprises a semiconductive counter electrode assembly 353 that includes semiconductive electrode 354 and conductive electric current buss 356. Semiconductive electrode 354 is mounted on and in electric contact with electric current buss 356. As depicted in FIG. 4, semiconductive counter electrode 354 functions as a semiconductive anode, and electric current bus 356 functions as an electric current collection buss. Electric current bus 356 is operable to connect to a terminal of a power supply 358. System 352 further comprises a substrate holder 360 for holding a substrate wafer 362. Generally, substrate holder 360 is operable to rotate a substrate 362 during electrochemical processing. System 352 includes an electrical substrate connector (not shown) located in substrate holder 360. The electrical substrate connector is operable to provide electrical connection between a peripheral edge 363 of substrate wafer 362 and a terminal of power supply 358. Semiconductive counter electrode assembly 353 and substrate holder 360 are operable to form a thin fluid gap 364 between semiconductive counter electrode surface 366 and substrate surface 368. Generally, semiconductive electrode assembly 353 and substrate holder 360 are operable so that the width of thin fluid gap 364 separating semiconductive electrode surface 366 and conductive surface 368 of workpiece substrate 362 during electrochemical processing is less than 20 percent of the largest dimension of substrate treatment surface 368. Preferably, the spacing is less than 10 percent of the substrate treatment surface's largest dimension, and more preferably, less than 1 percent. Thus, in the case of a round wafer substrate having a diameter of 300 mm, the spacing between semiconductive electrode surface 366 and wafer surface 368 generally is less than 60 mm, preferably less than 30 mm, and more preferably less than 3 mm. During electrochemical treatment, a thin liquid layer 369 of electrolytic solution substantially fills thin fluid gap 364. During electrochemical processing in accordance with the invention, it is important that there be no electrical contact between electric current buss 356 and thin liquid layer 369 of electrolytic solution. System 352 further comprises a fluid injector 372 that is disposed in thin fluid gap 364 between semiconductive counter electrode 354 and substrate 362 and is operable to inject a fluid into thin fluid gap 364. As depicted in FIG. 4, fluid injector 372 is useful to fill thin fluid gap 364 with electrolytic solution from electrolyte source tank 374. Fluid injector 372 is also useful to inject air, nitrogen or other gas into thin fluid gap 364 to expel liquid out of fluid gap 364, and to inject other liquids into fluid gap 364 (e.g., deionized water for rinsing and cleaning semiconductive electrode 354, substrate 362 and substrate holder 360). An exemplary fluid injector 372 is selected from a group including a fluid nozzle, a multi-outlet injector, and a microporous membrane. In some embodiments, fluid injector 372 comprises a microporous membrane (not shown) that is substantially coextensive with substrate surface 368 and counter electrode surface 366. System 352 further includes processing container 375 that substantially encloses semiconductive counter electrode 354 and substrate holder 360 during electrochemical operations, and which serves to collect liquids 376 (e.g., electroplating solution, rinsing liquids) for recycling or disposal. U.S. Pat. No. 6,964,792, issued Nov. 15, 2005, to Mayer et al., which is incorporated by reference, teaches a diffuser membrane for fluid control during electrochemical processing that is adaptable to enhance injection of fluid into a thin fluid gap in accordance with the present invention.

As noted above, other approaches have also been pursued to address the terminal effect problem. One group of approaches alters the effective ionic path resistance $R_{el}$ for different current path elements (i.e., it provides a non-uniform $R_{el}$ in the radial direction) to balance the film resistance with the resistance external to the film, as discussed in U.S. Pat. Nos. 6,126,798, 6,569,299 and 6,179,983, issued to Reid et al., which are hereby incorporated by reference. Another approach includes current shielding and concentric multiple anodes. See U.S. Pat. No. 6,773,571 issued Aug. 10, 2004, to Mayer et al., and U.S. Pat. No. 6,402,923, issued Jun. 11, 2002, to Mayer et al., both of which are incorporated herein by reference for all purposes. Another approach utilizes time-averaged exposure of substrate to plating current (e.g., with a rotating wafer and a current shield element) to plate the same thickness at all locations over time. See U.S. Pat. No. 6,027,631, issued Feb. 22, 2000, to Broadbent et al., and U.S. Pat. No. 6,919,010, issued Jul. 19, 2005, to Steven T. Mayer, titled "Uniform Electroplating Of Thin Metal Seeded Wafers Using Rotationally Asymmetric Variable Anode Correction", which are incorporated herein by reference for all purposes. The use of asymmetrical shields has been used to change (tailor) plating uniformity. See U.S. Pat. No. 6,027,631, issued Feb. 22, 2000, to Broadbent, which is incorporated by reference. See United States Patent Publication No. 2004/0065540 by Mayer et al., published Apr. 8, 2004, titled "Liquid Treatment Using Thin Liquid Layer", which is incorporated herein by reference for all purposes. See also U.S. patent application Ser. No. 10/739,822, filed Dec. 17, 2003, by Steven T. Mayer et al., titled, "Method For Planar Electroplating", which is also incorporated herein by reference for all purposes. It is recognized that some embodiments in accordance with the invention include some of the teachings listed above, leading to still further improvements in electrochemical treatment.

Figure 5:
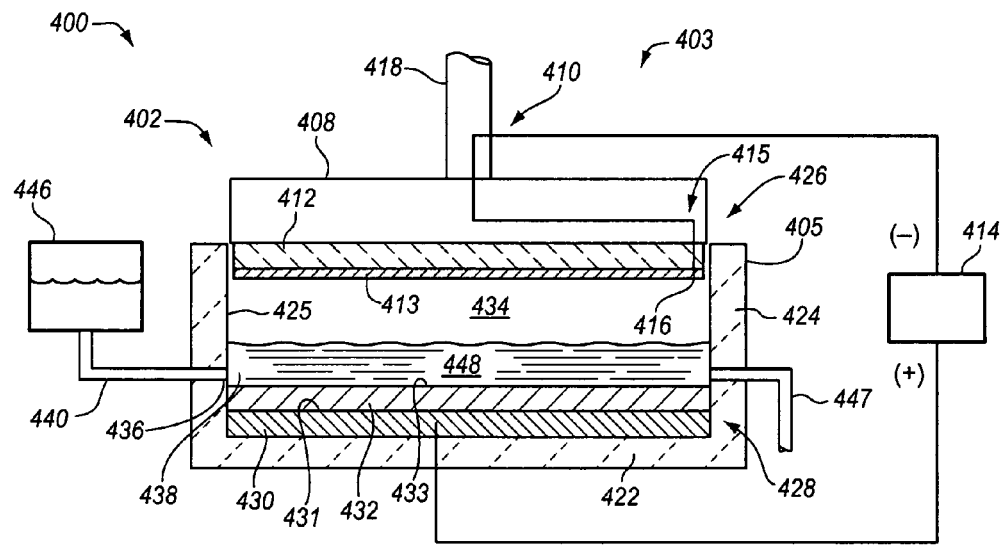
FIG. 5 depicts schematically a cross-sectional view of a small-fluid-volume microcell unit in a system for conducting electrochemical processing in accordance with the invention.

FIG. 5 depicts schematically a cross-sectional view 400 of a small-fluid-volume microcell unit 402 in a system 403 for conducting electrochemical processing in accordance with the invention. System 403 as depicted in FIG. 5 is configured for electroplating. It is understood, however, that microcell unit 402 and system 403 are operable to perform anodic dissolution processes by switching the polarity of the power supply. U.S. patent application Ser. No. 11/200,338, filed Aug. 9, 2005, by Jingbin Feng et al., titled "Small-Volume Electroless Plating Cell", which is incorporated by reference, teaches a microcell apparatus that is adaptable for electrochemical processing in accordance with the invention. Microcell unit 402 comprises a microcell container 405 and a substrate holder 408. Substrate holder 408 is operable to hold a substrate wafer 412 and is part of substrate holder assembly 410. Generally, substrate holder 408 is operable to rotate and raise and lower a substrate 412 during the various stages of electrochemical processing. Substrate holder 408 also contains an electrical substrate connector (not shown) that is operable to connect electrically the conductive surface 413 of substrate wafer 412 (shown in face-down position in FIG. 5) with a negative terminal of power supply 414. Generally, electrical substrate connector in substrate holder 408 makes electrical connection 415 at or near at least some portion of the peripheral edge 416 of surface 413 of wafer 412. As depicted in FIG. 5, surface 413 of substrate 412 comprises a thin conductive layer, for example, a seed layer. Substrate holder assembly 410 includes a rotation drive 418 that is operable to rotate substrate holder 408. Microcell container 405 comprises a bottom wall 422 and a cylindrical sidewall 424. Cylindrical sidewall 424 comprises an inside sidewall surface 425. Microcell container 405 further comprises a top opening 426. FIG. 5 depicts microcell unit 402 in a closed position in which substrate holder assembly 410 covers top opening 426. Microcell unit 402 further comprises semiconductive counter electrode assembly 428, which includes conductive electric current buss 430 having working surface 431 and semiconductive counter electrode 432 having working surface 433. Electric current buss 430 is disposed on and substantially covers bottom 422 of microcell container 405. Semiconductive counter electrode 432 is mounted on electric current buss 430 and covers current buss 430, that is, it covers working surface 431 at the top of cylindrical current buss 430. Semiconductive counter electrode 432, cylindrical sidewall 424 and top opening 426 define container space 434. Fluid injection port 436, typically located in the peripheral region 438 of container space 434, provides fluidic connection via an inlet tube 440 between a liquid source 446 and container space 434. Fluid injection port 436 is useful for injecting electroplating solution (or in the case of an anodic dissolution process, a corresponding anodic dissolution liquid) and other fluids, such as rinsing liquid and purging gas. As depicted in FIG. 5, microcell unit 402 includes fluid outlet 447 for removing fluids from container space 434. As depicted in FIG. 5, container space 434 is partially filled with electroplating solution 448. During actual electrochemical processing, substrate holder assembly 410 is disposed in a lowered, treating position, thereby forming a thin fluid gap that is filled by a corresponding thin enclosed treatment volume of electrolytic treating liquid. While semiconductive counter electrode 432 covers the working surface 431 of all electric current buss 430, bottom 422 and sidewall 424 shield the remaining surfaces of electric current buss 430 against contact with electrolytic solution 448.

Substrate holder assembly 410 generally also includes a rotary union (not shown), which accommodates conduits for vacuum and pressurized clean air or nitrogen. In some embodiments (not shown), slip rings proximate to rotation drive 418 effect electrical connection to power supply 414. Microcell system 403 generally also includes a vertical lift (not shown) that provides tailored motion profiles to mitigate splashing, bubbles and other problems typically encountered during immersion of a substrate wafer into wet chemistry. Some embodiments further comprise a tilt table (not shown) on which microcell unit 402 is mounted. In some embodiments, the sequence of immersing the wafer into the electrolyte and creating a small-gap microcell filled with electrolyte involves filling the chamber with a small amount of electrolyte from reservoir 446 though feed line 440 and entry port 436, tilting the table and wafer holder assemble (before, simultaneous with, or after inserting electrolyte), immersing the wafer into the bath and leveling the wafer and surface with the plane of the earth. See, U.S. patent application Ser. No. 11/200,338, filed Aug. 9, 2005, by Jingbin Feng et al., titled "Small-Volume Electroless Plating Cell", which is incorporated by reference.

A microcell container typically is designed to treat a substrate wafer having a particular diameter. The container space of a microcell container usually is designed to have an inside diameter about 3 cm greater than the diameter of a wafer to be treated. The container space 434 of an exemplary microcell container designed to treat a 300 mm wafer has an inside diameter of about 33 centimeters (cm) and an inside sidewall height of about 10 cm. Accordingly, the inside diameter of a sidewall 206 of an exemplary microcell container designed to treat a 300 mm wafer has an inside diameter of about 33 cm.

Figure 6:
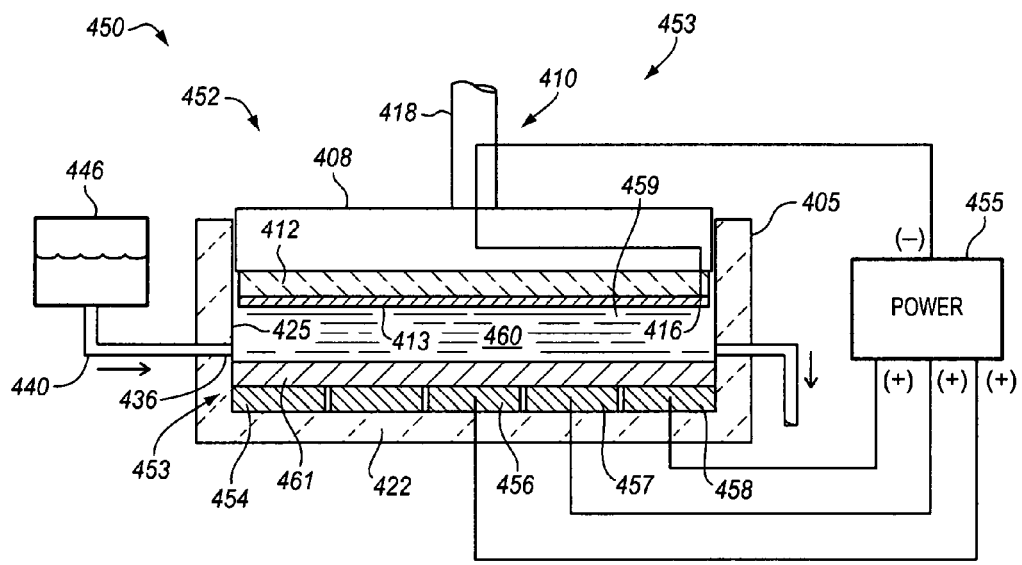
FIG. 6 depicts schematically a cross-sectional view of a small-fluid-volume microcell unit in a system for conducting electrochemical processing in accordance with the invention.

FIG. 6 depicts schematically a cross-sectional view 450 of a small-fluid-volume microcell unit 452 in a system 453 for conducting electrochemical processing in accordance with the invention. System 453 as depicted in FIG. 6 is configured for electroplating. It is understood, however, that microcell unit 452 and system 453 are operable to perform anodic dissolution processes by switching the polarity of the power supply. Microcell unit 452 and electrochemical processing system 453 are similar to microcell unit 402 and system 403, respectively, described above with reference to FIG. 5, except that semiconductive counter electrode assembly 453 comprises a segmented electric current buss 454 having three conductive segments, and system 453 includes master power supply 455 having three variable voltage terminals. Electric current buss 454 comprises three concentric segments 456, 457 and 458. Electric current buss 454 in system 453 contains three concentric segments. It is understood that some other embodiments in accordance with the invention have fewer than three or more than three concentric segments. More segments provide finer control of current distribution, but usually at the cost of increased expense and complexity of equipment. As depicted in FIG. 6, substrate holder assembly 410 is in a closed, electroplating position. Substrate holder assembly 410, substrate 412, cylindrical sidewall 425 and semiconductive counter electrode 461 define thin fluid gap 459. As depicted in FIG. 6, thin fluid gap 459 is filled with thin liquid layer 460. The voltage (e.g., measured with a reference electrode or multiple reference electrodes) or the current and power deliverable to each of the concentric segments 456, 457 and 458 of current buss 454 are variable from each other and variable during the plating operation. It is understood that the concentric segments also can be controlled to provide the same voltage or the same current density. This enables tailoring of the plating current provided by power supply 455 to thin conductive layer 413 of substrate 412. Tailoring of plating current using a segmented electric current buss complements the desirable effects of a semiconductive counter electrode in achieving uniform current distribution in accordance with the invention.

Figure 7:
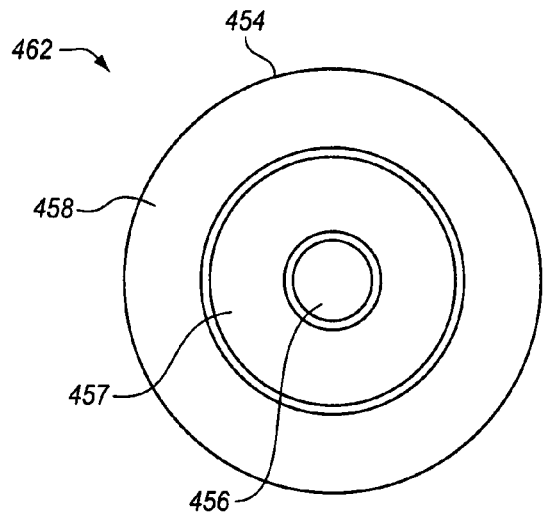
FIG. 7 depicts a cross-sectional view of segmented electric current buss in accordance with the invention.

FIG. 7 depicts a top-down sectional view 462 of three-element segmented conductive electric current buss 454. Segmented electric current buss 454 comprises cylindrical segment 456 and concentric annular segments 457 and 458. U.S. Pat. No. 6,755,954, issued Jun. 29, 2004, to Mayer et al., which is incorporated by reference, teaches the use of concentric anodes in electrochemical processing.

Figure 8:
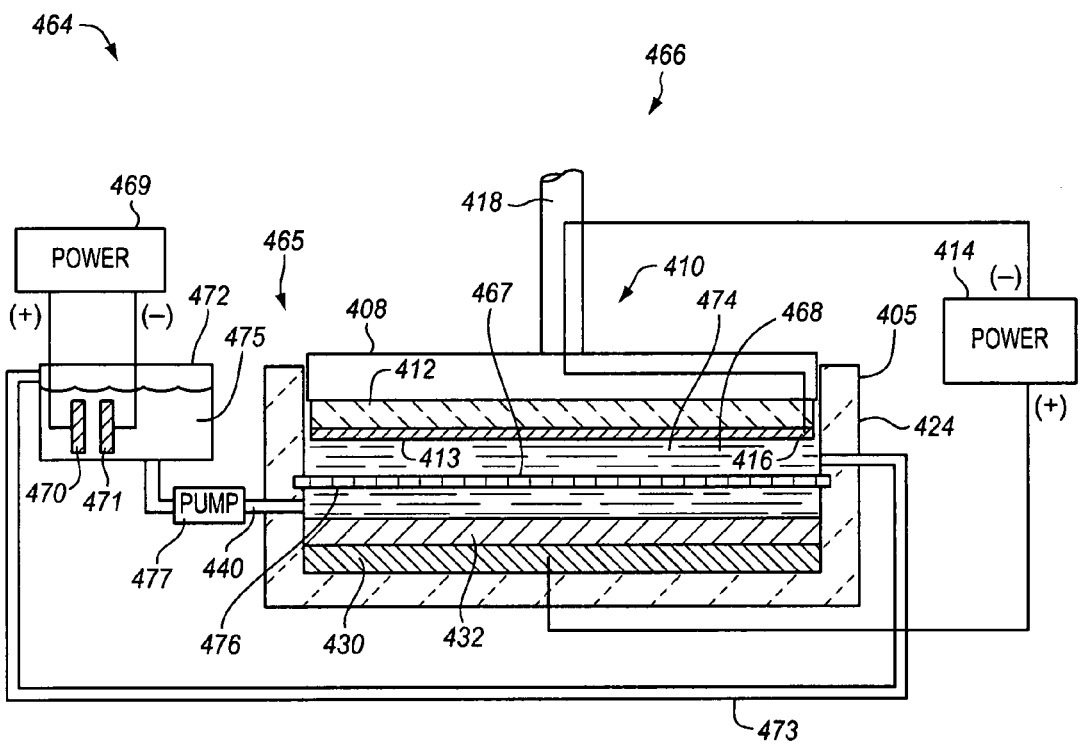
FIG. 8 depicts schematically a cross-sectional view of a small-fluid-volume microcell unit in a system for conducting electrochemical processing in accordance with the invention that includes a porous flow diffuser plate located in the thin gap, and also includes a second power supply and a pair of electrodes located in an electrolyte source tank.

FIG. 8 depicts schematically a cross-sectional view 464 of a small-fluid-volume microcell unit 465 in a system 466 for conducting electrochemical processing in accordance with the invention. As depicted in FIG. 8, substrate holder assembly 410 is in a closed, electroplating position. System 466 as depicted in FIG. 8 is configured for electroplating. It is understood, however, that microcell unit 465 and system 466 are operable to perform anodic dissolution (including operations such as electropolishing and electrochemical mechanical polishing) processes by switching the polarity of the power supply. Microcell unit 465 and electrochemical processing system 466 are similar to microcell unit 402 and system 403, respectively, described above with reference to FIG. 5, except that microcell unit 465 comprises a porous flow diffuser plate 467 located in thin gap 468 defined by substrate holder assembly 410, substrate 412, cylindrical sidewall 425 and semiconductive counter electrode 432. Examples of materials of construction of a diffuser plate in accordance with the invention include porous sintered plastic, glass and ceramic. System 466 further comprises a second power supply 469 and a pair of electrodes 470, 472 located in electrolyte source tank 472. Recycle tubing 473 is operable to transfer electrochemical processing liquid from thin liquid layer 474 in thin gap 468 back to liquid source bath 475 located in source tank 472.

When system 466 is configured for electroplating, electrode 470 comprises metal (e.g., copper) for replenishing metal in source bath 475. During electroplating, metal (e.g., copper) present in thin liquid layer 474 of electroplating solution located in thin gap 468 is consumed as metal deposits on cathodic substrate 412. When system 466 is configured for electroplating, power supply 469, metal anode 470 and cathode 471 are operable to perform anodic dissolution of metal in source bath 475 to replenish metal consumed in the electroplating reaction that occurs in microcell container 405. While not shown, anode 470 and cathode 471 may be isolated from one another by an ionic separating barrier or media such as a porous plate (sintered glass or ceramic) or a cationic polymeric membrane. Such isolation of anode 470 from cathode 471 hinders the direct redeposition of metal anodically created from metal-replenishing anode 470 onto cathode 471.

When system 466 is configured to perform anodic dissolution of metal from surface 413 of substrate wafer 412, metal accumulates in the electrochemical processing liquid. In such embodiments, power supply 469 and electrodes 470, 471 are operable to perform an electrodeposition reaction in source bath 475 to remove excess metal from the electrochemical processing liquid before it is injected into microcell container 405.

Flow diffuser plate 467 located in thin gap 468 between semiconductive counter electrode 432 and wafer holder 408 serves to enhance uniform flow of electrochemical processing liquid towards treatment surface 413 of substrate 412. In some embodiments, as depicted in FIG. 8, flow diffuser plate 467 is substantially coextensive with semiconductive counter electrode 432 and treatment surface 413 of substrate 412. During electrochemical processing, electrochemical processing liquid enters thin gap 468 through inlet tube 440 on the inlet side 476 of flow diffuser plate 467 and passes through diffuser plate towards substrate workpiece 412 in substrate holder 408. U.S. Pat. No. 6,964,792, issued Nov. 15, 2005, to Mayer et al., which is incorporated by reference, teaches a diffuser membrane for fluid control during electrochemical processing that is adaptable to serve as a flow diffuser plate that promotes uniform flow distribution of fluid into a thin gap in accordance with the present invention. In some embodiments, diffuser plate 467 is resistant to liquid flow and system 466 comprises a pump 477 disposed between electrolytes source tank 472 and inlet tube 440. Pump 477 is operable to create a positive pressure differential across flow-resistant plate 467 between liquid on the inlet side 476 of the plate and the region of thin liquid layer 474 adjacent to wafer surface 413. In some embodiments, the diffuser plate has sufficiently restrictive holes or pore sizes, pore tortuosity, and small pore fraction (percentage) that not only does it restrict mass flow or material across it, but it also inhibits flow of ionic current, thereby creating an added ionic current flow resistance and associated voltage drop across the diffuser plate. The additional resistance helps to achieve a more uniform current distribution. See, U.S. patent application Ser. No. 11/040,359, filed Jan. 20, 2005, by Mayer et al., titled "High Resistance Ionic Current Source," which is incorporated by reference.

Figure 9:
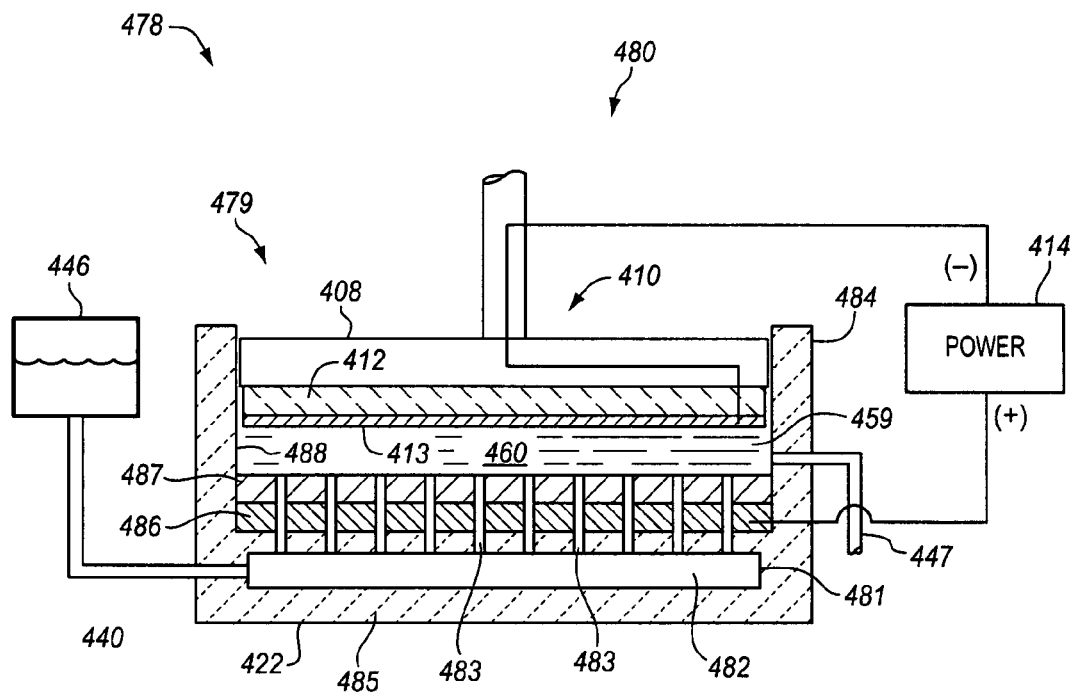
FIG. 9 depicts schematically a cross-sectional view 478 of a small-fluid-volume microcell unit in accordance with the invention microcell unit having a fluid inlet manifold.

FIG. 9 depicts schematically a cross-sectional view 478 of a small-fluid-volume microcell unit 479 in a system 480 for conducting electrochemical processing in accordance with the invention. System 480 as depicted in FIG. 9 is configured for electroplating. It is understood, however, that microcell unit 479 and system 480 are operable to perform anodic dissolution processes by switching the polarity of the power supply. Microcell unit 479 and electrochemical processing system 480 are similar to microcell unit 402 and system 403, respectively, described above with reference to FIG. 5, except that microcell unit 452 comprises a fluid inlet manifold 481 having a manifold chamber 482 and a plurality of manifold injection tubes 483. Manifold injection tubes 483 serve to conduct electrochemical processing liquid from manifold chamber 482 into microcell container 484 and to promote uniform flow distribution of liquid into gap 459. In microcell unit 479 as depicted in FIG. 9, manifold chamber 482 is located within bottom wall 485 of microcell container 484. Microcell container 484 typically is made from electrically insulating material, such as an insulating plastic. In some embodiments, microcell container 484 comprises non-insulating material, but is coated with insulating material on all surfaces that come in contact with electrochemical processing liquid during electrochemical treatment in accordance with the invention. Manifold injection tubes 483 are disposed within electrical current bus 486 and semiconductive counter electrode 487. Therefore, the inside surfaces of manifold injection tubes 483 that contact electrochemical processing liquid during electrochemical treatment are electrically insulating. In some embodiments, tubes are coated with electrically insulating material. Typically, manifold injection tubes 483 substantially consist of substantially nonporous, electrically nonconductive material that prevents electronic and ionic conduction between fluids within tubes 483 and surrounding elements, such as electric current bus 486 and semiconductive electrode 487. In alternative embodiments, the manifold chamber is otherwise disposed as in system 480. For example, in some embodiments, the manifold chamber is located within the electric current bus or the semiconductive counter electrode. In such embodiments, however, it is important that the manifold chamber be isolated electrically and fluidically from conductive and semiconductive materials.

As depicted in FIG. 9, substrate holder assembly 410 is in a lowered, electroplating position. Substrate holder assembly 410, substrate 412, cylindrical sidewall 488 and semiconductive counter electrode 487 define thin fluid gap 459. As depicted in FIG. 9, thin fluid gap 459 is filled with thin liquid layer 460.

Figure 10:
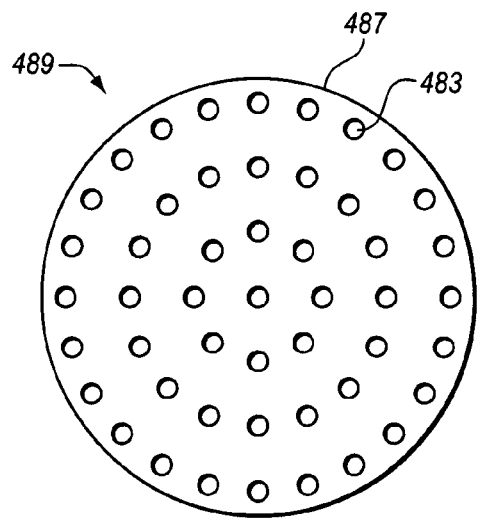
FIG. 10 depicts schematically a top-down sectional view of a semiconductive counter electrode having circular holes corresponding to manifold injection tubes.

FIG. 10 depicts schematically a top-down plan view 489 of semiconductive counter electrode 487 having circular holes corresponding to manifold injection tubes 483.

Figure 11:
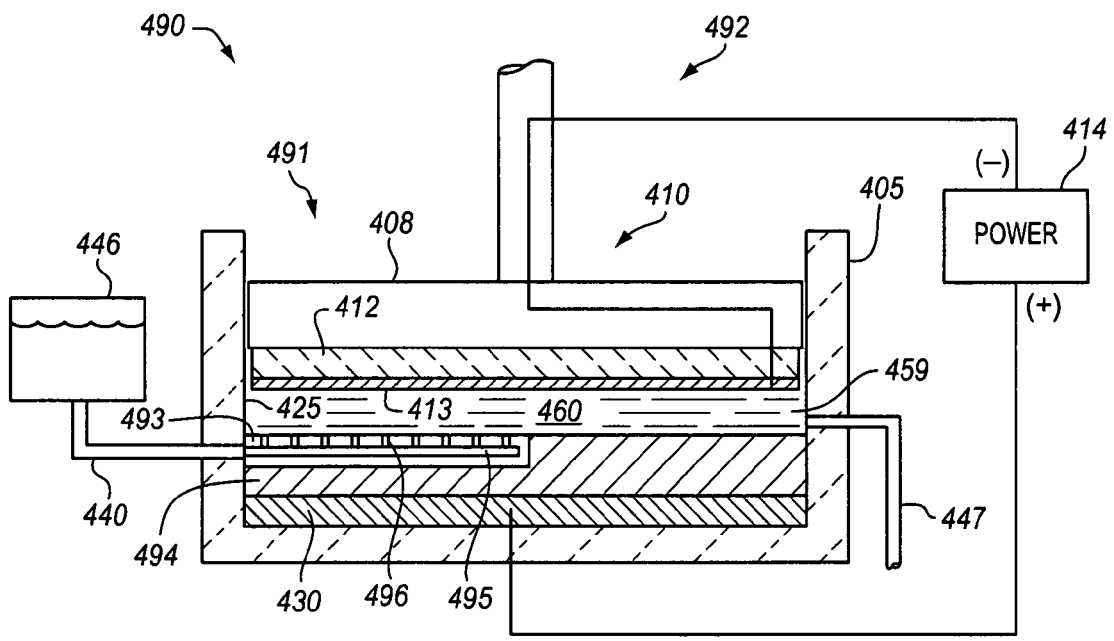
FIG. 11 depicts schematically a cross-sectional view 490 of a small-fluid-volume microcell unit in accordance with the invention that includes a fluid injection strip inlaid in the semiconductive counter electrode.

FIG. 11 depicts schematically a cross-sectional view 490 of a small-fluid-volume microcell unit 491 in a system 492 for conducting electrochemical processing in accordance with the invention. System 492 as depicted in FIG. 11 is configured for electroplating. It is understood, however, that microcell unit 491 and system 492 are operable to perform anodic dissolution processes by switching the polarity of the power supply. Microcell unit 491 and electrochemical processing system 492 are similar to microcell unit 402 and system 403, respectively, described above with reference to FIG. 5, except that microcell unit 491 comprises a fluid injection strip 493 inlaid in semiconductive counter electrode 494. Typically, fluid injection strip 493 is made from nonporous, electrically-insulating material. In some embodiments, however, fluid injection strip 493 comprises non-insulating material, but all surfaces of the injection strip that come in contact with semiconductive electrode 494 or with electrochemical processing liquid are coated with nonporous, electrically-insulating material. Fluid injection strip 493 comprises injection cavity 495 and a plurality of injection holes 496. Injection holes 496 serve to conduct electrochemical processing liquid from injection cavity 495 into thin gap 459 and to promote uniform flow distribution of liquid in thin liquid layer 460. Some embodiments in accordance with the invention comprise a plurality of fluid injection strips 493 inlaid in semiconductive counter electrode 494. Semiconductive counter electrode 494 covers working surface 431 of electric current buss 430.

Figure 12:
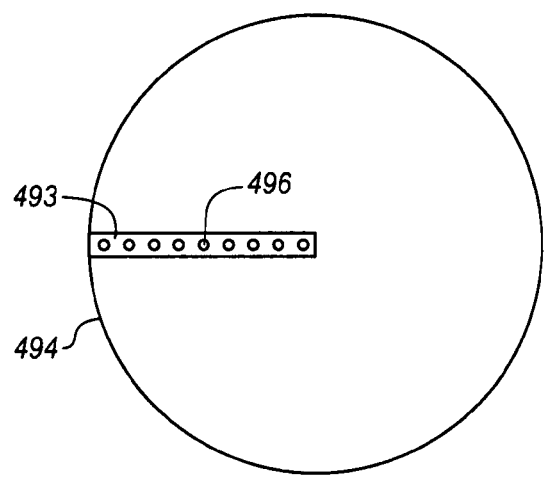
FIG. 12 depicts schematically a top-down sectional view of a semiconductive counter electrode having a fluid injection strip that contains injection holes.

FIG. 12 depicts schematically a top-down sectional view 497 of semiconductive counter electrode 494 having fluid injection strip 493, which contains injection holes 496. While the holes are shown to be all the same size, it is understood that in some embodiments the sizes of the holes are varied to modify the flow. For example, because the cross section for flow parallel to the wafer increases with radial position, more flow is obtained by having larger hole sizes nearer the edge of the semiconductor electrode.

Figure 13:
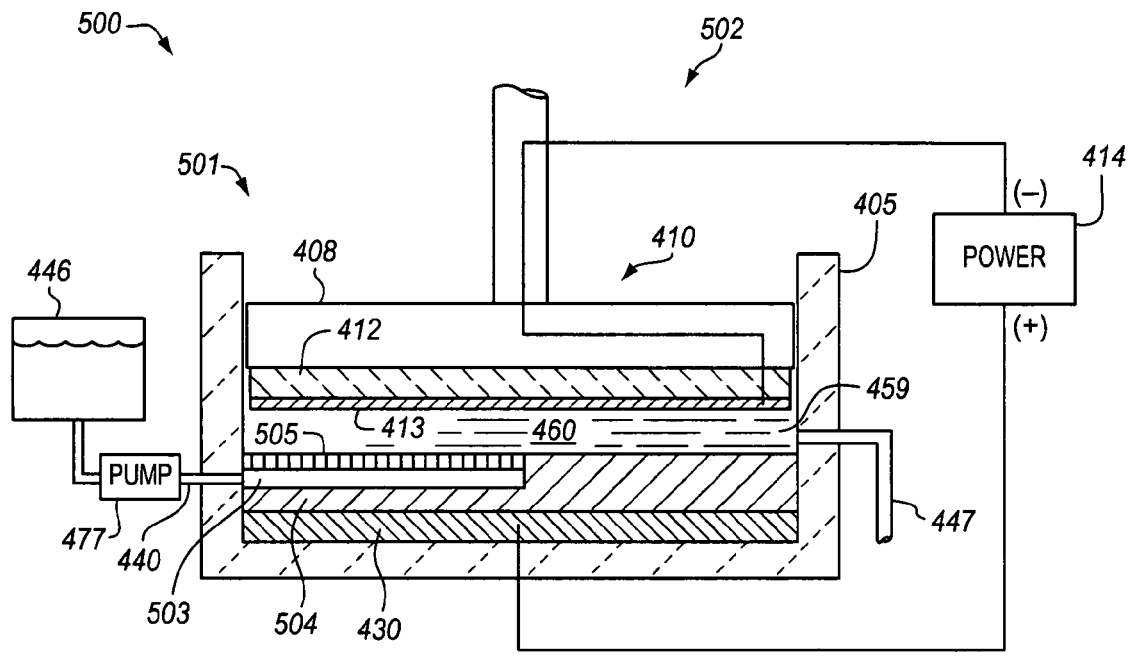
FIG. 13 depicts schematically a cross-sectional view of a small-fluid-volume microcell unit in accordance with the invention having a fluid injection channel in the semiconductive counter electrode and a diffuser plate covering the fluid injection channel.

FIG. 13 depicts schematically a cross-sectional view 500 of a small-fluid-volume microcell unit 501 in a system 502 for conducting electrochemical processing in accordance with the invention. System 502 as depicted in FIG. 13 is configured for electroplating. It is understood, however, that microcell unit 501 and system 502 are operable to perform anodic dissolution processes by switching the polarity of the power supply. Microcell unit 501 and electrochemical processing system 502 are similar to microcell unit 491 and system 492, respectively, described above with reference to FIG. 13, except that microcell unit 501 comprises a fluid injection channel 503 in semiconductive counter electrode 504 and a diffuser plate 505 covering fluid injection channel 503. Diffuser plate 505 is porous or perforated so that liquid or other fluid in fluid injection channel 503 is able to pass through diffuser plate 505 into thin fluid gap 459. Diffuser plate 505 serves to enhance uniform flow distribution of liquid towards substrate surface 413 in thin liquid layer 460. As depicted in FIG. 13, some embodiments comprise a pump 477 disposed between liquid source 446 and inlet tube 440. Pump 477 is operable to create a positive pressure differential across a diffuser plate 505 between injection channel 503 and thin liquid layer 460 in thin gap 459.

Figure 14:
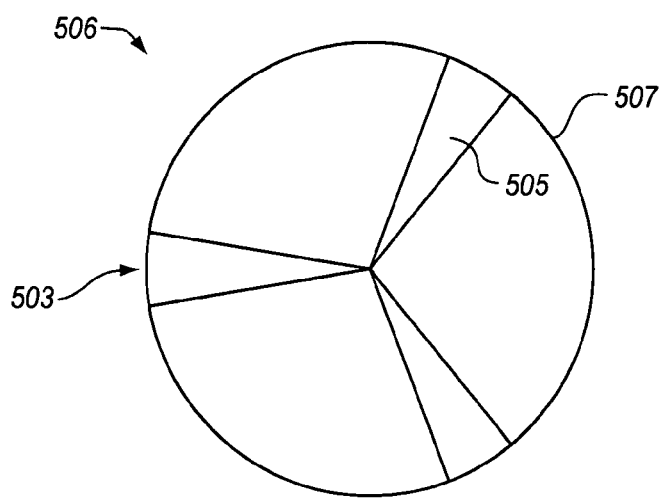
FIG. 14 depicts schematically a top-down sectional view of a semiconductive counter electrode having a plurality of fluid injection channels, each injection channel covered by a diffuser plate.

FIG. 14 depicts schematically a top-down view 506 of a semiconductive counter electrode 507 having a plurality of wedge-shaped fluid injection channels 503, each injection channel covered by a diffuser plate 505.

Figure 15:
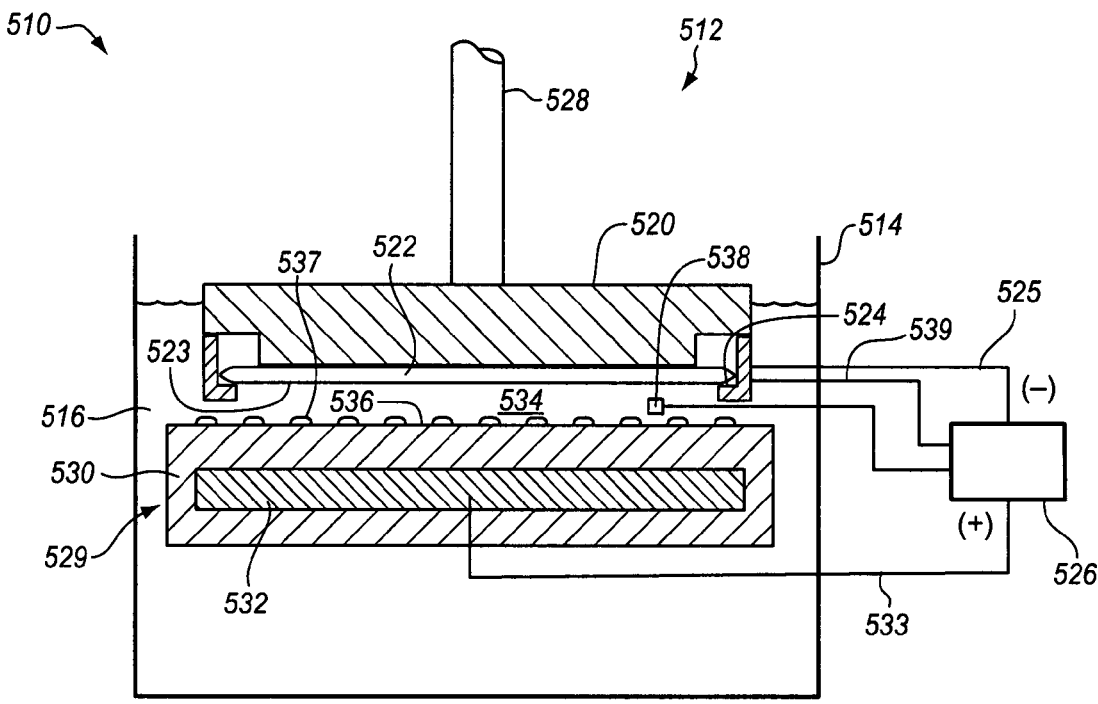
FIG. 15 depicts schematically a cross-sectional view of an apparatus in accordance with the invention for conducting electrochemical processing.

FIG. 15 depicts schematically a cross-sectional view 510 of an apparatus 512 in accordance with the invention for conducting electrochemical processing. As depicted in FIG. 15, apparatus 512 is configured to perform electroplating. Apparatus 512 is also operable to perform anodic dissolution of metal from a substrate by switching the polarity of the power supply. Apparatus 512 comprises treatment bath container 514 for holding a liquid electrochemical treating bath 516. Apparatus 512 further comprises clamshell-type substrate holder 520 for holding a substrate wafer 522. Generally, substrate holder 520 is operable to rotate a substrate 522 during electrochemical processing. Apparatus 512 is useful to perform electrochemical processing (e.g., electroplating or anodic dissolution) of a thin conductive layer (not shown) on surface 523 of substrate. 522. Substrate holder 520 includes an electrical substrate connector (not shown) that is operable to connect the peripheral edge 524 of the electrically conductive layer on substrate 522 with a negative terminal (for electroplating) of power supply 526 via power lead 525. For the sake of clarity, negative lead 525 from power supply 526 is shown connected to the peripheral edge of substrate holder 520. In actual physical embodiments, electrical connection of substrate holder 520 to power supply 526 generally is effected through shaft 528 of substrate holder 520. Apparatus 512 further comprises semiconductive counter electrode assembly 529, which includes semiconductive counter electrode 530 and conductive electric current buss 532 in accordance with the invention. Electric current buss 532 is substantially completely covered by semiconductive counter electrode 530 and is in direct electrical contact with semiconductive counter electrode 530. Electric current buss 532 is connected to power supply 526 through power lead 533. During electrochemical treatment, substrate 522 in substrate holder 520 and semiconductive counter electrode assembly 529 are immersed in electrochemical treatment bath 516. Substrate holder 520 and semiconductive electrode assembly 529 are operable to form a thin liquid layer 534 of electrochemical treatment solution (e.g., electroplating liquid) between substrate surface 523 and semiconductive counter electrode surface 536. In some embodiments, a catalytic coating 537 (depicted here in the form of separate catalyst islands) is located on surface 536 of semiconductive counter electrode 530 to facilitate electrochemical oxidation or reduction reactions. In some embodiments, semiconductive counter electrode assembly 529 is fixed in a stationary position in container 514, and only substrate holder 520 is movable. In some embodiments, semiconductive counter electrode assembly 529 is movable, and substrate holder 520 is fixed in a stationary position in container 514. In other embodiments, both substrate holder 520 and counter electrode assembly 529 are movable. As depicted in FIG. 15, apparatus 512 comprises a "four-wire" system that includes, in addition to anode (positive) lead 533 and cathode (negative) lead 525 from power source 526: a reference electrode 538 connected to power supply 526; and a substrate sense contact lead 539 from power supply 526 for connection to a substrate sense contact finger (not shown) in substrate holder 520. Co-owned and co-pending U.S. patent application Ser. No. 10/365,577, filed Feb. 11, 2003, by Mayer et al., and titled "Method And Apparatus For Potential Controlled Electroplating Of Fine Patterns On Semiconductor Wafers", which is incorporated by reference as if fully contained herein, teaches systems and methods for electroplating using a reference electrode and a substrate sense contact finger.

Substrate sense contact lead 539 does not carry appreciable current. The function of substrate sense contact lead 539 is to sense the voltage at one or more points directly on substrate wafer 522, rather than rely on voltage determined at the power supply (as is done in conventional potentiodynamic electroplating). The use of such a lead making direct contact with surface 523 of wafer 522 is important in making accurate potential measurements; for example, such data are useful for operations such as: detecting the point or time of wafer entry; controlling the voltage during the transition from the time when a portion of the wafer first touches the wafer to when the wafer is completely immersed; and endpoint detection and control. Substrate sense contact lead 539 is not subject to appreciable voltage drop between the contact point on surface 523 of wafer 522 and the control measurement point of an operational amplifier that is responsible for control of the potential in potentiodynamic electroplating system 512. Reference electrode 538 measures the potential of the electrolyte solution with respect to surface 523 of substrate wafer 522, and also does not carry appreciable current. The potential measured by reference electrode 538 differs from the potential measured by substrate sense contact lead 539 due to: the concentration difference of metal in contact with the workpiece surface and the reference electrode (concentration effects); the charge-transfer potential drop across the surface of wafer 522; and the ohmic voltage drop in solution between wafer surface 523 and the location of reference probe 538 due to the flow of current in the electrolyte. Reference electrode 538 is positioned in the electrolyte of thin liquid layer 534 as close as practical to the working electrode, that is, to substrate 522.

Figure 16:
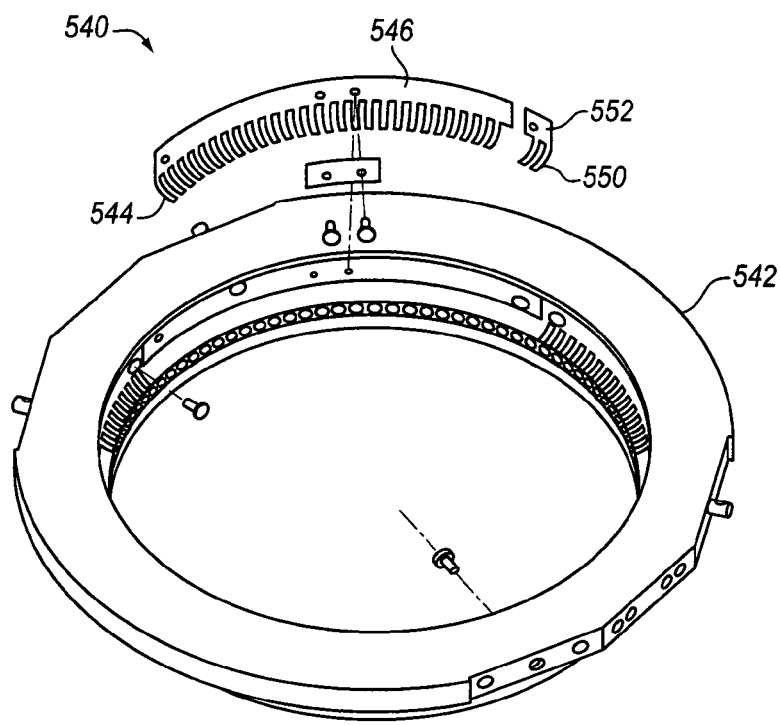
FIG. 16 depicts schematically a perspective view of some essential components of a clamshell-type wafer holder suitable for use in a four-wire system in accordance with the invention.

FIG. 16 depicts schematically a perspective view 540 of some essential components of a clamshell-type wafer holder 542 suitable for use in a four-wire system 512. Clamshell wafer holder 542 comprises contact fingers 544, which serve as electrical substrate connectors and are electrically connected to power supply 526 through power lead 525. Contact fingers 544 are typically grouped in quadrants 546. For example, for electroplating (or other electrochemical treatment) of a 200 mm wafer, 128 contact fingers may be grouped in four quadrants of 32 contact fingers each. When wafer 522 is inserted in clamshell 542 from above, contact fingers 544 contact the peripheral edge of the wafer, which turns substrate wafer 522 into the working electrode. Clamshell wafer holder 542 further comprises one or more electrically isolated substrate sense contact fingers 550, which also contact the peripheral edge of wafer 522. Substrate sense contact fingers 550 are electrically connected to substrate sense contact lead 539 of system 512. Some embodiments include additional substrate sense contact fingers, preferably placed at 90° or 180° from the primary substrate sense contact finger. Typically, one to four contact fingers are utilized at any one general location at the substrate periphery. At a particular general location of the substrate periphery, a plurality 552 of contact fingers typically span from about 5° to about 10° of a substrate wafer periphery. U.S. Pat. No. 6,755,946, issued Jun. 29, 2004, to Patton et al., which is hereby incorporated by reference, teaches a clamshell substrate holder having a plurality of electrical contact fingers.

Figure 17:
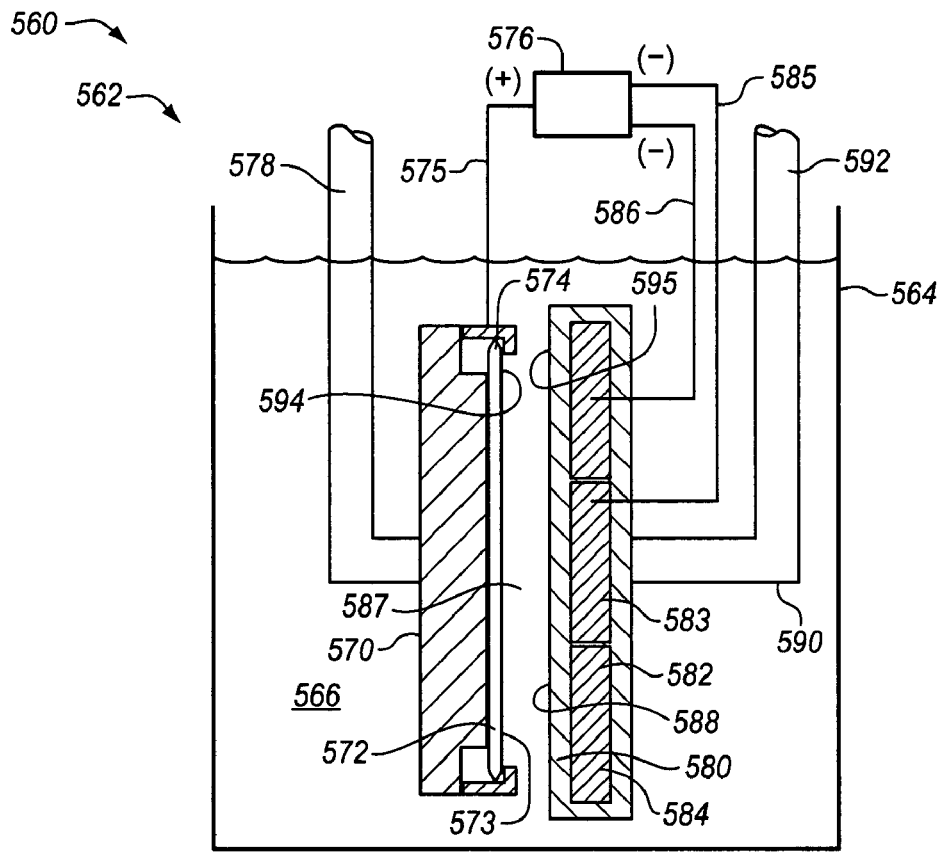
FIG. 17 depicts schematically a cross-sectional view of an apparatus in accordance with the invention for conducting electrochemical processing.

FIG. 17 depicts schematically a cross-sectional view 560 of an apparatus 562 in accordance with the invention for conducting electrochemical processing. As depicted in FIG. 17, apparatus 562 is configured to perform anodic dissolution and removal of metal from a substrate, for example, electroetching and electropolishing. Apparatus 562 is also operable to perform electroplating of metal by switching the polarity of the power supply. Apparatus 562 comprises treatment bath container 564 for holding a liquid electrochemical treating bath 566. Apparatus 562 further comprises clamshell-type substrate holder 570 for holding a substrate wafer 572. Apparatus 562 is useful to perform electrochemical processing (e.g., electroplating or anodic dissolution) of a thin conductive layer (not shown) on surface 573 of substrate 572. Substrate holder 570 is operable to connect a peripheral edge 574 of the electrically conductive layer on substrate 572 with a terminal (positive for anodic dissolution) of power supply 576 via power lead 575. For the sake of clarity, power lead 575 from power supply 576 is shown connected to the peripheral edge of substrate holder 570. In actual physical embodiments, electrical connection of substrate holder 570 to power supply 576 generally is effected through shaft 578 of substrate holder 570. Apparatus 562 further comprises semiconductive counter electrode 580 in accordance with the invention. Apparatus 562 further comprises segmented electric current buss 582, which is substantially completely covered by semiconductive counter electrode 580 and is in direct electrical contact with semiconductive counter electrode 580. Electric current buss 582 comprises cylindrical buss segment 583 and annular segment 584. Cylindrical buss segment 583 is connected to power supply 576 through power lead 585, and annular bus segment 584 is connected to power supply 576 through power lead 586. During electrochemical treatment, substrate 572 in substrate holder 570 and cylindrical semiconductive counter electrode 580 are immersed in electrochemical treatment bath 566. Generally, substrate holder 570 is operable to rotate a substrate 572 during electrochemical processing. Substrate holder 570 and semiconductive electrode 580 are operable to form a thin liquid layer 587 of electrochemical treatment solution (e.g., electroetching liquid) between substrate surface 573 and semiconductive counter electrode surface 588. In apparatus 562, both substrate holder 570 and semiconductive counter electrode 580 are movable into and out of bath container 564. As depicted in FIG. 17, semiconductive counter electrode assembly 590 is movable in and out of electrochemical treatment bath 566 through vertical translation of electrode assembly shaft 592. Especially in embodiments performing anodic dissolution of metal from a substrate surface 573, removal of semiconductive electrode 580 from bath container 564 is desirable for removing metal deposits from semiconductive electrode 580. When apparatus 562 is used to remove metal from a substrate surface through electropolishing, electroetching or other anodic dissolution process, a continuous metal film electroplates onto semiconductive electrode 580. Gradually, the presence of the metal film on semiconductive electrode 580 shunts out the desired effect of the semiconductive electrode. If the specific sheet resistivity of the semiconductive counter electrode with a deposited metal film on it were to fall below the resistivity of a thin conductive (metal) layer on substrate surface 573, then current would begin to flow primarily from the peripheral region 594 of substrate surface 573 to the deposited metal film in peripheral region 595 of semiconductive counter electrode 580. Then, from the peripheral region 595 of semiconductive electrode 580, current would be distributed uniformly through the deposited metal film into semiconductive counter electrode 580, and then into conductive electric current buss 582. In some embodiments, this potential problem is addressed by periodically removing semiconductive counter electrode 580 from container 564 and removing the metal film. In some embodiments, deposited metal is removed from semiconductive counterelectrode 580 using chemical techniques. In some embodiments, deposited metal is removed from semiconductive counterelectrode 580 by switching the polarity of power leads to electric current buss 582 and then using electrochemical techniques; such as, by depositing the metal located on the semiconductor electrode surface to a third, auxiliary electrode (not shown).

Figure 18:
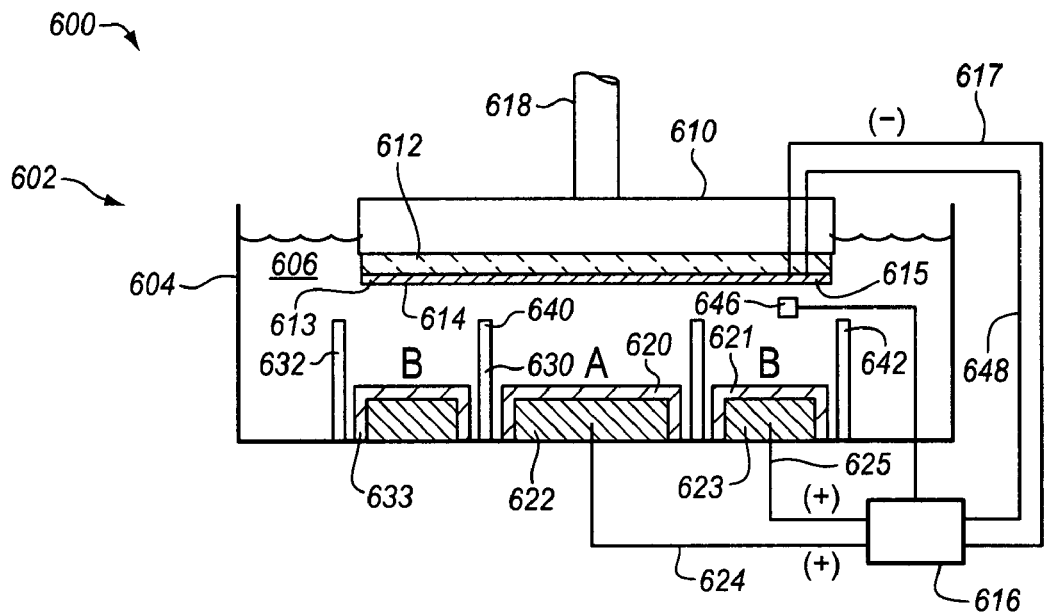
FIG. 18 depicts schematically a cross-sectional view of an apparatus in accordance with the invention for conducting electrochemical processing using a virtual anode.

FIG. 18 depicts schematically a cross-sectional view 600 of an apparatus 602 in accordance with the invention for conducting electrochemical processing. Apparatus 602 is useful to perform electrochemical processing (e.g., electroplating or anodic dissolution) of a thin conductive layer (e.g., a metal seed layer) on the surface of a substrate wafer. As depicted in FIG. 18, apparatus 602 is configured to perform electroplating of metal onto a seed layer on the substrate surface. Apparatus 602 is also operable to perform anodic dissolution of metal from a substrate by switching the polarity of the power supply. Configured to perform electroplating as depicted in FIG. 18, apparatus 602 comprises multiple segmented semiconductive counter electrodes and high-resistance virtual anodes (counter electrodes). U.S. Pat. No. 6,773,571, issued Aug. 10, 2004, to Mayer et al., which is hereby incorporated by reference, teaches methods and apparatuses for electroplating metal on a seed layer using multiple segmented virtual anode sources. Apparatus 602 comprises treatment bath container 604 for holding a liquid electrochemical treating bath 606 (e.g., an electroplating solution containing copper ions). Apparatus 602 further comprises substrate holder 610 for holding a substrate wafer 612. As depicted FIG. 18, substrate wafer 612 has a metal seed layer 613 at its surface 614. Substrate holder 610 is operable to connect the peripheral edge 615 of electrically conductive seed layer 613 on substrate 612 with a negative terminal (for electroplating) of power supply 616 via power lead 617. For the sake of clarity, power lead 617 from power supply 616 is shown connected to the peripheral edge of substrate holder 610. In actual physical embodiments, electrical connection of substrate holder 610 to power supply 616 typically is effected through shaft 618 of substrate holder 610. Apparatus 602 further comprises semiconductive counter electrodes 620, 621 in accordance with the invention. Apparatus 602 further comprises conductive electric current busses 622, 623, which are covered by semiconductive counter electrodes 620, 621, respectively, and are in direct electrical contact with semiconductive counter electrodes 620, 621, respectively. Electric current busses 622, 623 are connected to power supply 616 through power leads 624, 625. Power source 616 is operable to distribute plating current variably to each of electric current busses 622, 623. During electrochemical treatment, substrate 612 in substrate holder 610 and semiconductive counter electrodes 620, 621 are immersed in electrochemical treatment bath 606. Generally, substrate holder 610 is operable to rotate a substrate 612 during electrochemical processing. In some embodiments, the power circuit employs diodes (not shown) to enhance unidirectional current flow and minimize cross-communication in the plating cell between current buss 622 and current buss 623. Apparatus 602 further comprises focusing cylinders 630 and 632. Inner focusing cylinder 630 is located between cylindrical semiconductive counter electrode 620 and annular semiconductive counter electrode 621. Outer focusing cylinder 632 is located just beyond the outer radial edge 633 of annular semiconductive counterelectrode 621. Focusing elements such as focusing cylinders 630, 632 are useful to shape current density in the electrolyte of plating bath 606. The "virtual anodes" created by such focusing elements are "virtual" current sources, in this case at the cylinder opening, which are mathematically and physically similar to the situation of having an actual anode located at the virtual anode locations. Therefore, the benefits of having an electrode at a particular location are obtained without having to actually position the electrode there. Preferably, focusing elements are constructed, at least in part, with electrically insulating materials. Examples of preferred insulating materials include plastic, nanoporous ceramic, and glass. Inner focusing cylinder 630 is used to focus current in electrolyte bath 606 arising from closure of the plating cell circuit between the cathode (seed layer 613) and inner semiconductive counter electrode 620 in Region A of bath 606. Region A is a cylindrical region spanning the distance between the work surface of semiconductive counter electrode source 620 and seed layer 613. The inner diameter of the topmost portion 640 of inner focusing cylinder 630 defines the area of a circular opening that is the virtual anode for semiconductive counter-electrode 620. Preferably, the inner focusing cylinder has an inner diameter at its topmost portion (aperture) of between about 4 and 5.4 inches for a 300 mm wafer, more preferably between about 4.1 and 5 inches. Wafer holder 610 is operable to position substrate wafer 612 into close proximity to the topmost portion 640 of inner focusing cylinder 630. Generally, the topmost portion 640 of inner focusing cylinder 630 and wafer 612 are disposed so that the width of the gap separating semiconductive counter electrodes 620, 621 from surface 614 of wafer 612 is less than 20 percent of the largest dimension of wafer 612. Preferably, the spacing is less than 10 percent of the wafer's largest dimension, and more preferably, less than 1 percent. Thus, in the case of a round wafer substrate 612 having a diameter of 300 mm, the spacing between semiconductive counter electrodes 620, 621 and the wafer surface generally is less than 60 mm, preferably less than 30 mm, and more preferably less than 3 mm.

Outer focusing cylinder 632 is used (in conjunction with focusing cylinder 630) to focus current in electrolyte 606 arising from closure of the cell circuit between the cathode (seed layer 613) and outer semiconductive counter electrode 621 in Region B of bath 606. Region B is an annular region spanning the distance between the working surface of outer semiconductive counter electrode 621 and surface 614 of substrate 612. The inner diameter of the topmost portion 642 of outer focusing cylinder 632 and the outer diameter of inner focusing cylinder 630 define the area of an annular opening that is the virtual anode for semiconductive counter electrode 621. Preferably, outer focusing cylinder 632 has an inner diameter at topmost portion 642 (aperture) that approximates the diameter of the wafer being plated. As depicted in FIG. 18, inner focusing cylinder 630 and outer focusing cylinder 632 have approximately the same height. In some embodiments, a plurality of focusing cylinders have different heights. In embodiments in which focusing cylinders are used, generally the current is distributed among a plurality of anodes as a function of the desired current density to pass through their corresponding virtual anodes.

As depicted in FIG. 18, apparatus 602 further comprises a reference electrode 646 connected to power supply 616; and a substrate sense contact lead 648 from power supply 616 for connection to a substrate sense contact finger (not shown) in substrate holder 610. Co-owned and co-pending U.S. patent application Ser. No. 10/365,577, filed Feb. 11, 2003, by Mayer et al., and titled "Method And Apparatus For Potential Controlled Electroplating Of Fine Patterns On Semiconductor Wafers", which is incorporated by reference, teaches systems and methods for electroplating using a reference electrode and a substrate sense contact finger.

A multi-segmented virtual anode allows for compensation of potential drop in the film by shaping a corresponding (but inverse) potential drop in the electrolyte, thereby achieving a uniform (or tailored, if desired) current distribution. The device is characterized by its ease of operation (electrically controlled modulation rather than mechanically controlled), relatively low cost, and its compact design (compared to complicated iris or moving shields).

Figure 19:
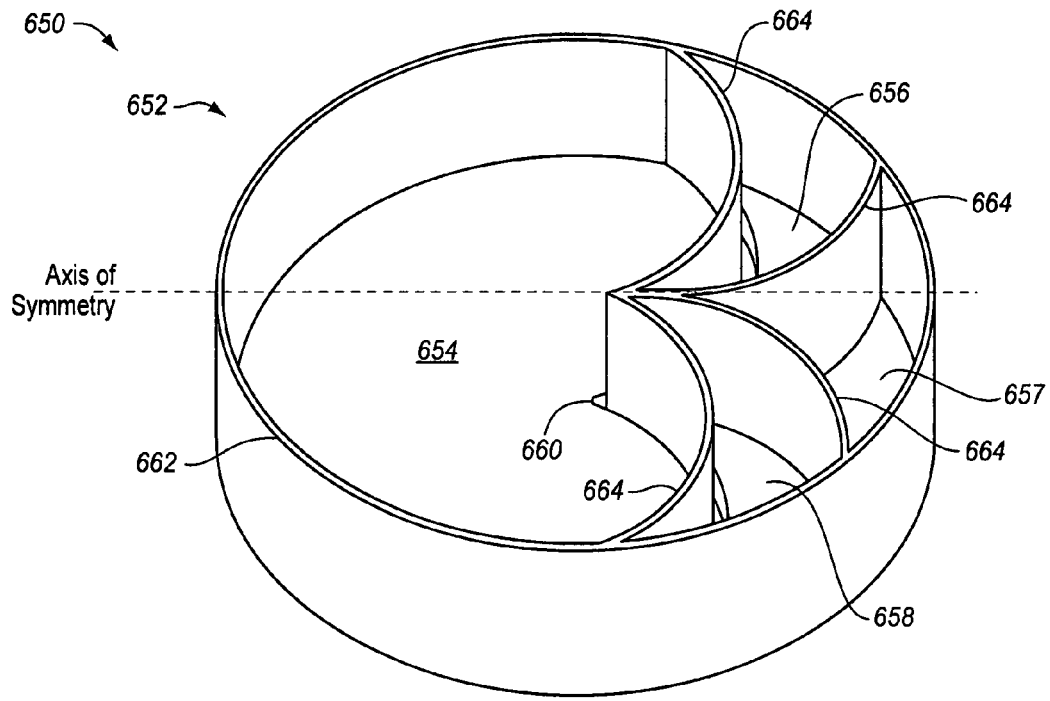
FIG. 19 depicts schematically in perspective view the design of a rotationally asymmetric anode in accordance with the invention.
Figure 20:
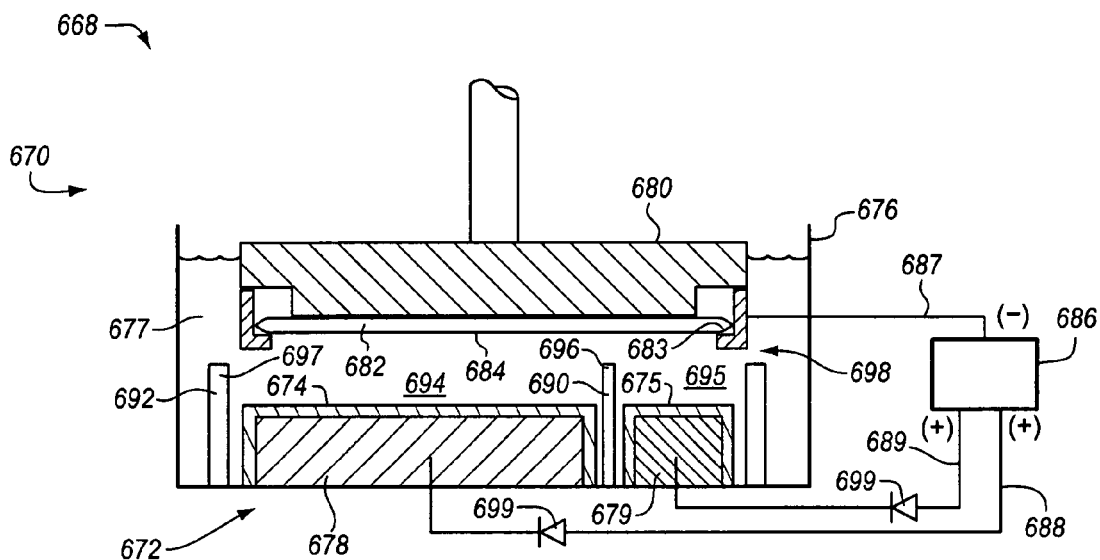
FIG. 20 depicts schematically a cross-sectional view of a plating cell that includes an azimuthally asymmetric semiconductive anode assembly having a primary semiconductive anode segment and one or more secondary semiconductive anode segments.

Embodiments in accordance with the invention that include rotationally asymmetric variable semiconductive counter electrode correction are described herein with reference to FIGS. 19 and 20. U.S. Pat. No. 6,919,010, issued Jul. 19, 2005, to Mayer et al., which is hereby incorporated by reference, teaches electroplating of thin metal seeded wafers using rotationally asymmetric variable anode correction (RAVAC). A rotationally asymmetric semiconductive counter electrode is also referred to as an azimuthally asymmetric semiconductive counter electrode. The design of a rotationally asymmetric anode is depicted schematically in perspective view 650 in FIG. 19. In this design in accordance with the present invention, semiconductive anode assembly 652 includes a primary azimuthally asymmetric semiconductive anode 654 and multiple secondary semiconductive anode segments 656, 657, 658. During electroplating, a wafer substrate (workpiece) (not shown) is disposed above semiconductive anode assembly 652 and rotates about an axis substantially aligned with a center axis 660 of anode assembly 652. In a typical embodiment, the footprint of the substrate wafer corresponds (at least roughly) to the perimeter of semiconductive anode assembly 652.

Initially, to provide a large fraction of ionic current to the central region of the wafer substrate (proximate the rotational axis), only asymmetric semiconductive anode 654 is energized and provides current. The regions of assembly 652 occupied by segments 656, 657, and 658 do not provide any significant current during this initial phase of the plating process when the terminal effect is most severe. At any given instant in time, a relatively large section of the wafer substrate periphery is not located above semiconductive anode 654 (or otherwise aligned with anode 654). Of course, as the wafer substrate rotates, any given point on its periphery comes over the region of semiconductive anode 654 and then passes beyond it. Because a relatively large segment of the wafer substrate periphery is out of "contact" with semiconductive anode 654 at any instant in time, while much more of the central regions remains in "contact", the driving force for plating from semiconductive anode 654 is non-uniformly distributed over the radius of the wafer substrate. This compensates for the terminal effect. As the plated layer grows, and the terminal effect decreases, the other anode segments 656, 657, 658 are turned on gradually.

Azimuthally asymmetric semiconductive anode assembly 652 is shaped to yield a particular time-of-exposure correction to the current distribution. As depicted in the example of FIG. 19, a portion of semiconductive anode segment 654 is generally circular, having a constant radius from center point 660. This is the left side of the anode as shown in FIG. 19. In anode assembly 652, the region of constant radius occupies nearly 180 degrees of the overall anode assembly. Beyond this region, the radius gradually decreases toward an angular position where the radius becomes zero. That is, there are no abrupt changes in radial value as one moves azimuthally. In the example at hand, this produces the heart shaped structure of semiconductive anode segment 654 shown in FIG. 19. With this design, the outer radius of the workpiece lies above asymmetric semiconductive anode segment 654 during only one-half the period of rotation. More centrally located regions of the workpiece lie above asymmetric semiconductive anode segment 654 for progressively longer periods of time.

As shown in FIG. 19, semiconductive anode assembly 652 is contained within a vertically extending anode chamber wall 662. In addition, the individual anode segments (including asymmetric semiconductive anode segment 654) are isolated from one another by vertically extending anode isolator walls 664. This structure provides closed isolator walls around the individual semiconductive anode segments of assembly 652. Each semiconductive anode segment is electrically isolated from the others, and the ionic current associated with a semiconductive anode segment is confined within the closed isolator wall until reaching the top of the wall. This allows each semiconductive anode segment to be located relatively distant from the substrate, creating a "virtual anode" (which is much closer to the substrate) and isolating the individual anodes and limiting their interactions. An azimuthally (or rotationally) asymmetric semiconductive counter electrode in accordance with the invention is also operable for use as a semiconductive cathode during anodic dissolution.

FIG. 20 depicts schematically a cross-sectional view 668 of a plating cell 670 that includes an azimuthally asymmetric semiconductive anode assembly 672 having primary semiconductive anode segment 674 and one or more secondary semiconductive anode segments 675. Plating cell 670 comprises plating vessel 676 for containing plating bath 677. Semiconductive anode segment 674 is mounted on and covers a primary conductive electric current buss 678, which is located in plating vessel 676. Similarly, semiconductive anode segment 675 is mounted on and covers secondary conductive electric current buss 679. Plating cell 670 further comprises a wafer holder 680 for holding a substrate wafer 682. Substrate wafer holder 680 is operable to rotate a substrate 682 during electrochemical processing. Wafer holder 680 is operable to connect electrically a peripheral edge 683 of surface 684 of wafer 682 with the negative terminal of power supply 686 via power lead 687. A power lead 688 connects a positive terminal of variable power supply 686 with primary electric current buss 678, and one or more power leads 689 connects variable power supply 686 with secondary electric current buss(es) 679. In one embodiment, the work surface of the primary asymmetric anode has a surface area that corresponds to about from 60 to 95 percent of the platable surface area of a substrate 682 in wafer holder 680. Preferably, the work surface of the one or more secondary semiconductive anodes 675 has a surface area that corresponds to between about 5 and 40 percent of the platable surface area of the wafer to be plated.

In plating cell 670, semiconductive anode segments are 674 and 675 are positioned in the bottom of vessel 676 such that there is sufficient space for vertical focusing element wall(s) 690 and an anode chamber wall 692. Anode chamber wall 692 defines a partially closed region for at least some of the focusing elements 690 of anode segments in anode assembly 672. A focusing element for primary asymmetric semiconductive anode 674 is used to focus current in electrolytic plating bath 677. Region 694 is an asymmetric space spanning the distance between the work surface of semiconductive anode segment 674 and substrate surface 684. Region 695 is a similar asymmetric space associated with secondary semiconductive anode segment 675.

As depicted in FIG. 20, a "virtual anode" associated with primary asymmetric semiconductive anode segment 674 is located near the top of region 694, at the tops 696, 697 of insulator wall 690 and anode chamber wall 697, respectively. Similarly, a "virtual anode" associated with secondary asymmetric semiconductive anode segment 675 is located near the top of region 695, at the tops 696, 697 of insulator wall 690 and anode chamber wall 697, respectively. Preferably, the work surface areas of the virtual anodes of the invention are aligned to the work surface of the conductive layer of substrate surface 684 on which metal is deposited to provide a relatively direct current path between the anode and the substrate surface. In practice, this means that the rotational axes or center points of anode assembly 672 and workpiece substrate 682 are substantially aligned and the planes defined by these electrodes are substantially parallel. Further, the outer perimeters and areas of these electrodes (e.g., as traced during a single rotation) are preferably substantially similar. As indicated above, in accordance with the invention, a relatively highly resistive thin liquid layer 698 is located between substrate surface 684 and any actual or virtual anodes. Generally, the topmost portions 696, 697 of insulator wall 690 and anode chamber wall 697, respectively, are disposed so that the width of the gap separating semiconductive counter electrode segments 674, 675 from surface 684 of wafer 682 is less than 20 percent of the largest dimension of wafer 682. Preferably, the spacing is less than 10 percent of the wafer's largest dimension, and more preferably, less than 1 percent. Thus, in the case of a round wafer substrate 682 having a diameter of 300 mm, the spacing between semiconductive counter electrode segments 674, 675 and the wafer surface generally is less than 60 mm, preferably less than 30 mm, and more preferably less than 3 mm. In some embodiments, plating cell 670 employs diodes 699 to enhance unidirectional current flow and minimize cross-communication between semiconductive counter electrode 674 and semiconductive counter electrode 675.

As mentioned, another compensation mechanism for the terminal effect employs a shield (or iris). It has been found that an iris acts in a generally similar fashion to the concentric anode design, but with a little less center current, a larger current excursion up to the iris edge, and then relatively little current at all flowing over most of the iris shielded area right up the wafer edge. For example, U.S. Pat. No. 6,773,571 issued Aug. 10, 2004, to Mayer et al., and U.S. Pat. No. 6,402,923, issued Jun. 11, 2002, to Mayer et al., both of which are incorporated by reference, teach methods and apparatuses for conducting electrochemical processes using shields.

Figure 21:
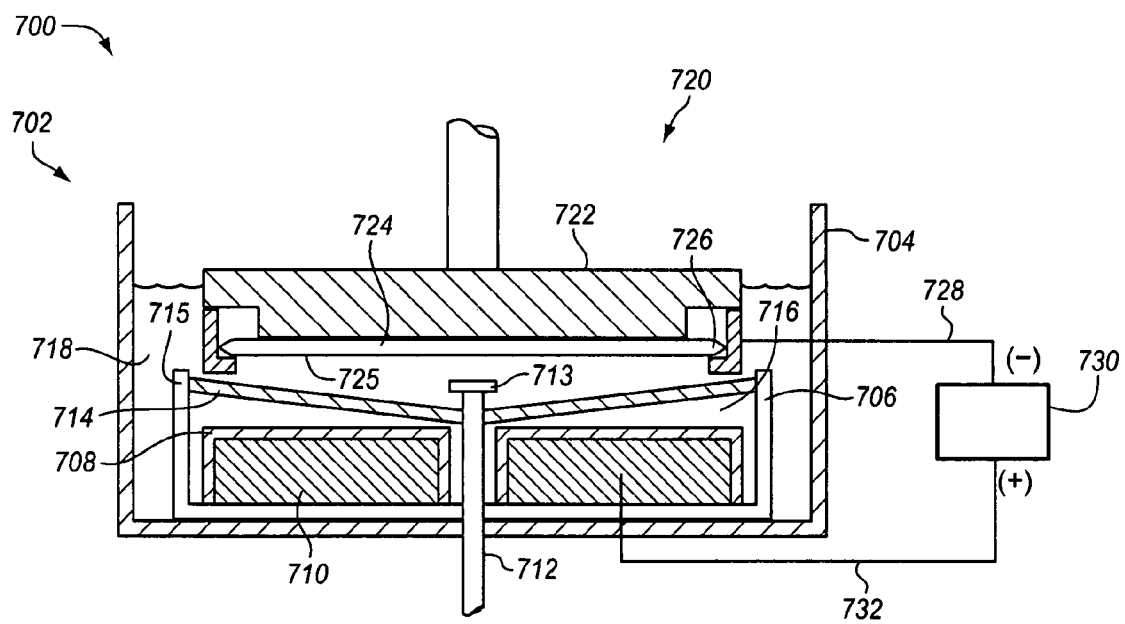
FIG. 21 depicts schematically cross-sectional view of an electrochemical processing apparatus having a semiconductive counter electrode in accordance with the invention and also having two separate electrode compartments separated by a transport barrier.

FIG. 21 depicts schematically a cross-sectional view 700 of electrochemical processing apparatus 702 having a semiconductive counter electrode in accordance with the invention and also having two separate electrode compartments separated by a transport barrier. Electrochemical processing apparatus 702 is described herein with reference to electroplating techniques. Electrochemical processing apparatus 702 is also operable to perform anodic dissolution processes, such as electroetching and electropolishing, by changing the polarity of the power supply terminals and by using electrolytic solutions appropriate for a particular anodic dissolution process. Apparatus 702 comprises cylindrical treatment container 704. Apparatus 702 further comprises a cylindrical electrode container 706 located inside bath container 704. Semiconductive counter electrode 708 in accordance with the invention is located within electrode container 706. Semiconductive counter electrode 708 is mounted on conductive electric current buss 710 and covers electric current buss 710 to prevent direct physical contact between electric current buss 710 and fluids present in container 706. Apparatus 702 comprises working electrolyte inlet tube 712 and working electrolyte inlet nozzle 713. Apparatus 702 further comprises porous transport barrier 714 located proximate to the top 715 of electrode container 706. Porous transport barrier 714 is operable to cover the opening of electrode container 706, thereby forming semiconductive counter electrode compartment 716. Semiconductive counter electrode compartment 716 is operable to contain counter-electrode electrolyte. During electrochemical treatment in accordance with the invention, working-electrode electrolyte is located in plating bath 718 in working electrode compartment 720. Working electrode compartment 720 essentially comprises the volume of bath container 704 that is separate from semiconductive counter-electrode compartment 716. Apparatus 702 further comprises a fluid inlet (not shown) and fluid outlet (not shown) of semiconductive counter-electrode compartment 716. Apparatus 702 further comprises substrate holder 722, which is operable to hold a substrate 724 having a substrate surface 725. Substrate holder 722 is operable to connect electrically a peripheral edge 726 of substrate surface 725 to power lead 728 of power source 730. Apparatus 702 is operable to connect electrically electric current buss 710 to power lead 732 of power source 730. When apparatus 702 is used for electroplating, semiconductive counter electrode 708 serves as an anode, and conductive surface 725 (the working electrode) of substrate wafer 724 functions as a cathode. Accordingly, the counter-electrode electrolyte in semiconductive counter electrode compartment 716 comprises an anolyte, and the working-electrode electrolyte in working electrode compartment 720 comprises a catholyte. Generally, substrate holder 722 is operable to rotate a substrate 724 during electrochemical processing. In accordance with the invention, a relatively highly resistive thin liquid layer is located between substrate surface 725 and semiconductive counter electrode 708. Generally, system components such as electrolyte inlet tube 712, working electrolyte inlet nozzle 713, and porous transport barrier 714 are disposed so that the width of the gap separating semiconductive counter electrode 708 from surface 725 of wafer 724 is less than 20 percent of the largest dimension of wafer 724. Preferably, the spacing is less than 10 percent of the wafer's largest dimension, and more preferably, less than 1 percent. Thus, in the case of a round wafer substrate 724 having a diameter of 300 mm, the spacing between semiconductive counter electrode 708 and the wafer surface generally is less than 60 mm, preferably less than 30 mm, and more preferably less than 3 mm.

Transport barrier 714 limits the chemical transport (via diffusion and/or convection) of most species, but allows migration of anion and cation species (and hence passage of current) during application of electric fields associated with electrochemical processing. In other words, transport barrier 714 limits the free cross-mixing of anolyte and catholyte. A general advantage of separate anolyte and catholyte compartments is the ability to use separately materials having vastly different physical and chemical properties in the two compartments. Examples of such properties include viscosity, metal ion concentration, water concentration, conductivity, and organic additive concentration. U.S. Pat. No. 6,821,407, issued Nov. 23, 2004, to Mayer et al., U.S. Pat. No. 6,890,416, issued May 10, 2005, to Mayer et al., and U.S. Pat. No. 6,964,792, issued Nov. 15, 2005, to Mayer et al., which are all incorporated by reference, teach methods and apparatuses for conducting electrochemical processes using a transport barrier to form separate anolyte and catholyte compartments. An exemplary transport barrier 714 comprises a porous membrane, such as a NAFION® cationic membrane available from Dupont.

Figure 22:
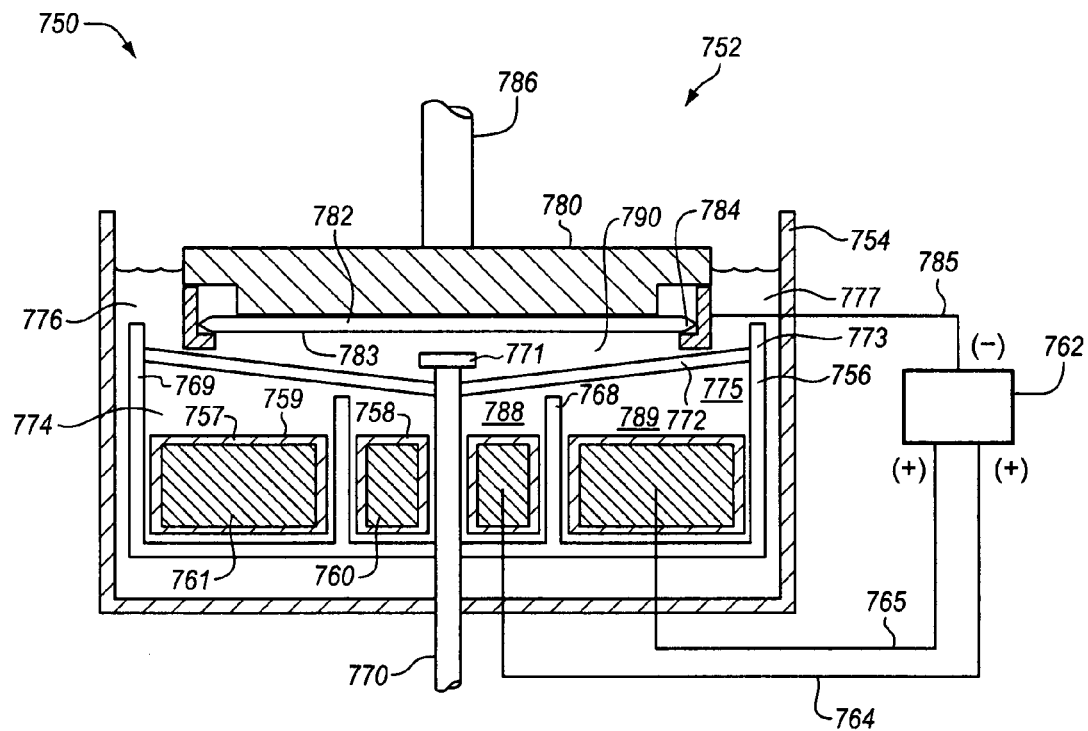
FIG. 22 depicts schematically a cross-sectional view of an apparatus for conducting electrochemical processing with a segmented semiconductive counter electrode in accordance with the invention using virtual electrodes and two separate electrode compartments separated by a transport barrier.

FIG. 22 depicts schematically a cross-sectional view 750 of an apparatus 752 for conducting electrochemical processing with a segmented semiconductive counter electrode in accordance with the invention using virtual electrodes and two separate electrode compartments separated by a transport barrier. Apparatus 752 is useful to perform electrochemical processing (e.g., electroplating or anodic dissolution) of a thin conductive layer (e.g., a metal seed layer) on the top surface of a substrate wafer. As depicted in FIG. 22, apparatus 752 is configured to perform electroplating on the substrate surface. Apparatus 752 is also operable to perform anodic dissolution of metal from a substrate by switching the polarity of the power supply. Configured to perform electroplating as depicted in FIG. 22, apparatus 752 comprises multiple segmented semiconductive counter electrodes and high-resistance virtual anodes (counter electrodes). Apparatus 752 comprises cylindrical treatment container 754. Apparatus 752 further comprises a cylindrical electrode container 756 located inside treatment container 754. Apparatus 752 further comprises segmented semiconductive counter electrode 757, which includes inner annular semiconductive counter electrode segment 758 and outer annular semiconductive counter electrode segment 759 in accordance with the invention.

Apparatus 752 further comprises inner annular electric current buss 760 and outer annular electric current buss 761, which are covered by semiconductive counter electrodes 758, 759, respectively, and are in direct electrical contact with semiconductive counter electrodes 758, 759, respectively. Electric current busses 760, 761 are connected to power supply 762 through power leads 764, 765, respectively. Power source 762 is operable to distribute plaiting current variably to each of electric current busses 760, 761. Apparatus 752 further comprises focusing cylinder 768. Focusing cylinder 768 is located between inner annular semiconductive counter electrode 758 and outer annular semiconductive counter electrode 759. The cylindrical wall 769 of electrode container 756 also functions as a focusing element, similar to outer focusing cylinder 642 of apparatus 602 in FIG. 18. Apparatus 752 further comprises working electrolyte inlet tube 770 and working electrolyte inlet nozzle 771. Apparatus 752 further comprises porous transport barrier 772 located proximate to the top 773 of electrode container 756 and the top of working electrolyte inlet tube 770 (near inlet nozzle 771). In some embodiments a flow diffuser plate or membrane (such as porous flow diffuser plate 467 in system 466 depicted in FIG. 8) is located between wafer 782 and porous transport barrier 772, creating a diffuser manifold region (not shown) between the plate and the barrier. Porous transport barrier 772 is operable to cover the opening of electrode container 756, thereby forming semiconductive counter electrode compartment 774. Semiconductive counter electrode compartment 774 is operable to contain counter-electrode electrolyte 775. During electrochemical treatment in accordance with the invention, working-electrode electrolyte 776 is located in working electrode compartment 777. Working electrode compartment 777 essentially comprises the volume of bath container 754 that is separate from semiconductive counter-electrode compartment 774. Apparatus 752 further comprises a fluid inlet (not shown) and fluid outlet (not shown) of semiconductive counter-electrode compartment 774. In some embodiments, separate flow loops and pumps (not shown) for electrolyte flow in semiconductor-counter-electrode compartment 774, in diffuser manifold region (not shown) and/or in working electrode compartment 777 are employed. The electrolytes in the various compartments often differ in their concentration of inorganic and organic bath components (additives), and transport barrier 772 limits the diffusion and convection of neutral compounds across barrier 772, while charged ions are driven across barrier 772 by migration. In the case were the diffusion barrier is an anionic or cationic membrane, then the restriction of flow of certain types of charge species are also restricted (negative anions can flow easily across an anionic membrane, and positively charge cations can flow easily though cationic membranes). Even within a class of charge carriers (anions or cations), the membrane can be used to select for selective transport of certain atoms or molecules, depending on their amount of charge, their size and their shape.

Apparatus 752 further comprises substrate holder 780 for holding a substrate wafer 782. Apparatus 752 is especially useful for electrochemically treating a substrate wafer 782 that has a thin conductive layer (e.g., a metal seed layer) at its surface 783. Substrate holder 780 is operable to connect the peripheral edge 784 of substrate surface 783 with a terminal (negative for electroplating) of power supply 762 via power lead 785. For the sake of clarity, power lead 785 from power supply 762 is shown connected to the peripheral edge of substrate holder 780. In actual physical embodiments, electrical connection of substrate holder 780 to power supply 762 typically is effected through shaft 786 of substrate holder 780.

During electrochemical treatment, substrate 782 in substrate holder 780 is immersed in working-electrode electrolyte 776 located in working electrode compartment 777, and semiconductive counter electrodes 758, 759 are immersed in counter-electrode electrolyte 775 in semiconductive counter electrode compartment 774. In some embodiments, the power circuit employs diodes (not shown) to enhance unidirectional current flow and minimize cross-communication in the semiconductive counter electrode compartment 774 between semiconductive counter electrode 758 and semiconductive counter electrode 759.

Focusing elements such as focusing cylinder 768 and cylinder wall 769 are useful to shape current density in counter-electrode electrolyte 775 in semiconductive counter electrode compartment 774 and avoid cross talk or plating from one semiconductor electrode to the next. During electrochemical processing, "virtual anodes" are formed at the top of region 788 defined by focusing cylinder 768 and at the top of region 789 between focusing cylinder 768 and cylinder wall 769.

Wafer holder 760 is operable to position substrate wafer 762 in close proximity to the virtual anodes associated with semiconductive counter electrodes 758 and 759. Generally, system components such as focusing cylinder 768, cylindrical wall 769 and working electrolyte inlet nozzle 771 are sized and disposed so that the width of the gap 790 separating segmented semiconductive counter electrode 757 from surface 783 of wafer 782 is less than 20 percent of the largest dimension of wafer 782. Preferably, the spacing is less than 10 percent of the wafer's largest dimension, and more preferably, less than 1 percent. Thus, in the case of a round wafer substrate 782 having a diameter of 300 mm, the spacing between segmented semiconductive counter electrode 757 and the wafer surface generally is less than 60 mm, preferably less than 30 mm, and more preferably less than 3 mm.

Figure 23:
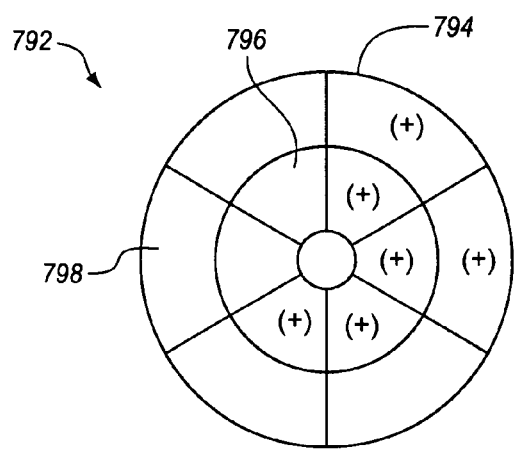
FIG. 23 depicts schematically a top-down view of a segmented semiconductive counter electrode in accordance with the invention having an inner annular semiconductive counter electrode segment and an outer annular semiconductive counter electrode segment.

FIG. 23 depicts schematically a top-down view 792 of a segmented semiconductive counter electrode 794 in accordance with the invention having inner annular semiconductive counter electrode segment 796 and outer annular semiconductive counter electrode segment 798. Each of semiconductive counter electrode segments 796, 798 comprises subsegments that are operable to be individually controlled by one or more variable power supplies so that current density associated with each subsegment is variable during electrochemical processing.

A commercial finite element analysis program (FlexPDE™, version 5, available from PDE Solutions Inc.) was utilized to test a two-dimensional numerical model (radial coordinates, symmetric in the azimuthal direction) of an electrochemical processing system having a semiconductive counter electrode in accordance with the invention. Calculations were performed to test the effect of various variables on relative current density distribution between the center and the peripheral edge of a 300 mm wafer substrate. Laplace's Equation was used to calculate the voltage distribution within a metal seed layer, an electrolyte layer and a semiconductive counter electrode (SCE) layer. Using the voltage gradient and the electrolyte conductance at the electrolyte/seed layer interface, relative current density in the seed layer was computed as a function of radius.

In order to allow a node grid of reasonable size density and consistency in the finite element model, the values of seed layer thickness used in the calculations were increased by six orders of magnitude (i.e., by a factor of $10^6$). For example, a seed film thickness of 50 Å (5 nm) was constructed in the model as being 5 mm thick. Accordingly, the values of seed layer conductivity were reduced by six orders of magnitude (i.e., multiplied by a factor of $10^{-6}$). The impact on computational results of the conversion factor used was shown to be insignificant as long as the value of seed layer thickness used in the calculations was small compared to wafer radius.

Voltage boundary conditions in the finite element model were set at 0 V (zero volts) at the wafer edge (radius=150 mm) and 8.5 V at the electric current buss. Initial base values of the variables were: metal seed layer thickness, 50 Å (computational value of 5 mm); metal seed layer conductivity, $5 \times 10^7$ Siemens/m (S/m) (computational value of 50 S/m); electrolyte liquid layer thickness, 5 mm; electrolyte conductivity, 50 S/m; semiconductor counter electrode (SCE) thickness, 5 mm; SCE conductivity, 0.5 S/m.

Figure 24:
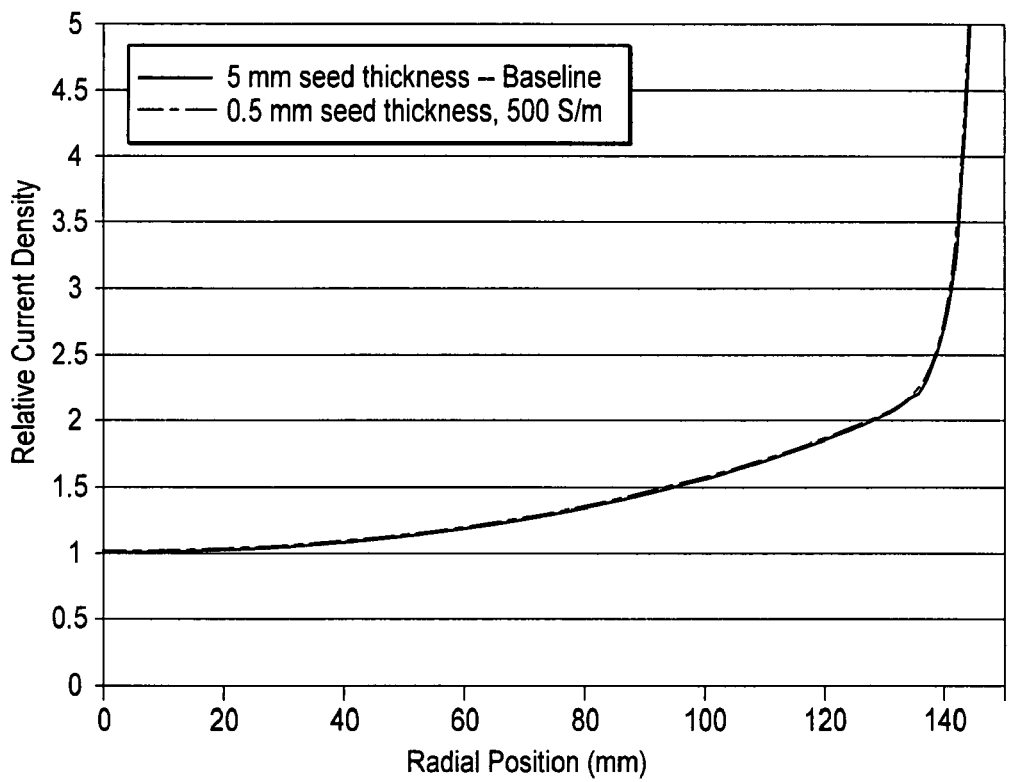
FIG. 24 contains a graph in which relative current density is plotted as a function of radial position from the center of 300 mm wafers, which graph shows results of calculations in which seed layer thickness was varied.

As mentioned above, a group of calculations was performed to test the effect of varying seed layer thickness, while varying seed layer conductivity inversely to maintain the same nominal resistance of the seed layer in the radial direction. FIG. 24 contains a graph in which relative current density is plotted as a function of radial position from the center of 300 mm wafers. The plotted results of model calculations show that calculated current distribution at the seed layer was identical for seed layers having a thickness of 0.5 mm and 5 mm (baseline), but having the same resistance in the radial direction.

Figure 25:
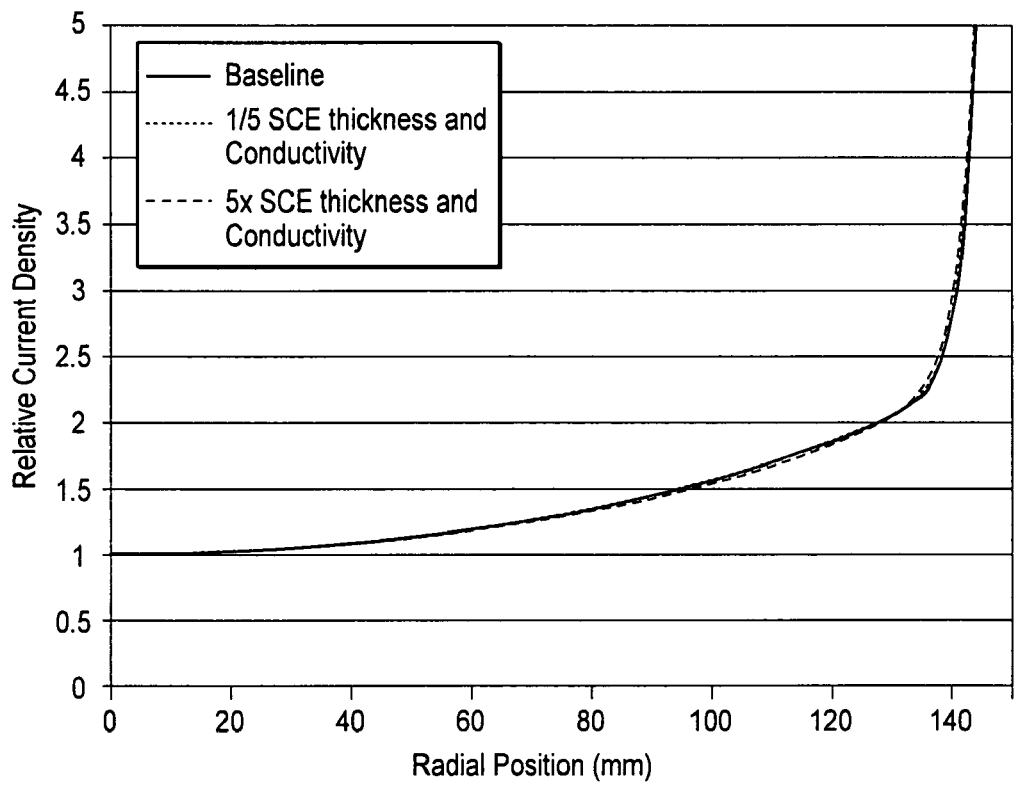
FIG. 25 contains a graph in which relative current density at the seed layer is plotted as a function of radial position from wafer center, which graph shows the results of calculations in which the thickness and conductivity of the SCE layer were varied, but SCE sheet resistance was the same.

In another group of calculations, model computations were performed using the baseline values described above, and then using different values of SCE thickness with changed SCE conductivity to maintain the same SCE sheet resistance. Thus, calculations were performed using a SCE thickness of one-fifth of the baseline value (i.e., 1 mm) with a SCE conductivity of one-fifth the baseline value (i.e., 0.1 S/m), and also using a SCE thickness of five times the baseline value (i.e., 25 mm) with a SCE conductivity of five times the baseline value (i.e., 2.5 S/m). FIG. 25 contains a graph in which relative current density at the seed layer is plotted as a function of radial position from wafer center. The plotted results of calculations show that calculated current density distributions in models in which the thickness and conductivity of the SCE layer were varied were virtually identical to the current density distribution under baseline conditions so long as SCE sheet resistance was the same in all models and the SCE thickness was significantly less than the radial dimension of the workpiece.

Figure 26:
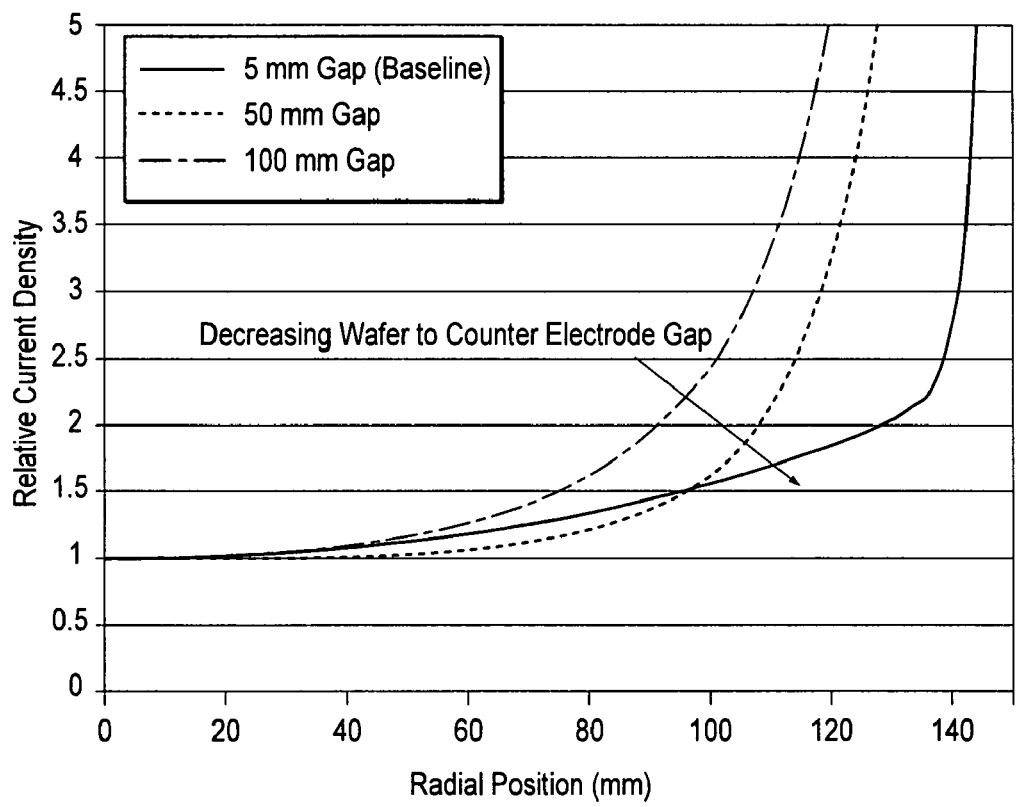
FIG. 26 contains a graph of relative current density at the seed layer versus radial position from wafer center, showing results when the gap value was varied.

In another group of calculations, model computations were performed using different values for the width of the thin fluid gap (i.e., of the thin electrolyte layer) between the seed layer on the wafer surface and the semiconductive counter electrode, while keeping other variable values constant. FIG. 26 contains a graph in which relative current density at the seed layer is plotted as a function of radial position from wafer center. The plotted results show that calculated current density uniformity increased (i.e., improved) as the gap value decreased from 100 mm to 50 mm and then to 5 mm (baseline). Thus, a significantly improved and more uniform current distribution is achieved by reducing the gap size and thereby inhibiting radial current flow through the electrolyte in the gap parallel to the wafer and radially outwards to the wafer edge.

Figure 27:
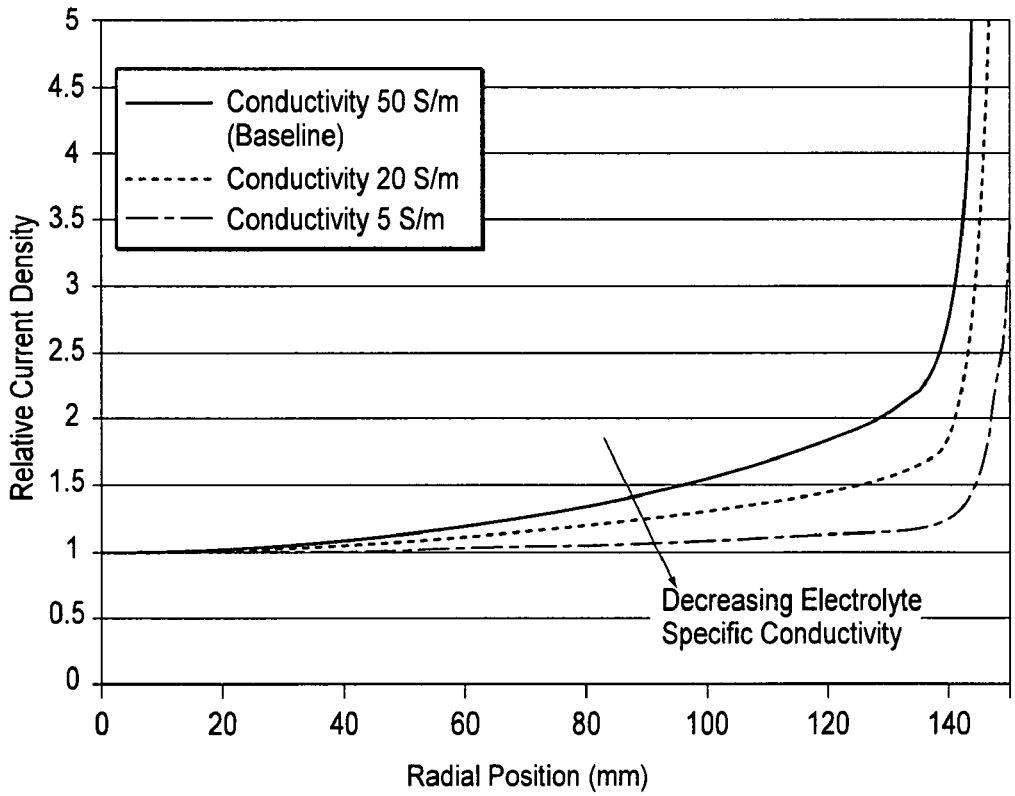
FIG. 27 contains a graph of relative current density as a function of radial position from wafer center when the electrolyte conductivity value was varied.

In another group of calculations, model computations were performed using different values for the conductivity of the electrolyte in the fluid gap, while keeping other variable values constant. FIG. 27 contains a graph in which relative current density at the seed layer is plotted as a function of radial position from wafer center. The plotted results show that calculated current density uniformity increased (i.e., improved) as the electrolyte conductivity value decreased from 50 S/m (baseline) to 20 S/m and then to 5 S/m. Thus, by decreasing the electrolyte conductivity, ionic current flow in the electrolyte parallel to the wafers is reduced and a more uniform current distribution is achieved.

Figure 28:
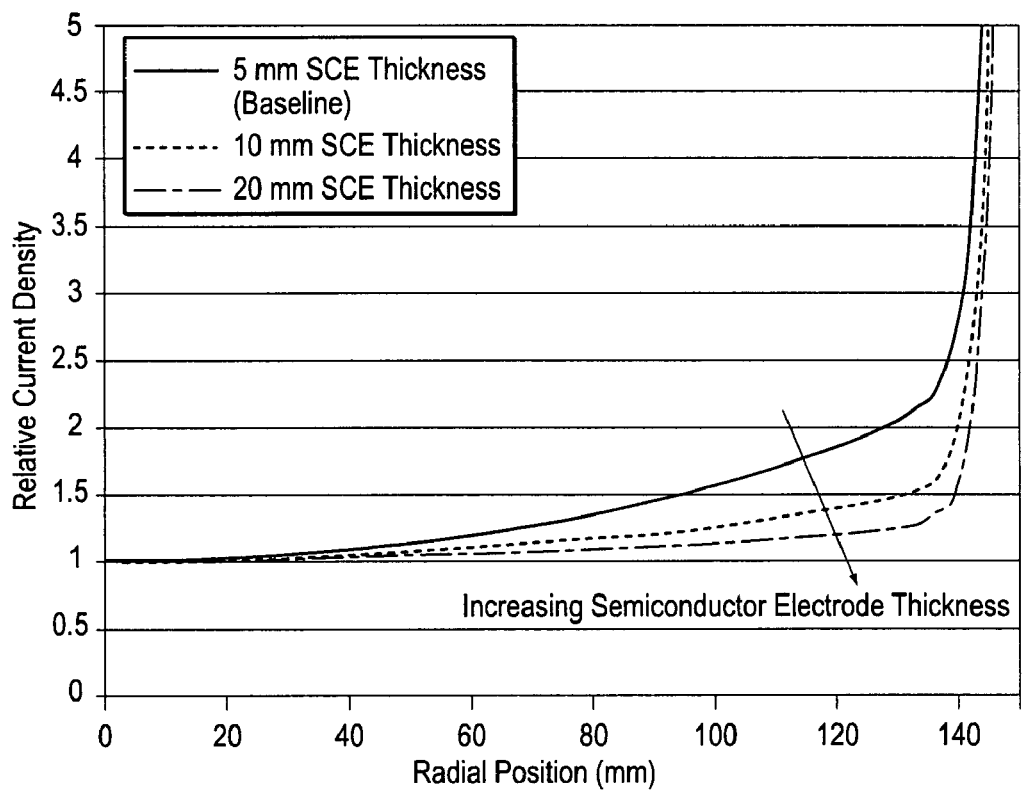
FIG. 28 contains a graph of relative current density as a function of radial position from wafer center when SCE thickness was varied.

In another group of calculations, model computations were performed using different values of SCE thickness, while keeping other variable values constant. FIG. 28 contains a graph in which relative current density at the seed layer is plotted as a function of radial position from wafer center. The plotted results show that calculated current density uniformity increased (i.e., improved) as SCE thickness increased from 5 mm (baseline) to 10 mm and then to 20 mm. Thus, by increasing the SCE thickness, the resistance of the system as a whole increases and the relative fraction of the total resistance residing across the SCE increases, producing a more uniform current distribution.

Figure 29:
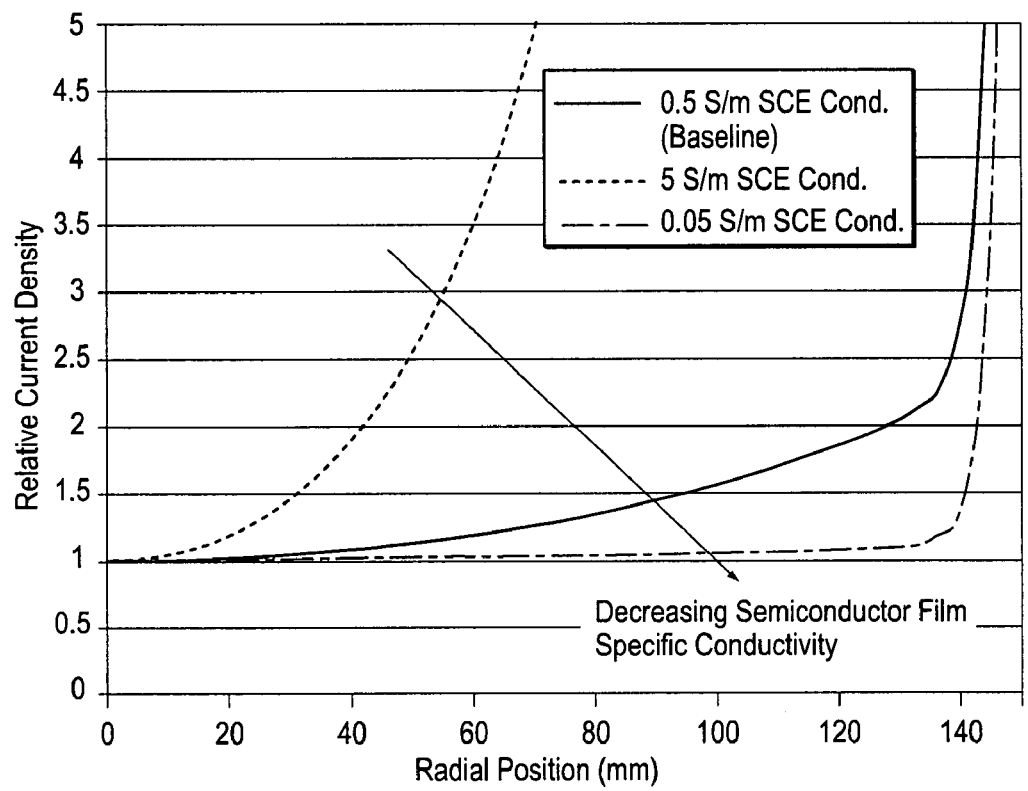
FIG. 29 contains a graph of current density as a function of radial position from wafer center when SCE conductivity was varied.

In another group of calculations, model computations were performed using different values of SCE conductivity, while keeping other variable values constant. FIG. 29 contains a graph in which relative current density at the seed layer is plotted as a function of radial position from wafer center. The plotted results show that calculated current density uniformity increased (i.e., improved) as SCE conductivity decreased from 5 S/m to 0.5 S/m (baseline) and then to 0.05 S/m.

Figure 30:
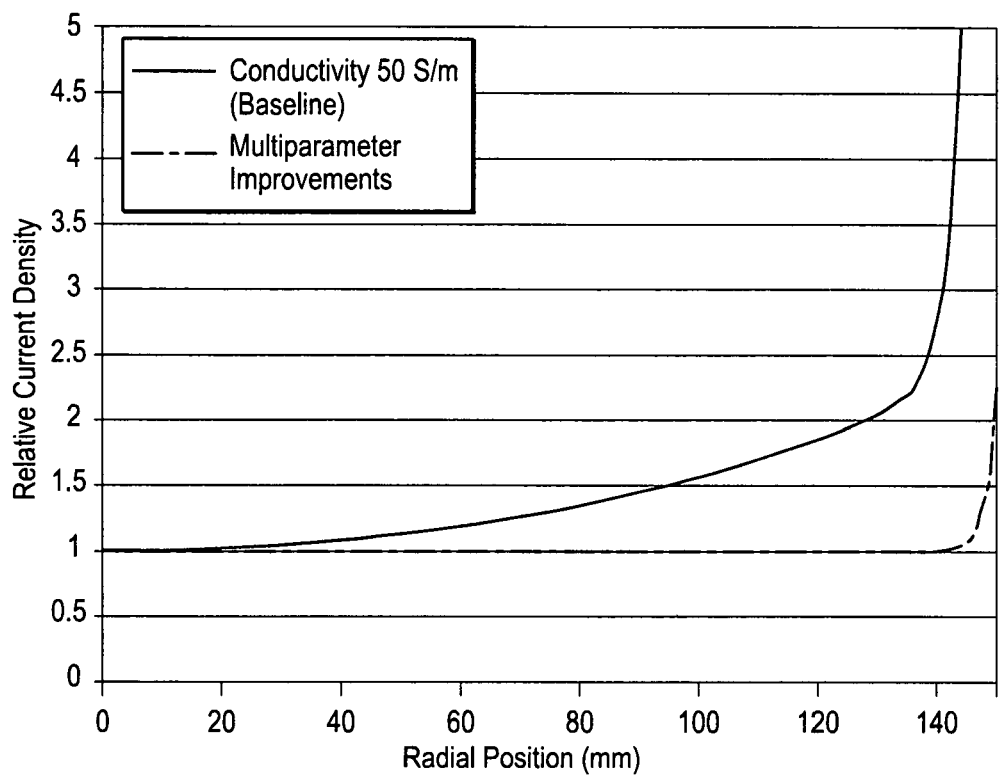
FIG. 30 contains a graph of relative current density as a function of radial position from wafer center for two sets of electrochemical treatment conditions.

In another calculation, model computations were performed using several variable values different from baseline values. The different values were: electrolyte liquid layer (thin fluid gap) thickness, 2.5 mm; electrolyte conductivity, 5 S/m; semiconductor counter electrode (SCE) thickness, 20 mm; SCE conductivity, 0.05 S/m. The results of calculations using the model with multiparameter changes in variable values are plotted in FIG. 30. FIG. 30 contains a graph in which relative current density at the seed layer is plotted as a function of radial position from wafer center. The plotted results show that calculated current density uniformity increased (i.e., improved) compared to current density in the baseline model as a result of the multiparameter improvements in variable values.

Figure 31:
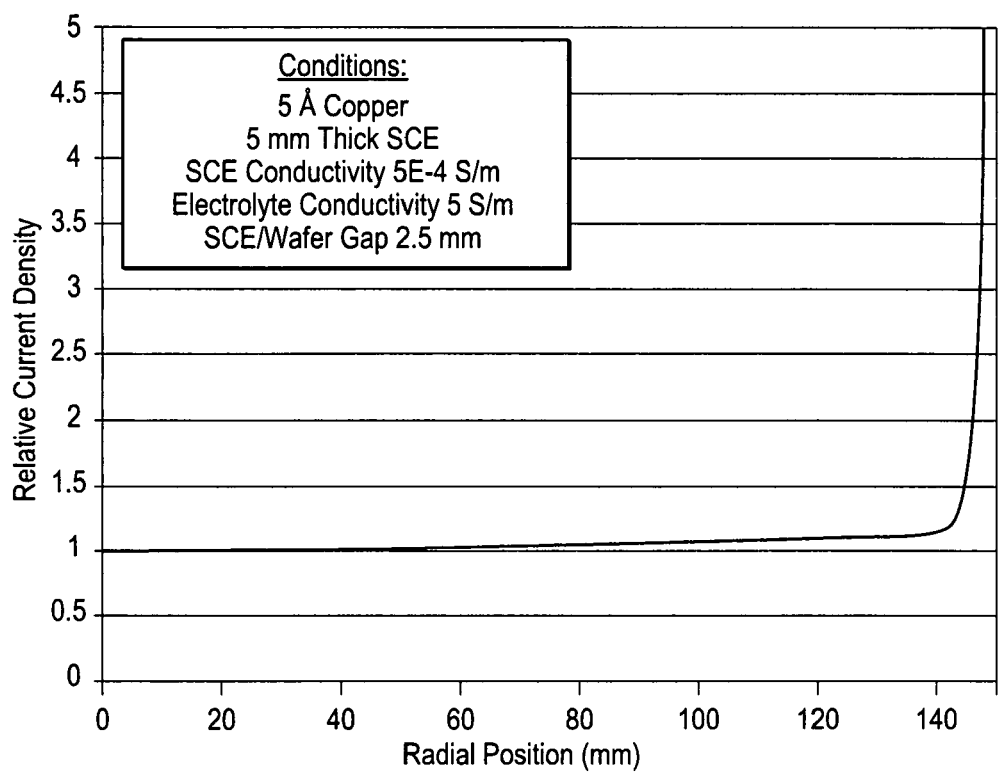
FIG. 31 contains a graph of relative current density as a function of radial position from wafer center for a selected set of electrochemical treatment conditions.

In another calculation, model computations were performed using several variable values different from baseline values. The different values were: seed layer thickness, 5 mm (corresponding to 5 Å); electrolyte liquid layer (fluid gap) thickness, 2.5 mm; electrolyte conductivity, 5 S/m; SCE thickness, 5 mm; SCE conductivity, 0.0005 S/m. The results of calculations using the model with multiparameter changes in variable values are plotted in FIG. 31. FIG. 31 contains a graph in which relative current density at the seed layer is plotted as a function of radial position from wafer center. The plotted results show that calculated current density uniformity was very good for metal deposition on an ultra-thin metal seed layer based on the model containing the listed parameter values.

Figure 32:
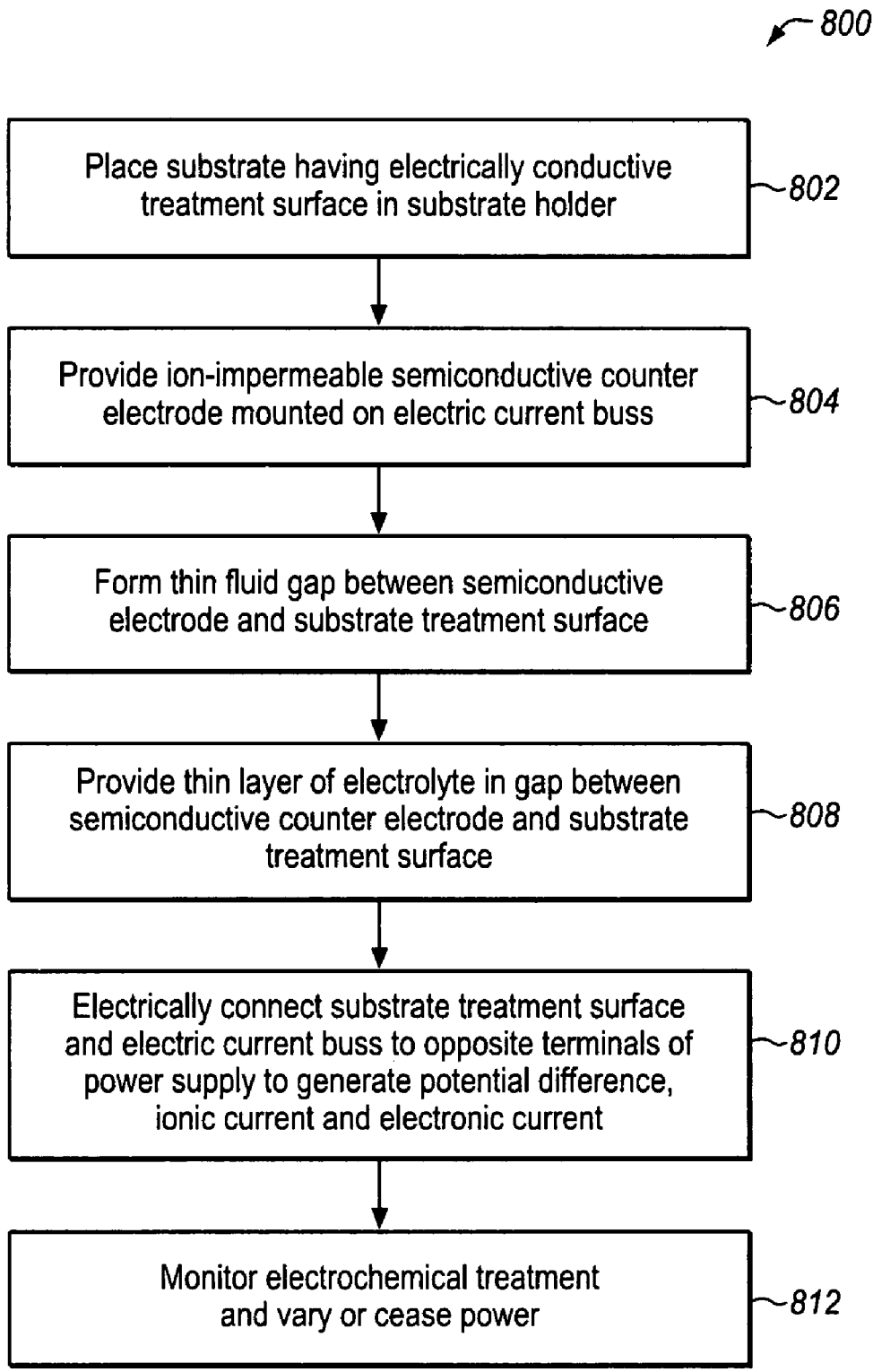
FIG. 32 depicts a generalized process flow sheet of a method in accordance with the invention for electrochemically treating a highly-resistive conductive substrate treatment surface.

FIG. 32 depicts a generalized process flow sheet of a method 800 in accordance with the invention for electrochemically treating a highly-resistive conductive substrate surface in accordance with the invention. Step 802 includes placing the substrate having an electrically conductive treatment surface in a substrate holder. Step 804 includes providing a semiconductive counter electrode assembly comprising an ion-impermeable semiconductive counter electrode mounted on a conductive electric current buss. Step 806 includes forming a thin fluid gap between the semiconductive counter electrode and the substrate treatment surface (working electrode). Generally, the gap formed has a gap width less than 20 percent of the largest dimension of the substrate treatment surface. In some embodiments, the fluid gap formed has a gap width less than 10 percent of the largest dimension of the substrate treatment surface. In some preferred embodiments, the fluid gap formed has a gap width not exceeding about three percent of the largest dimension of the substrate treatment surface, and in some embodiments, not exceeding about one percent of the largest dimension of the substrate treatment surface. Step 808 includes providing a thin layer of electrolyte in the fluid gap between the semiconductive counter electrode and the substrate treatment surface. Step 810 includes electrically connecting the substrate treatment surface and the electric current buss to opposite terminals of the power supply to generate a potential difference between the substrate treatment surface and the semiconductive counter electrode. This also serves to generate ionic current between the substrate treatment surface and the semiconductive counter electrode and to generate electronic current between the substrate treatment surface and the electric current buss. Step 812 includes monitoring the electrochemical treatment and varying or ceasing power to control the electrochemical treatment. Techniques suitable for monitoring the electrochemical treatment include: optical measurements of conductive layer (e.g., a seed layer or a thin electrochemically-polished layer) thickness; and electrical resistance measurements of the conductive layer on the substrate surface.

Example 1

A prophetic example of embodiments in accordance with the invention includes electroplating of copper metal onto the surface of a substrate wafer having a copper metal seed layer.

A plating bath container, such as treatment container 504 as depicted in FIG. 15, is filled with an electroplating solution comprising: 40 grams per liter (g/l) of dissolved copper metal, added as copper sulfate pentahydrate ($CuSO_4.5H_2O$); 10 g/l $H_2SO_4$; 50 milligrams per liter (mg/l) chloride ion, added as HCl; 6 milliliters per liter (ml/l) VIAFORM® accelerator; 2.5 ml/l VIAFORM® leveler; 2 ml/l (i.e., about 200 ppm) VIAFORM® suppressor. A semiconductive counter electrode assembly in accordance with the invention is located at the bottom of the plating bath container. The semiconductive counter electrode assembly comprises a cylindrical electric current buss and a semiconductive counter electrode (SCE). The SCE is mounted on and covers the cylindrical electric current buss. The SCE serves as a semiconductive anode. The SCE consists essentially of amorphous (non-graphitic) carbon having a thickness of approximately 2 mm and a diameter of about 300 mm. The SCE material has electrical conductivity of approximately 5 S/m, and it is substantially impervious to the electroplating solution and to ionic flow. The conductive electric current buss comprises essentially copper and has a diameter of 300 mm and a thickness of approximately 1 cm. The electric current buss is connected electrically to the positive terminal of a power supply. A semiconductor substrate wafer having a diameter of 300 mm held in a clamshell substrate holder is immersed in the plating solution so that the center axis of the substrate wafer is substantially coaxial with the center axis of the SCE and electric current buss. The surface of the substrate wafer contains a copper seed layer having an initial thickness of approximately 20 Å. The substrate holder is positioned so that the substrate surface having the metal seed layer is separated from the working surface of the SCE by a gap having a width of about 8 mm, which gap is filled by a thin liquid layer of electroplating solution. The peripheral edge of the copper seed layer on the substrate surface is connected electrically to a negative terminal of the power supply through the substrate holder. The power supply is used to generate a potential difference of approximately 8.5 V between the conductive copper seed layer and the conductive electric current buss. Copper electroplates onto the surface of the substrate for approximately 1 minute to form a copper layer having a thickness of about 2000 Å.

An exemplary fabrication of a semiconductive counter electrode assembly begins by forming an electric current buss from a piece of copper or other highly electronically conductive metal. The piece of copper is formed (e.g., by milling or casting) into a shape having approximately the desired final dimensions of the semiconductive counter electrode assembly. In the case of a semiconductive counter electrode suited for processing semiconductor wafers (i.e., having a flat surface), the electric current buss typically is cylindrical in shape, having approximately the diameter of the wafer, and thick enough to be highly conductive and mechanically sound and rigid, but not so thick to make handling cumbersome. For example, an electric current buss formed from a piece of copper one-half (½) inch thick and 300 mm in diameter is suitable for use in an apparatus for processing a 300 mm wafer. In other applications in which the substrate treatment surface is not flat and/or round or even symmetrical, other buss shapes are more appropriate, such as shapes that approximately follow the contours of the substrate treatment surface. In such applications, the buss surface (that is designed to face the substrate treatment surface) is milled or cast to approximate the workpiece's surface contour.

In some embodiments, the properties of a refractory metal and a semiconductive resistive film formed thereon are utilized to make a semiconductive counter electrode on a conductive electric current buss. In some embodiments, a refractory metal base is deposited as a layer onto an electric current buss. For example, a thin layer of tantalum (Ta) is deposited on a copper buss by a technique known in the art, or a macroscopic piece of Ta is shaped to match and to fit the dimensions of a copper electric current buss. Alternatively, in some embodiments, the bulk metal of the current buss itself functions as the base metal. Then, the top surface of the refractory metal base is thermally oxidized using techniques known in the art. Alternatively, an insoluble metal sulfide or fluoride, which also has highly electronically resistive properties, is formed on the base metal and serves to increase substantially the overall system resistance. A semiconductive resistive film formed on a base metal layer typically has a thickness in a range of about from 10 Å to 1000 Å (1 nm to 100 nm). Nevertheless, a relatively thin semiconductive resistive film having a thickness of 10 Å to 200 Å (1 nm to 20 nm) is usually sufficient, but it must completely cover the surface of the base metal so that there are few if any points on the surface where the semiconductive film layer is missing. An example of such a structure is an electropolished smooth copper electric current buss coated with a sputtered Ta metallic film having a thickness of about 300 Å (30 nm). The Ta film is oxidized by exposing to air or by heating in oxygen, and then anodized in water to form a native $Ta_2O_5$ outer surface. In such embodiments, the $Ta/Ta_2O_5$ film functions both as a barrier (sealing the copper electric current buss against electrolytic attack and oxidation) and as a highly electrically resistive semiconductive film (the native oxide). Titanium (Ti) and tungsten (W) are other examples of suitable base layer metals.

In some embodiments in accordance with the invention, a thin interfacial film is attached or applied as a coating to the surface of the electric current buss. In the finished semiconductive counter electrode assembly, the interfacial film lies between the electric current buss and the semiconductive counter electrode. Important aspects of this combination are that the electrical contact (interfacial) resistance between the two principal elements (i.e., electric current buss and semiconductive counter electrode) be relatively small in comparison to the resistance of the semiconductive counter electrode, and that the semiconductive counter electrode material be mechanically well-attached to the buss. In some embodiments, a thin transition or adhesion layer (e.g., thickness of 100 Å to 1000 Å) is utilized, depending on the compatibility of the buss material and the semiconductive electrode material. Adhesion layer materials are often refractory transition metals, such as W, Ti, Ta, V, and Cr, and their alloys. Ni and/Co are also suitable. An interfacial film is deposited onto a metal (e.g., copper) electric current buss using a technique known in the art; for example, by vapor or PVD deposition, electrodeposition, or electroless deposition (e.g. Ni, Co).

In some embodiments, an amorphous carbon layer is sputtered (e.g., by magnetron sputtering) either directly onto the copper surface or onto a thin adhesion film described above. Using an argon plasma and a graphite or nearly graphitic target, a disordered atomic carbon layer is deposited using techniques known in the art. The resistivity of the deposited carbon layer is controlled by tailoring the power (e.g., 5 W to 500 W for a 20 $cm^2$ target), pressure, atmospheric impurities, and target impurities (e.g., B, P). Different operating parameters result in a range of different allotropic carbon structures. A non-porous carbon film, typically having a thickness in a range of from 100 Å to 5000 Å is thereby deposited. Deposition operating parameters are selected primarily to balance between the desired value of sheet resistance and the power needed to sputter a target at a desired plating rate.

In some embodiments, an electrically semiconductive mixture comprising a polymer or a polymer composite as known in the art is attached to the buss surface. A thermoplastic or a polymer is dissolved in a suitable and compatible solvent. Then, an appropriate amount of conductive powder particles (e.g., graphite, silver, copper) is added to the polymer-solvent solution. The specific amount and type of conductive additive is selected based on electrochemical stability and other properties (such as size and shape) as known in the art of making conductive polymeric composites. For example, 20 gm of powdered polyvylidene difluoride (PVDF) is dissolved is 200 cc of dimethlyformamide (DMF) and heated to around 100° C. while the mixture is stirred. Once the solution is clear and all the polymer has dissolved, an amount of graphite powder a range of about from 0.05 to 1 gm, having an average particle size of 10 μm, is added to the solution and allowed to mix thoroughly. Next, the electric current buss is placed on an apparatus that spins (rotates) the buss part and the polymer/conductive powder slurry mixture is poured onto the center of the workpiece. The rate of rotation is typically in a range of about from 100 rotations per minute (rpm) to 500 rpm, with higher rotation rates and lower slurry viscosities yielding thinner semiconductive film thicknesses. A substantial fraction of excess fluid does not actually end up on the part as excess material is spun off the part. After spin application of the liquid film, the part cools and the solvent evaporates into air. Once the solvent has dried completely, a solid semiconductive film remains. The buss/semiconductive electrode assembly is then optionally placed into a vacuum oven where the temperature is slowly increased up to and slightly above the polymer's melting point (about 165° C. for PVDF). As the polymer melts, the polymer material becomes a uniformly continuous sheet and encapsulates the conductive powder particles. Later, during electrochemical treatment in accordance with the invention, the semiconductive electrode film separates and seals the metal electric current buss against the electrolyte. A film having a thickness in a range of about from 0.1 mm to 1 mm is typical. While not being bound by any theory, and as generally known in the art, it is believed that the individual conductive particles have such a low concentration that only small point contacts between them occur and make the composite film quite resistive to electrical current.

In some embodiments, a semiconductive film begins as a separately handled macroscopic sheet of semiconductive material; for example, a relatively flexible film having a thickness in a range of about from 1 mm to 10 mm. A piece of the film is mounted on and attached to the surface of the electric current buss using a conductive adhesive, such as a conductive copper tape or conductive glue. Examples of suitable films include polymer/powder and rubber/powder composites.

Finally, in some embodiments, any exposed side surfaces or edges of the conductive electric current buss that might otherwise inadvertently become exposed to electrolyte are encapsulated by a polymer. One suitable technique utilizes the same general spin-coating technique described above using PVDF powder and DMF solvent, only without conductive powder additive. In some embodiments, an o-ring-sealed mechanical housing isolates and shields the sides and back of an electric current buss against electrolyte exposure.

The particular systems, designs, methods and compositions described herein are intended to illustrate the functionality and versatility of the invention, but they should not be construed in any way to limit the invention to those particular embodiments. Systems and methods in accordance with the invention are useful in a wide variety of circumstances and applications to treat electrochemically the surface of a workpiece. While the invention is described herein mainly with reference to electroplating on a wafer as used in the integrated circuit industry, the described embodiments are not exclusive to integrated circuits, and embodiments in accordance with the invention are generally useful for electrochemically treating a workpiece having a relatively resistive surface layer. Furthermore, even when the electrical resistivity of the workpiece surface is not high, a semiconductive counter electrode in accordance with the invention is useful to electroplate the surface at a more uniform rate over the substrates topography than would be otherwise possible. Also, while embodiments have been described mainly with reference to flat substrate surfaces and to flat working surfaces of semiconductor counter electrodes, some embodiments have a working surface of a semiconductor counter electrode that is shaped to substantially mirror the shape and follow the contour of a non-flat (e.g., curved or wavy) substrate treatment surface, thus avoiding diminished plating (or anodic dissolution) in recessed (concave unexposed) regions. It is evident that those skilled in the art may now make numerous uses and modifications of the specific embodiments described herein, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the systems, methods, devices and compositions described in the claims below and by their equivalents.

What is claimed is:

1. An apparatus for performing electroplating on a wafer substrate surface having a layer of conductive material, the apparatus comprising:

a substrate holder said substrate holder being operable to hold the wafer substrate;

an electrical substrate connector said electrical substrate connector being operable to make an electrical contact with the layer of conductive material at the periphery of the wafer substrate and to electrically connect the periphery of the wafer substrate to a terminal lead of a power supply, wherein the apparatus is configured for negatively electrically biasing the wafer substrate surface during use;

an electric current buss, said electric current buss being part of a counter electrode assembly, and said electric current buss having a working surface and being operable to connect electrically to a terminal lead of a power supply;

a partially resistive counter electrode, said partially resistive counter electrode being part of said counter electrode assembly, and said partially resistive counter electrode disposed on and covering said working surface of said electric current buss, wherein the resistance of the partially resistive counter electrode is such that during the apparatus use, the voltage drop across the partially resistive counter electrode is greater than the voltage drop from the electrical contact at the wafer substrate periphery to the center of the wafer substrate, and wherein the partially resistive counter electrode is non-porous to liquids and electrolytes; and wherein said counter electrode assembly and said substrate holder are operable to form a thin fluid gap between said partially resistive counter electrode and a wafer substrate surface during use, wherein the width of the gap is in a range of about from 1 mm to 30 mm.

2. An apparatus as in claim 1, wherein:
said substrate holder includes said electrical substrate connector.

3. An apparatus as in claim 1, wherein:
said working surface of said electric current buss, a working surface of said partially resistive counter electrode, and said substrate holder are substantially coextensive.

4. An apparatus as in claim 1, wherein:
said partially resistive counter electrode assembly and said substrate holder are operable to form the thin fluid gap having a gap width less than 20 percent of the largest dimension of said wafer substrate surface.

5. An apparatus as in claim 1, wherein:
said partially resistive counter electrode assembly and said substrate holder are operable to form the thin fluid gap having a gap width less than 10 percent of the largest dimension of said wafer substrate surface.

6. An apparatus as in claim 1, wherein:
said partially resistive counter electrode assembly and said substrate holder are operable to form the thin fluid gap having a gap width are not exceeding about one percent of the largest dimension of said wafer substrate surface.

7. An apparatus as in claim 1, wherein:
said partially resistive counter electrode is impermeable to electrolyte.

8. An apparatus as in claim 1, wherein:
said partially resistive counter electrode is substantially nonconductive of ionic current.

9. An apparatus as in claim 1, wherein:
said partially resistive counter electrode substantially completely covers said electric current buss.

10. An apparatus as in claim 1, wherein:
said partially resistive counter electrode comprises a partially resistive material located on said electric current buss, and said partially resistive material has a thickness in range of about from 0.1 mm to 10 mm.

11. An apparatus as in claim 1, wherein:
said partially resistive counter electrode consists essentially of a layer of partially resistive material located on said electric current buss, and said layer has a thickness in range of about from 1 nm to 100 nm.

12. An apparatus as in claim 1, wherein:
said partially resistive counter electrode comprises a material located on said electric current buss, and said material has an electrical conductivity in a range of about from 0.01 S/m to 100 S/m.

13. An apparatus as in claim 1, wherein:
said partially resistive counter electrode comprises a material located on said electric current buss, and said material has an electrical sheet resistance in a range of about from 10 ohm per square to $10^4$ ohm per square.

14. An apparatus as in claim 1, further comprising:
a reference electrode, said reference electrode being located in said thin fluid gap and being operable for connection to a power supply; and
a substrate sense contact finger, said substrate sense contact finger being operable for connection to a substrate sense contact lead from a power supply.

15. An apparatus as in claim 1, wherein:
said electric current buss comprises a segmented electric current buss.

16. An apparatus as in claim 1, wherein:
said partially resistive counter electrode is not segmented.

17. An apparatus as in claim 1 wherein:
said electric current buss comprises an azimuthally asymmetric electric current buss.

18. An apparatus as in claim 1, further comprising:
a focusing cylinder.

19. An apparatus as in claim 1, further comprising:
a current shield.

20. An apparatus as in claim 1, further comprising:
an electrolyte source tank; and
a pair of electrodes in said electrolyte source tank.

21. An apparatus as in claim 1, further comprising:
a porous flow diffuser plate located between said partially resistive counter electrode and said substrate holder.

22. An apparatus as in claim 1, further comprising:
a porous transport barrier located between said partially resistive counter electrode and said substrate holder.

23. An apparatus as in claim 22 wherein:
said porous transport barrier is operable to create a partially resistive counter electrode compartment and a working electrode compartment and to maintain different concentrations of organic plating additives in said compartments.

24. The apparatus of claim 1, wherein the partially resistive counter electrode comprises a discontinuous layer of electrocatalyst, wherein the electrocatalyst is configured for facilitating electrochemical reactions on the surface of the partially resistive counter electrode.

* * * * *